(12) United States Patent
Kinoshita et al.

(10) Patent No.: US 9,876,189 B2
(45) Date of Patent: Jan. 23, 2018

(54) TRANSPARENT ELECTRODE, ELECTRONIC DEVICE, AND TRANSPARENT ELECTRODE MANUFACTURING METHOD

(71) Applicant: Konica Minolta, Inc., Tokyo (JP)

(72) Inventors: Toshiyuki Kinoshita, Hino (JP);
Takeshi Hakii, Sagamihara (JP);
Hiroshi Ishidai, Hachioji (JP);
Kazuhiro Yoshida, Hachioji (JP);
Minako Ono, Hachioji (JP); Takatoshi Tsujimura, Fujisawa (JP)

(73) Assignee: KONICA MINOLTA, INC., Tokyo (JP)

( * ) Notice: Subject to any disclaimer, the term of this patent is extended or adjusted under 35 U.S.C. 154(b) by 75 days.

(21) Appl. No.: 14/384,878

(22) PCT Filed: Apr. 15, 2013

(86) PCT No.: PCT/JP2013/061174
§ 371 (c)(1),
(2) Date: Sep. 12, 2014

(87) PCT Pub. No.: WO2013/161603
PCT Pub. Date: Oct. 31, 2013

(65) Prior Publication Data
US 2015/0028320 A1     Jan. 29, 2015

(30) Foreign Application Priority Data

Apr. 24, 2012  (JP) .................................. 2012-098534
Apr. 27, 2012  (JP) .................................. 2012-102286

(51) Int. Cl.
*H01L 21/44*   (2006.01)
*H01L 51/52*   (2006.01)
(Continued)

(52) U.S. Cl.
CPC ........... *H01L 51/5215* (2013.01); *H01B 1/02* (2013.01); *H01L 51/0021* (2013.01);
(Continued)

(58) Field of Classification Search
CPC .................................................. H01L 51/5215
(Continued)

(56) References Cited

U.S. PATENT DOCUMENTS 5,000,528 A    3/1991   Kawakatsu
5,968,637 A   10/1999   Baret
(Continued)

FOREIGN PATENT DOCUMENTS

CN         101548582 A    9/2009
EP           0314413 A2   5/1989
(Continued)

OTHER PUBLICATIONS

European Search Report; Application No. 13781194.9-1552 / 2950152; dated Jan. 12, 2015; Applicant: Konica Minolta, Inc.; total of 9 pages.
(Continued)

*Primary Examiner* — Ajay K Arora
(74) *Attorney, Agent, or Firm* — Lucas & Mercanti, LLP

(57) ABSTRACT

Provided is a transparent electrode having both sufficient conductivity and light transmittance, and also provided is an electronic device which improves performance by using said transparent electrode. Further provided is method of manufacturing said transparent electrode. This transparent electrode is provided with a nitrogen-containing layer and an electrode layer. The nitrogen-containing layer is formed at a deposition speed of 0.3 nm/s or greater, and is configured using a compound containing nitrogen atoms. Further, the electrode layer is provided adjacent to the nitrogen-containing layer, has a 12 nm or lower film thickness and a
(Continued)

measurable sheet resistance, and is configured using silver or an alloy having silver as the main component.

2 Claims, 9 Drawing Sheets

(51) Int. Cl.
*H01L 51/00* (2006.01)
*H01L 51/50* (2006.01)
*H01L 51/56* (2006.01)
*H01B 1/02* (2006.01)

(52) U.S. Cl.
CPC ...... *H01L 51/0067* (2013.01); *H01L 51/0072* (2013.01); *H01L 51/0074* (2013.01); *H01L 51/5012* (2013.01); *H01L 51/5234* (2013.01); *H01L 51/56* (2013.01); *H01L 51/524* (2013.01); *Y10T 428/265* (2015.01)

(58) Field of Classification Search
USPC .................................................. 438/82, 686
See application file for complete search history.

(56) References Cited

U.S. PATENT DOCUMENTS

| | | | | |
|---|---|---|---|---|
| 6,951,689 | B1 * | 10/2005 | Higashikawa | H01L 31/022466 136/255 |
| 2009/0294763 | A1 * | 12/2009 | Matsunami | C09K 11/06 257/40 |
| 2010/0032186 | A1 | 2/2010 | Gotou | |
| 2010/0225227 | A1 * | 9/2010 | Tchakarov | C03C 17/36 313/504 |
| 2011/0057920 | A1 | 3/2011 | Matsuura | |
| 2014/0124029 | A1 | 5/2014 | Clabau | |
| 2015/0090978 | A1 | 4/2015 | Yoshida et al. | |

FOREIGN PATENT DOCUMENTS

| | | |
|---|---|---|
| EP | 0806401 A1 | 11/1997 |
| EP | 2844039 A1 | 3/2015 |
| JP | H06139844 A | 5/1994 |
| JP | 2002-015623 A | 1/2002 |
| JP | 2006-164961 A | 6/2006 |
| JP | 2007-123174 A | 5/2007 |
| JP | 2008-216490 A | 9/2008 |
| JP | 2009-151963 A | 7/2009 |
| JP | 2011054419 A * | 3/2011 |
| JP | 2011-077028 A | 4/2011 |
| WO | 2008/059185 A2 | 5/2008 |
| WO | 2013001222 A1 | 1/2013 |
| WO | WO2013/073356 A1 | 5/2013 |

OTHER PUBLICATIONS

Office Action dated Feb. 22, 2016; Application No. 201380021169.9; Applicant: Konica Minolta, Inc.; Title of the Invention: Transparent electrode, electronic device, and transparent electrode manufacturing method; English translation of Office Action: Total of 21 pages.

* cited by examiner

TRANSPARENT ELECTRODE, ELECTRONIC DEVICE, AND TRANSPARENT ELECTRODE MANUFACTURING METHOD

CROSS REFERENCE TO RELATED APPLICATION

This Application is a 371 of PCT/JP2013/061174 filed on Apr. 15, 2013 which, in turn, claimed the priority of Japanese Patent Application Nos. JP2012-098534 filed on Apr. 24, 2012 and JP2012-102286 filed on Apr. 27, 2012, all applications are incorporated herein by reference.

TECHNICAL FIELD

The present invention relates to a transparent electrode, an electronic device, and a method for manufacturing the transparent electrode, particularly relates to a transparent electrode having both electrical conductivity and light transmission property, an electronic device using the transparent electrode, and further a method for manufacturing the transparent electrode.

BACKGROUND ART

An organic electroluminescent element (hereinafter, referred to as "organic EL element") utilizing electroluminescence (hereinafter, referred to as "EL") of an organic material is a thin-film type completely-solid state element capable of emitting light at a low voltage of several volts to several ten volts, and has many excellent features such as high luminance, high light emission efficiency, small thickness and light weight. Accordingly, in recent years, the element has attracted attention, as backlights for various kinds of displays, display boards such as a signboard and an emergency lamp, and surface emitting bodies such as illumination light sources.

Such an organic electroluminescent element has a configuration obtained by holding a light emitting layer formed of an organic material between two electrodes, the emitted light generated in the light emitting layer is extracted to the outside through the electrode. Therefore, at least one of the two electrodes is constituted as a transparent electrode.

As the transparent electrode, there is used generally a material of an oxide semiconductor type such as indium tin oxide (SnO2-In2O3: Indium Tin Oxide: ITO), and examination aiming at lowering electric resistance by laminating ITO and silver has been carried out (e.g. referring to the following Patent Literatures 1, 2). However, ITO has a high raw cost because of using a rare metal indium, and is required to be subjected to annealing treatment at about 300° C. after film formation in order to lower its electric resistance. Accordingly, there have been proposed a configuration in which a metallic material such as silver having a high electrical conductivity is made into a thin film, and a configuration in which an electrical conductivity is ensured even at a film thickness smaller than that of silver alone by blending aluminum with silver (e.g. referring to the following Patent Literature 3).

CITATION LIST

Patent Literature

PTL 1: Japanese Patent Laid-Open No. 2002-15623
PTL 2: Japanese Patent Laid-Open No. 2006-164961
PTL 3: Japanese Patent Laid-Open No. 2009-151963

SUMMARY OF INVENTION

Technical Problem

However, even in a transparent electrode constituted using silver and aluminum having a high electrical conductivity, it has been difficult to attain both of sufficient electrical conductivity and light transmission property.

Accordingly, objects of the present invention are to provide a transparent electrode having both of sufficient electrical conductivity and light transmission property, and to provide an electronic device in which performances are improved by using the transparent electrode.

Solution to Problem

The above object of the present invention is achieved by the following configuration:

1. A transparent electrode, including:
a nitrogen-containing layer formed at a deposition speed of 0.3 nm/s or greater and constituted using a compound containing a nitrogen atom; and
an electrode layer that is provided adjacent to the nitrogen-containing layer, that has a 12 nm or lower film thickness and has a measurable sheet resistance, and that is constituted using silver or an alloy having silver as the main component.

2. The transparent electrode according to the above 1, wherein the nitrogen-containing layer is formed at a deposition speed of 0.5 nm/s or greater.

3. The transparent electrode, including:
a nitrogen-containing layer constituted using a compound containing nitrogen atoms; and
an electrode layer that is provided adjacent to the nitrogen-containing layer within two minutes after the formation of the nitrogen-containing layer, that has a 12 nm or lower film thickness and has a measurable sheet resistance, and that is constituted using silver or an alloy having silver as the main component.

4. The transparent electrode according to the above 3, wherein the electrode layer is formed adjacent to the nitrogen-containing layer within one minute after the formation of the nitrogen-containing layer.

5. An electronic device, including the transparent electrode according to any one of the above 1 to 4.

6. The electronic device according to the above 5, wherein the electronic device is an organic electroluminescent element.

7. A method for manufacturing a transparent electrode, including the steps of:
forming a nitrogen-containing layer constituted using a compound containing nitrogen atoms at a deposition speed of 0.3 nm/s or greater; and
forming an electrode layer, on the nitrogen-containing layer, that has a 12 nm or lower film thickness and has a measurable sheet resistance, and that is constituted using silver or an alloy having silver as the main component.

8. A method for manufacturing a transparent electrode, including the steps of:

forming a nitrogen-containing layer constituted using a compound containing nitrogen atoms; and forming an electrode layer that has a 12 nm or lower film thickness and has a measurable sheet resistance and that is constituted using silver or an alloy having silver as the main component, in a state of being adjacent to the nitrogen-containing, within two minutes after forming the nitrogen-containing layer.

The transparent electrode having the aforementioned configuration according to the present invention is constituted by providing an electrode layer formed of silver or an alloy having silver as the main component, adjacent to a nitrogen-containing layer constituted using a compound containing nitrogen atoms. Therefore, when the electrode layer is formed adjacent to the nitrogen-containing layer, silver atoms constituting the electrode layer interact with the compound containing nitrogen atoms constituting the nitrogen-containing layer, and the transparent electrode layer is easily constituted as a continuous silver film without agglomeration of silver. In addition, as will be described in Example below, the nitrogen-containing layer is formed at a deposition speed of 0.3 nm/s or greater, and thus the electrode layer is constituted to be the film with more superior continuity.

In addition, it has been confirmed that the electrode layer is constituted as a film with higher continuity by making the electrode layer into a layer formed adjacent to the nitrogen-containing layer within two minutes after forming the nitrogen-containing layer, as described in Example below.

Furthermore, the electrode layer has a 12 nm or lower film thickness and has a measurable sheet resistance. This results in the electrode layer having suppressed light absorbing or reflecting component while ensuring practicability as the electrode film.

The above-mentioned result, the transparent electrode with such an electrode layer was attained with both of the improved conductivity and the improved light transmittance because the electrode layer ensures electrical conductivity due to its more superior continuity with ensuring high light transmittance due to its lower thickness.

Advantageous Effects of Invention

As explained above, according to the present invention, it becomes possible to attain both of the improvement of electrical conductivity and improvement of light transmission property, in the transparent electrode, and it becomes possible to attain the improvement of the performances of the electronic device using the transparent electrode.

DESCRIPTION OF EMBODIMENTS

Figure 1:
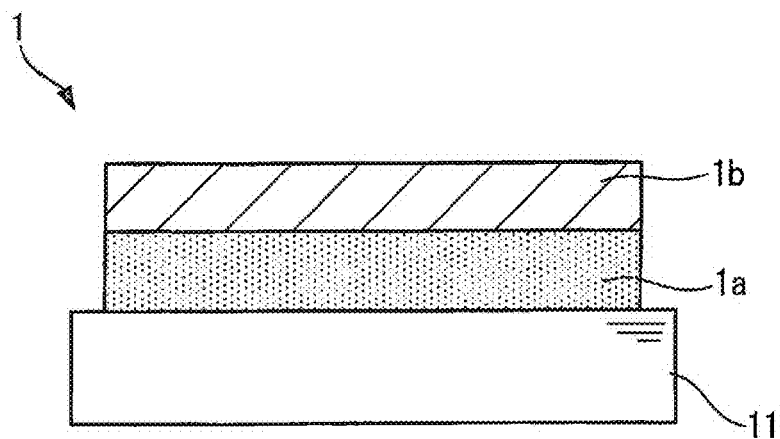
FIG. 1 is a schematic cross-sectional view illustrating the configuration of the transparent electrode according to the present invention.

The embodiments of the present invention will now be described in the following order with reference to the accompanying drawings.
1. Transparent electrode
2. Intended use of transparent electrode
3. First example of organic electroluminescent element
4. Second example of organic electroluminescent element
5. Third example of organic electroluminescent element
6. Intended use of organic electroluminescent element
7. Lighting device-1
8. Lighting device-2

<<1. Transparent Electrode>>

FIG. 1 is a schematic cross-sectional view showing an example of the configuration of the transparent electrode of the present invention. As shown in FIG. 1, the transparent electrode 1 is constituted to be two-layer structure obtained by laminating a nitrogen-containing layer 1a and an electrode layer 1b provided adjacent thereto, and for example, the nitrogen-containing layer 1a and the electrode layer 1b are provided in this order in the upper portion of a substrate 11. Among these, the nitrogen-containing layer 1a is constituted using a compound containing nitrogen atoms, while the electrode layer 1b is constituted using silver or an alloy having silver as the main component. In the present embodiment, it is particularly characteristic that the nitrogen-containing layer 1a is formed at a predetermined deposition speed, as will be described below in more detail. Furthermore, as will be described below in more detail, the electrode layer 1b may be constituted adjacent to the nitrogen-containing layer 1a within a prescribed period of time after the formation of the nitrogen-containing layer 1a.

Hereinafter, there will be described the detailed configuration of the electrode layer 1b and the nitrogen-containing layer 1a constituting the transparent electrode 1 having such a laminated structure, and the substrate 11 on which the transparent electrode 1 is provided, in this order, and then the method for manufacturing the transparent electrode 1 will be described.

<Electrode Layer 1b>

The electrode layer 1b is a layer constituted using silver or an alloy having silver as the main component and is a layer provided adjacent to the nitrogen-containing layer 1a as shown in the schematic cross-sectional view of FIG. 1. The electrode layer has a 12 nm or lower film thickness and has a measurable sheet resistance. The electrode layer 1b has a film thickness in which the measurement of the sheet resistance is possible, and thus a metal constituting the electrode layer 1b comes to have two-dimensional continuity in an in-plane direction, resulting in ensuring the practicability as an electrode film. In addition, the electrode layer 1b having a 12 nm or lower film thickness allows its light absorbing or reflecting component in the electrode layer 1b to be suppressed to be small, to thereby ensure the high light transmittance of the transparent electrode 1.

Meanwhile, the electrode layer 1b may have a configuration in which the layer is formed adjacent to the nitrogen-containing layer 1a within two minutes after the formation of the nitrogen-containing layer 1a. More preferably, the electrode layer 1b is a layer formed adjacent to the nitrogen-containing layer 1a within one minute after the formation of the nitrogen-containing layer 1a.

A metal constituting the electrode layer 1b is silver (Ag), or an alloy having silver as the main component. Silver (Ag) herein may include palladium (Pd), copper (Cu), gold (Au) and the like to be added in order to ensure stability of the silver, and refers to 99% or greater purity silver. The alloy having silver as the main component herein refers to the one with a silver content of 50% or greater. Examples of the alloy include silver-magnesium (AgMg), silver-copper (AgCu), silver-palladium (AgPd), silver-palladium-copper (AgPdCu), silver-indium (AgIn), silver-gold (AgAu), silver-aluminum (Ag—Al), silver-zinc (Ag—Zn), silver-tin (Ag—Sn), silver-platinum (Ag—Pt), silver-titanium (AgTi), silver-bismuth (AgBi) and the like.

In addition, the electrode layer 1b as described above may have a configuration in which a layer of silver or the alloy having silver as the main component is divided into plural layers for lamination as necessary.

<Nitrogen-Containing Layer 1a>

The nitrogen-containing layer 1a is formed at a deposition speed of 0.3 nm/s or greater by using a compound containing nitrogen atoms. More preferably, the nitrogen-containing layer 1a is formed at a deposition speed of 0.5 nm/s or greater. Such nitrogen-containing layer 1a is provided adjacent to the electrode layer 1b.

The compound containing nitrogen atoms formed of the nitrogen-containing layer 1a is not especially limited as long as the compound contains a nitrogen atom within the molecule, and the one that has a hetero ring containing a nitrogen atom as a hetero atom is preferable. Examples of the hetero ring having the nitrogen atom as the hetero atom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-c-cinnoline, porphyrin, chlorine, choline and the like.

In addition, the most preferred compound that has the hetero ring containing a nitrogen atom as the hetero atom as described above is the one represented by any of the following general formulae (1) to (3):

[General formula (1)]

$$(Ar1)_{n1}\text{-}Y1 \qquad \text{General formula (1)}$$

In the general formula (1), n1 represents integer of 1 or greater, Y1 represents a substituent when n1 is 1, and represents simply a bond or a linking group having a valence of n1 when n1 is 2 or greater. Ar1 represents a group of the general formula (A) described below, and a plurality of Ar1s may be the same or different from one another when n1 is 2 or greater. However, the compound of the general formula (1) has at least two condensed aromatic heterocycles each of which is formed by the condensation of three or greater rings in a molecule.

In the general formula (1), examples of the substituent represented by Y1 include an alkyl group (for example, methyl group, ethyl group, propyl group, isopropyl group, tert-butyl group, pentyl group, hexyl group, octyl group, dodecyl group, tridecyl group, tetradecyl group, pentadecyl group and the like), a cycloalkyl group (for example, cyclopentyl group, cyclohexyl group and the like), an alkenyl group (for example, vinyl group, allyl group and the like), an alkynyl group (for example, ethynyl group, propargyl group and the like), an aromatic hydrocarbon group (also referred to as an aromatic carbon ring group, an aryl group or the like, for example; phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyryl group and the like), an aromatic heterocyclic ring group (for example, furyl group, thienyl group, pyridyl group, pyridazinyl group, pyrimidinyl group, pyrazinyl group, triazinyl group, imidazolyl group, pyrazolyl group, thiazolyl group, quinazolinyl group, carbazolyl group, carbolinyl group, diazacarbazolyl group (a group in which a certain carbon atom constituting the carboline ring of the carbolinyl group is substituted with a nitrogen atom), phtharazinyl group and the like), a ring group (for example, pyrrolidyl group, imidazolidyl group, morpholyl group, oxazolidyl group and the like), an alkoxy group (for example, methoxy group, ethoxy group, propyloxy group, pentyloxy group, hexyloxy group, octyloxy group, dodecyloxy group and the like), a cycloalkoxy group (for example, cyclopentyloxy group, cyclohexyloxy group and the like), an aryloxy group (for example, phenoxy group, naphthyloxy group and the like), an alkylthio group (for example, methylthio group, ethylthio group, propylthio group, pentylthio group, hexylthio group, octylthio group, dodecylthio group and the like), a cycloalkylthio group (for example, cyclopentylthio group, cyclohexylthio group and the like), an arylthio group (for example, phenylthio group, naphthylthio group and the like), an alkoxycarbonyl group (for example, methyloxycarbonyl group, ethyloxycarbonyl group, butyloxycarbonyl group, octyloxycarbonyl group, dodecyloxycarbonyl group and the like), an aryloxycarbonyl group (for example, phenyloxycarbonyl group, naphthyloxycarbonyl group and the like), a sulfamoyl group (for example, aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group and the like), an acyl group (for example, acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group and the like), an acyloxy group (for example, acetyloxy group, ethylcarbonyloxy group, butylcarbonyloxy group, octylcarbonyloxy group, dodecylcarbonyloxy group, phenylcarbonyloxy group and the like), an amido group (for example, methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group and the like), a carbamoyl group (for example, aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group and the like), an ureido group (for example, methylureido group, ethylureido group, pentylureido group, cyclohexylureido group, octylureido group, dodecylureido group, phenylureido group, naphthylureido group, 2-pyridylaminoureido group and the like), a sulfinyl group (for example, methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, 2-pyridylsulfinyl group and the like), an alkylsulfonyl group (for example, methylsulfonyl group, ethylsulfonyl group, butylsulfonyl group, cyclohexylsulfonyl group, 2-ethylhexylsulfonyl group, dodecylsulfonyl group and the like), an arylsulfonyl group or a heteroarylsulfonyl group (for example, phenylsulfonyl group, naphthylsulfonyl group, 2-pyridylsulfonyl group and the like), an amino group (for example, amino group, ethylamino group, dimethylamino group, butylamino group, cyclopentylamino group, 2-ethylhexylamino group, dodecylamino group, anilino group, naphthylamino group, 2-pyridylamino group, piperidyl group (also referred to as piperidinyl group), 2,2,6,6-tetramethylpiperidinyl group and the like), a halogen atom (for example, fluorine atom, chlorine atom, bromine atom and the like), a fluorinated hydrocarbon group (for example, fluoromethyl group, trifluoromethyl group, pentafluoroethyl group, pentafluorophenyl group and the like), cyano group, nitro group, hydroxyl group, mercapto group, a silyl group (for example, trimethylsilyl group, triisopropylsilyl group, triphenylsilyl group, phenyldiethylsilyl group and the like), a phosphate group (for example, dihexylphosphoryl group and the like), a phosphite group (for example, diphenylphosphinyl group and the like), phosphono group and the like.

Some of these substituents may further be substituted by the aforementioned substituent. In addition, two or greater of these substituents may bind to each other to form a ring.

In the general formula (1), the linking group having a valence of n1, represented by Y1, specifically includes divalent, trivalent, tetravalent linking groups and the like.

Examples of the divalent linking group represented by Y1 in the general formula (1) include: an alkylene group (for example, ethylene group, trimethylene group, tetramethylene group, propylene group, ethylethylene group, pentamethylene group, hexamethylene group, 2,2,4-trimethylhexamethylene group, heptamethylene group, octamethylene group, nonamethylene group, decamethylene group, undecamethylene group, dodecamethylene group, a cyclohexylene group (for example, 1,6-cyclohexanediyl group and the like) and a cyclopenthylene group (for example, 1,5-cyclopentanediyl group and the like)), an alkenylene group (for example, vinylene group, propenylene group, butenylene group, pentenylene group, 1-methylvinylene group, 1-methylpropenylene group, 2-methylpropenylene group, 1-methylpentenylene group, 3-methylpentenylene group, 1-ethylvinylene group, 1-ethylpropenylene group, 1-ethylbutenylene group, 3-ethylbutenylene group and the like), an alkynylene group (for example, ethynylene group, 1-propynylene group, 1-butynylene group, 1-pentynylene group, 1-hexynylene group, 2-butynylene group, 2-pentynylene group, 1-methylethynylene group, 3-methyl-1-propynylene group, 3-methyl-1-butynylene group and the like), an arylene group (for example, o-phenylene group, p-phenylene group, naphthalenediyl group, anthracenediyl group, naphthacenediyl group, pyrenediyl group, naphthylnaphthalenediyl group, a biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like), a heteroarylene group (for example, a divalent group derived from a group consisting of carbazole group, carboline ring, diazacarbazole ring (also referred to as monoazacarboline group, exhibiting a ring structure obtained by substituting one carbon atom constituting the carboline ring, with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like), a chalcogen atom such as oxygen or sulfur, a group or the like derived from a condensed aromatic heterocyclic ring obtained by condensing three or greater rings (here, the condensed aromatic heterocyclic ring formed by condensing three or greater rings preferably contains a hetero atom selected from N, O and S as an element constituting a condensed ring, for example, acridine ring, benzoquinoline ring, carbazole ring, phenazine ring, phenanthridine ring, phenanthroline ring, carboline ring, cycladine ring, quindoline ring, thebenidine ring, quinindoline ring, triphenodithiazine ring, triphenodioxazine ring, phenanthrazine ring, anthrazine ring, perimizine ring, diazacarbazole ring (exhibiting a ring obtained by substituting optional one of carbon atoms constituting the carboline ring, with a nitrogen atom), phenanthroline ring, dibenzofuran ring, dibenzothiophene ring, naphthofuran ring, naphthothiophene ring, benzodifuran ring, benzodithiophene ring, naphthodifuran ring, naphthodithiophene ring, anthrafuran ring, anthradifuran ring, anthrathiophene ring, anthradithiophene ring, thianthrene ring, phenoxathiin ring, thiophanthrene ring (naphthothiophene ring) and the like).

Examples of the trivalent linking group represented by Y1 in the general formula (1) include ethanetriyl group, propanetriyl group, butanetriyl group, pentanetriyl group, hexanetriyl group, heptanetriyl group, octanetriyl group, nonanetriyl group, decanetriyl group, undecanetriyl group, dodecanetriyl group, cyclohexanetriyl group, cyclopentanetriyl group, benzenetriyl group, naphthalenetriyl group, pyridinetriyl group, carbazoletriyl group and the like.

The tetravalent linking group represented by Y1 in the general formula (1) is a group having a combining group added to the above-mentioned trivalent linking group. Examples include propandiylidene group, 1,3-propandiyl-2-ylidene group, butanediylidene group, pentanediylidene group, hexanediylidene group, heptanediylidene group, octanediylidene group, nonanediylidene group, decanediylidene group, undecanediylidene group, dodecanediylidene group, cyclohexanediylidene group, cyclopentanediylidene group, benzenetetrayl group, naphthalenetetrayl group, pyridinetetrayl group, carbazoletetrayl group, and the like.

Meanwhile, each of the aforementioned divalent, trivalent and tetravalent linking groups may further have a substituent represented by Y1 of the general formula (1).

As the preferable aspect of the compound represented by the general formula (1), it is preferable that Y1 represent a group which is derived from a condensed aromatic heterocyclic ring formed by condensing three or greater rings. Examples of the condensed aromatic heterocyclic ring formed by condensing three or greater rings preferably include dibenzofuran ring or dibenzothiophene ring. In addition, n1 is preferably 2 or greater.

Furthermore, the compound represented by the general formula (1) has, in the molecule, at least two condensed aromatic heterocyclic rings formed by condensing three or greater rings, described above.

Moreover, when Y1 represents an n1-valent linking group, Y1 is preferably non-conjugated in order to keep the triplet excitation energy of the compound represented by the general formula (1) high, and is preferably constituted of aromatic rings (aromatic hydrocarbon ring+aromatic heterocyclic ring) from the viewpoint of improving Tg (also referred to as glass transition point, or glass transition temperature).

Here, the "non-conjugated" means a case in which a linking group cannot be expressed by repetition of a single bond (single bond) and a double bond, or a case in which a conjugation of aromatic rings constituting a linking group is sterically broken.

[Group Represented by the General Formula (A)]

Ar1 in the general formula (1) represents the group represented by the general formula (A) below.

[Chem. 1]

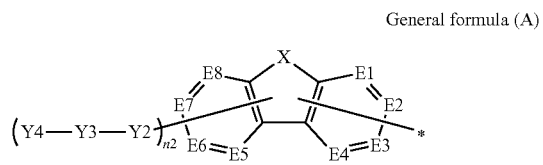

General formula (A)

Where, X represents —N(R)—, —O—, —S— or —Si(R)(R')—, E1 to E8 each represent —C(R1)= or —N=, R, R' and R1 each represent hydrogen atom, a substituent or a linking moiety with Y1. The symbol * represents a linking moiety with Y1. Y2 represents simply a bond or a divalent linking group. Y3 and Y4 each represent a group derived from a five-membered or six-membered aromatic ring, and at least one represents a group derived from an aromatic heterocyclic ring containing a nitrogen atom as a ring constituent atom. n2 represents an integer of 1 to 4.

Here, in —N(R)— or —Si(R)(R')— represented by X of the general formula (A), and further in —C(R1)=represented by E1 to E8, a substituent represented by each of R, R' and R1 has the same meaning as the substituent represented by Y1 of the general formula (1).

In addition, a divalent linking group represented by Y2 in the general formula (A) has the same meaning as the divalent linking group represented by Y1 in the general formula (1).

Furthermore, examples of a five-membered or six-membered aromatic ring which is used for the formation of a group derived from a five-membered or six-membered aromatic ring represented by each of Y3 and Y4 in the general formula (A) include benzene ring, oxazole ring, thiophene ring, furan ring, pyrrole ring, pyridine ring, pyridazine ring, pyrimidine ring, pyrazine ring, diazine ring, triazine ring, imidazole ring, isoxazole ring, pyrazole ring, triazole ring and the like.

Moreover, at least one of the groups derived from five-membered or six-membered aromatic rings each represented by Y3 and Y4 represents a group derived from the aromatic heterocyclic ring containing a nitrogen atom as a ring constituent atom, and examples of the aromatic heterocyclic ring containing a nitrogen atom as a ring constituent atom include oxazole ring, pyrrole ring, pyridine ring, pyridazine ring, pyrimidine ring, pyrazine ring, diazine ring, triazine ring, imidazole ring, isoxazole ring, pyrazole ring, triazole ring, and the like.

(Preferred Aspect of the Group Represented by Y3)

In the general formula (A), the group represented by Y3 is preferably a group derived from the aforementioned six-membered aromatic ring, and is more preferably a group derived from a benzene ring.

(Preferred Aspect of the Group Represented by Y4)

In the general formula (A), the group represented by Y4 is preferably a group derived from the aforementioned six-membered aromatic ring, is more preferably a group derived from the aromatic heterocyclic ring containing a nitrogen atom as a ring constituent atom, and is particularly preferably a group derived from a pyridine ring.

(Preferred Aspect of the Group Represented by the General Formula (A))

The preferable aspect of the group represented by the general formula (A) includes a group represented by any of the general formulae (A-1), (A-2), (A-3) or (A-4).

[Chem. 2]

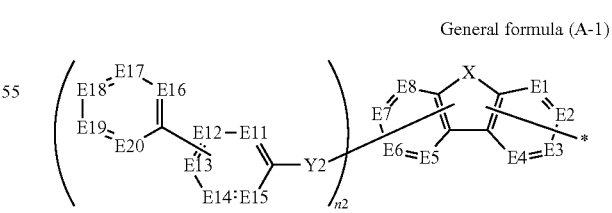

General formula (A-1)

In the general formula (A-1), X represents —N(R)—, —O—, —S— or —Si(R)(R')—, E1 to E8 each represent —C(R1)= or —N=, and R, R' and R1 each represent hydrogen atom, a substituent or a linking moiety with Y1. Y2 represents simply a bond or a divalent linking group. E11 to E20 each represent —C(R2)= or —N=, and at least one represents —N═. R2 represents hydrogen atom, a substituent or a linking moiety. However, at least one of E11 and E12 represents —C(R2)═, and R2 represents a linking moiety. n2 represents an integer of 1 to 4. The symbol * represents a linking moiety with Y1 in the general formula (1).

[Chem. 3]

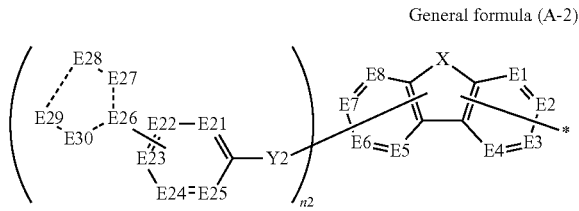

General formula (A-2)

In the general formula (A-2), X represents —N(R)—, —O—, —S— or —Si(R)(R')—, E1 to E8 each represent —C(R1)═ or —N═, and R, R' and R1 each represent a hydrogen atom, a substituent or a linking moiety with Y1. Y2 represents simply a bond or a divalent linking group. E21 to E25 each represent —C(R2)═ or —N═, E26 to E30 each represent —C(R2)═, —N═, —O—, —S— or —Si(R3)(R4)-, and at least one of E21 to E30 represents —N═. R2 represents a hydrogen atom, a substituent or a linking moiety, and R3 and R4 each represent a hydrogen atom or a substituent. However, at least one of E21 or E22 represents —C(R2)═ and R2 represents a linking moiety. n2 represents an integer of 1 to 4. The symbol * represents a linking moiety with Y1 in the general formula (1).

[Chem. 4]

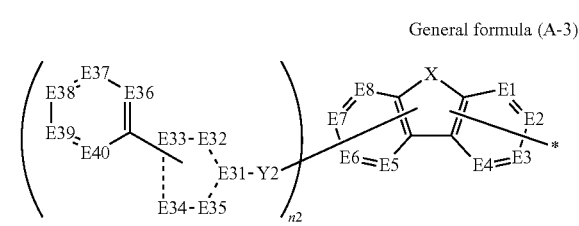

General formula (A-3)

In the general formula (A-3), X represents —N(R)—, —O—, —S— or —Si(R)(R')—, E1 to E8 each represent —C(R1)═ or —N═, and R, R' and R1 each represent a hydrogen atom, a substituent or a linking moiety with Y1. Y2 represents simply a bond or a divalent linking group. E31 to E35 each represent —C(R2)═, —N═, —O—, —S— or —Si(R3)(R4)-, and E36 to E40 each represent —C(R2)═ or —N═, and at least one of E31 to E40 represents —N═. R2 represents a hydrogen atom, a substituent or a linking moiety, and R3 and R4 each represent a hydrogen atom or a substituent. However, at least one of E32 or E33 represents —C(R2)═ and R2 represents a linking moiety. n2 represents an integer of 1 to 4. The symbol * represents a linking moiety with Y1 in the general formula (1).

[Chem. 5]

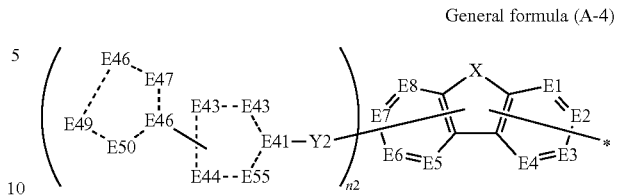

General formula (A-4)

In the general formula (A-4), X represents —N(R)—, —O—, —S— or —Si(R)(R')—, E1 to E8 each represent —C(R1)═ or —N═, and R, R' and R1 each represent a hydrogen atom, a substituent or a linking moiety with Y1. Y2 represents simply a bond or a divalent linking group. E41 to E50 each represent —C(R2)═, —N═, —O—, —S— or —Si(R3)(R4)-, and at least one represents —N═. R2 represents a hydrogen atom, a substituent or a linking moiety, and R3 and R4 each represent a hydrogen atom or a substituent. However, at least one of E42 or E43 represents —C(R2)═ and R2 represents a linking moiety. n2 represents an integer of 1 to 4. The symbol * represents a linking moiety with Y1 in the general formula (1).

Hereinafter, the group represented by any of the general formulae (A-1) to (A-4) will be explained.

In —N(R)— or —Si(R)(R')— represented by X in any of the group represented by the general formulae (A-1) to (A-4), and further in —C(R1)═ represented by E1 to E8, a substituent represented by each of R, R' and R1 has the same meaning as the substituent represented by Y1 of the general formula (1).

In any of the group represented by the general formulae (A-1) to (A-4), the divalent linking group represented by Y2 has the same meaning as the divalent linking group represented by Y1 of the general formula (1).

The substituent represented by R2 in —C(R2)═represented by each of E11 to E20 in the general formula (A-1), each of E21 to E30 in the general formula (A-2), each of E31 to E40 in the general formula (A-3) and each of E41 to E50 in the general formula (A-4) has the same meaning as the substituent represented by Y1 of the general formula (1).

Next, more preferable embodiments of the compound represented by the general formula (1) according to the present invention will be explained.

[Compound Represented by the General Formula (2)]

According to the present invention, among the compounds represented by the aforementioned general formula (1), the compound represented by the following general formula (2) is preferable. Hereinafter, the compound represented by the general formula (2) will be explained.

[Chem. 6]

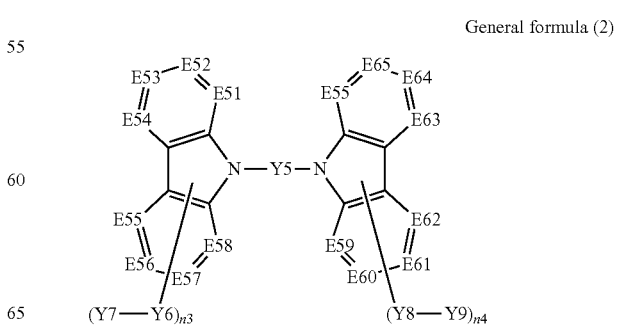

General formula (2)

In the general formula (2), Y5 represents a divalent linking group formed of an arylene group, a heteroarylene group or a combination thereof. E51 to E66 each represent —C(R3)= or —N=, and R3 represents a hydrogen atom or a substituent. Y6 to Y9 each represent a group derived from an aromatic hydrocarbon ring or a group derived from an aromatic heterocyclic ring, and at least one of Y6 or Y7 and at least one of Y8 or Y9 each represent a group derived from an aromatic heterocyclic ring containing an N atom. n3 and n4 each represent an integer of 0 to 4, but the sum of n3 and n4 is an integer of 2 or greater.

The arylene and heteroarylene groups represented by Y5 in the general formula (2) have the same meaning as arylene and heteroarylene groups defined as an example of the divalent linking group represented by Y1 in the general formula (1).

A preferred aspect of the divalent linking group represented by Y5, including the arylene or heteroarylene group, or a combination thereof, preferably includes the group derived from the condensed aromatic heterocycle obtained by the condensation of three or greater rings among the heteroarylene groups, and a preferable example of the group derived from the condensed aromatic heterocycle obtained by the condensation of three or greater rings is the group derived from a dibenzofuran or dibenzothiophene ring.

In the general formula (2), the substituent represented by R3 in —C(R3)= of each of E51 to E66 has the same meaning as the substituent represented by Y1 in the general formula (1).

In the general formula (2), it is preferable that as groups represented by E51 to E66, six or greater among E51 to E58 and six or greater among E59 to E66 each represent —C(R3)=.

In the general formula (2), examples of the aromatic hydrocarbon ring which is used for the formation of a group derived from the aromatic hydrocarbon ring represented by Y6 to Y9 include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

Furthermore, the aromatic hydrocarbon ring may also have a substituent represented by Y1 of the general formula (1).

In the general formula (2), examples of the aromatic heterocyclic ring used for the formation of a group derived from the aromatic heterocyclic ring represented by each of Y6 to Y9 include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom) and the like.

Moreover, the aromatic hydrocarbon ring may have the substituent represented by Y1 of the general formula (1).

In the general formula (2), examples of the aromatic heterocyclic ring containing an N atom which is used for the formation of a group derived from the aromatic heterocyclic ring containing an N atom represented by at least one of Y6 or Y7 and at least one of Y8 or Y9 include oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring Obtained by further substituting one of carbon atoms constituting the carboline ring by a nitrogen atom) and the like.

In the general formula (2), it is preferable that the group each represented by Y7, Y9 is represented by a group derived from each pyridine ring.

In addition, in the general formula (2), it is preferable that the group each represented by Y6 and Y8 is represented by a group derived from each benzene ring.

Moreover, a more preferred aspect among the compounds represented by the general formula (2) according to the present invention will be explained.

[Compound Represented by General Formula (3)]

In the present invention, the compound of the following general formula (3) is more preferred among the compounds of the general formula (2). Hereinafter, the compound represented by the general formula (3) will be explained.

[Chem. 7]

General formula (3)

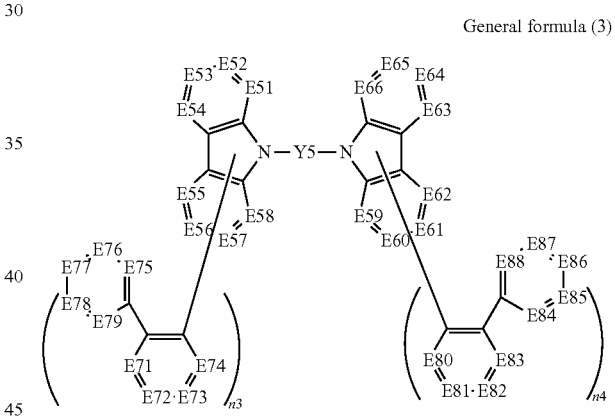

In the general formula (3), Y5 represents a divalent linking group formed of a arylene or heteroarylene group, or a combination thereof. E51 to E66 and E71 to E88 each represent —C(R3)= or —N=, and R3 represents a hydrogen atom or substituent. However, at least one of E71 to E79 and at least one of E80 to E88 each represent —N=. n3 and n4 each represent an integer of 0 to 4, but n3+n4 is an integer of 2 or greater.

The arylene and heteroarylene groups represented by Y5 in the general formula (3) have the same meaning as arylene and heteroarylene groups defined as an example of the divalent linking group represented by Y1 in the general formula (1).

A preferred aspect of the divalent linking group represented by Y5, including the arylene or heteroarylene group, or a combination thereof, preferably includes the group derived from the condensed aromatic heterocycle obtained by the condensation of three or greater rings among the heteroarylene groups, and a preferable example of the group derived from the condensed aromatic heterocycle obtained by the condensation of three or greater rings is the group derived from a dibenzofuran or dibenzothiophene ring.

In the general formula (3), the substituent represented by R3 in —C(R3)= of each of E51 to E66 and E71 to E88 has the same meaning as the substituent represented by Y1 in the general formula (1).

In the general formula (3), it is preferable that six or greater among E51 to E58 and six or greater among E59 to E66 each represent —C(R3)=.

In the general formula (3), it is preferable that at least one of E75 to E79 and at least one of E84 to E88 each represent —N=.

Furthermore, in the general formula (3), it is preferable that any one of E75 to E79 and any one of E84 to E88 each represent —N=.

In addition, in the general formula (3), a preferable aspect in which E71 to E74 and E80 to E83 each represent —C(R3)= is included.

Moreover, in the compound represented by the general formula (2) or (3), it is preferable that E53 represents —C(R3)= and R3 represents the linking moiety, while it is preferable that E61 also represents —C(R3)= and R3 represents the linking moiety.

Furthermore, it is preferable that E75 and E84 individually present —N=, and E71 to E74 and E80 to E83 each represent —C(R3)=, respectively.

In addition, a compound represented by the following general formula (4) is used as another example of the compound constituting the nitrogen-containing layer 1a.

[Chem. 8]

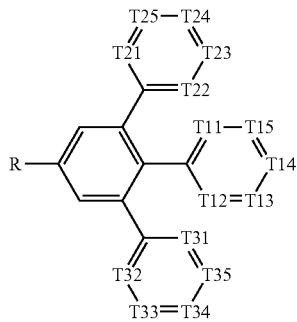

General formula (4)

In the general formula (4), at least one of T11 and T12 is a nitrogen atom, at least one of T21 to T25 is a nitrogen atom, and at least one of T31 to T35 is a nitrogen atom.

R in the general formula (4) represents a substituent. An example of the substituent includes the same one as Y1 of the general formula (1). The some substituents may be further replaced with the above substituents.

[Specific Examples of Compounds]

Specific examples (1 to 125) of the compound represented by the general formula (1), (2), (3), or (4) according to the present invention and the other nitrogen-containing compound will be shown below, but not limited thereto.

[Chem. 9]

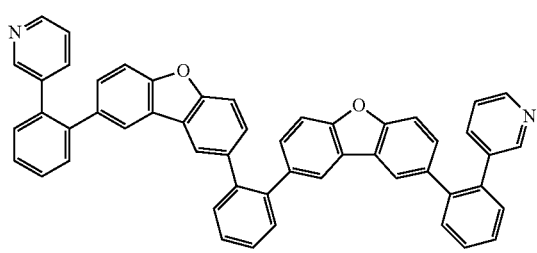

1

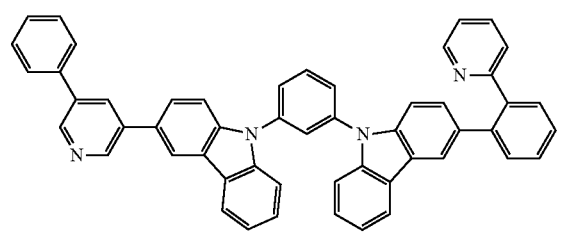

2

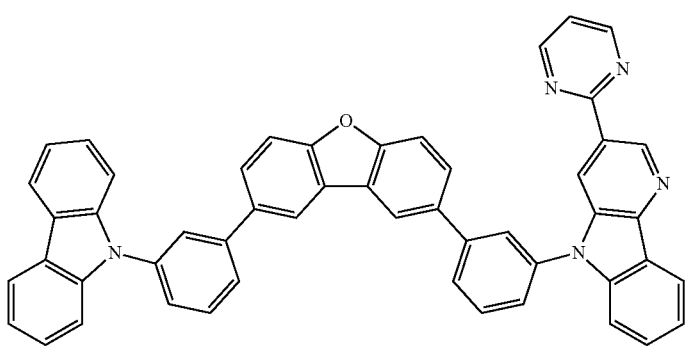

3

4
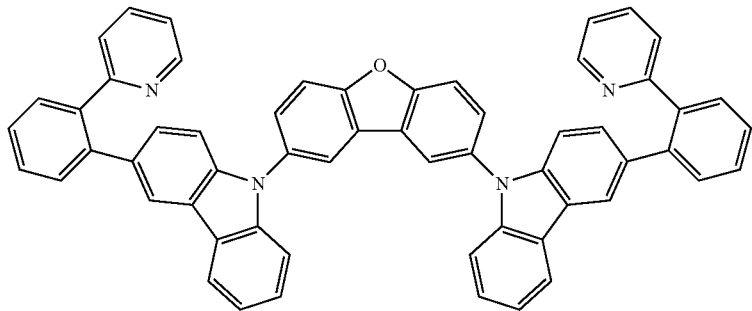
5
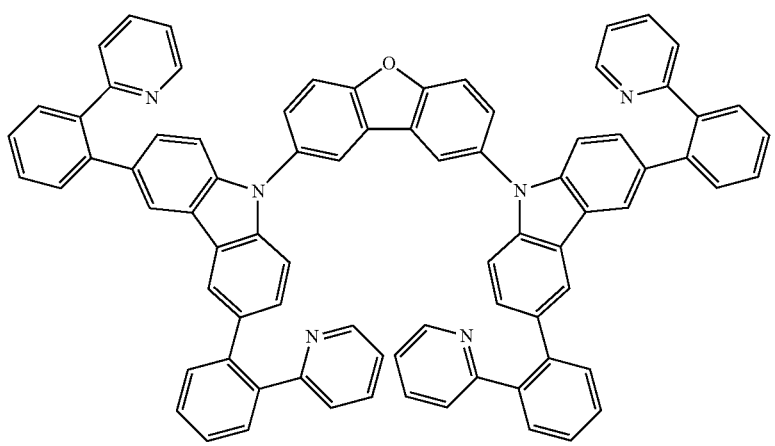
[Chem. 10]
6
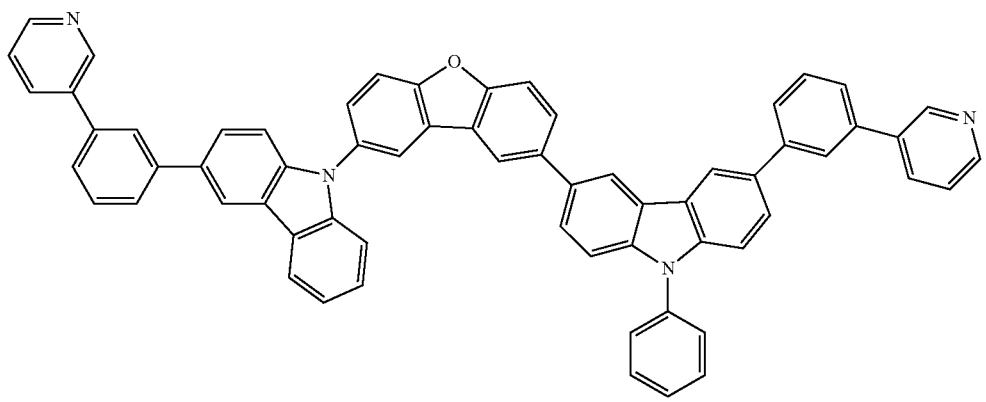
7
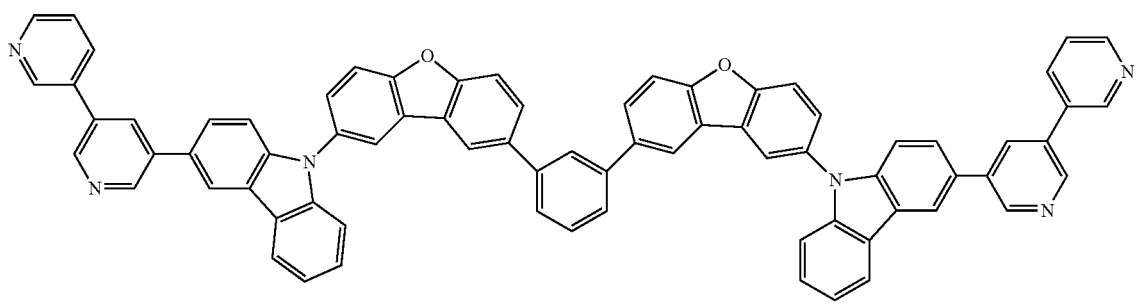

-continued
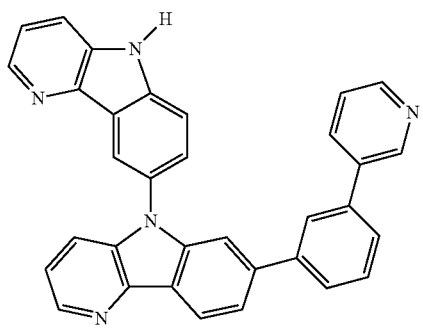
8
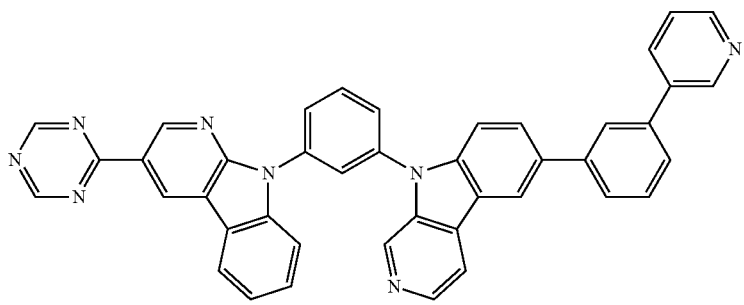
9
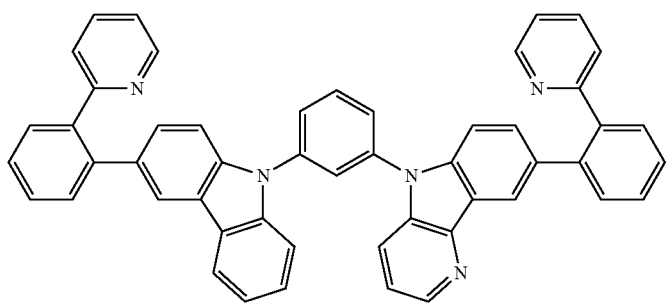
10
[Chem. 11]
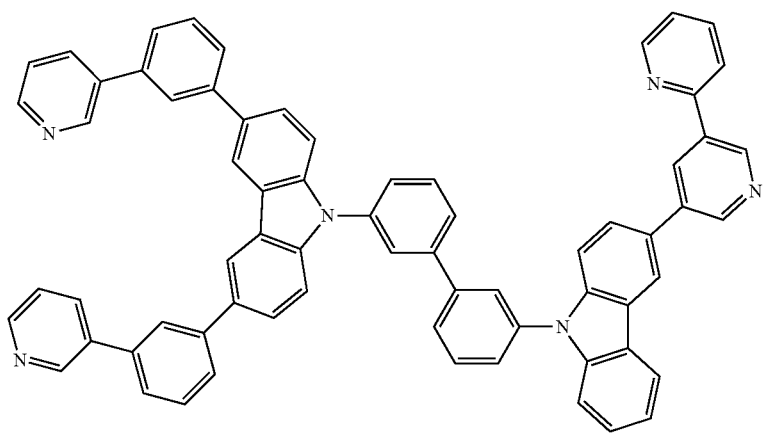
11
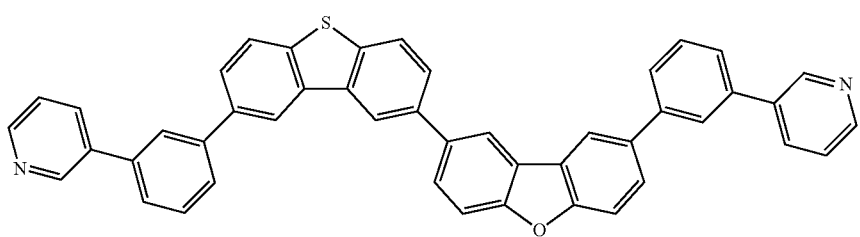
12

13
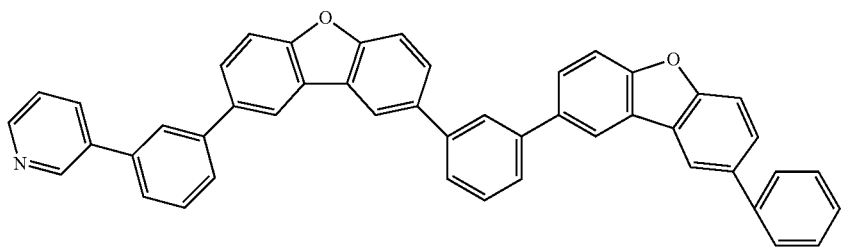
14
15
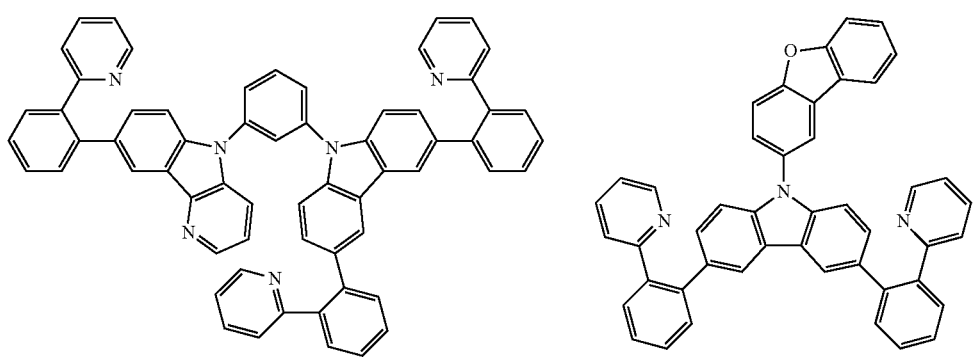
[Chem. 12]
16
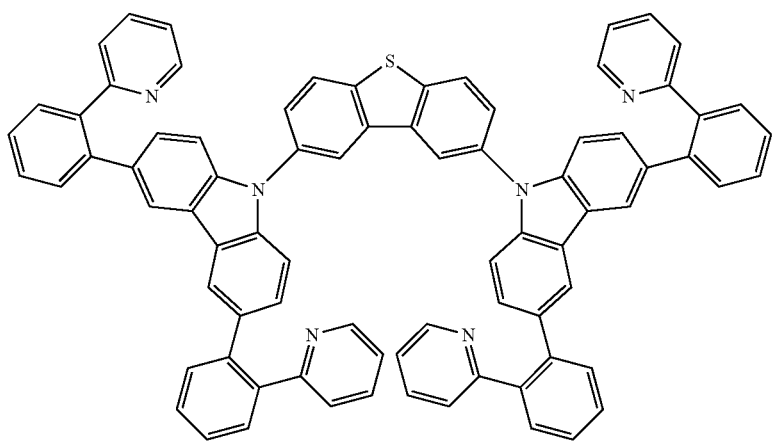
17
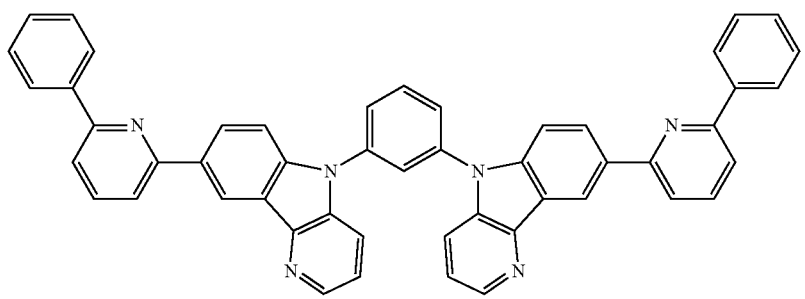

-continued
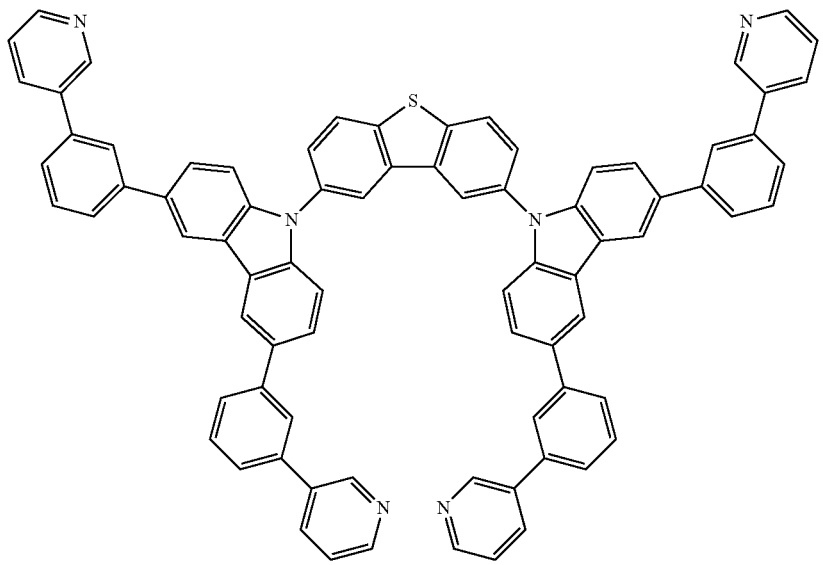
18
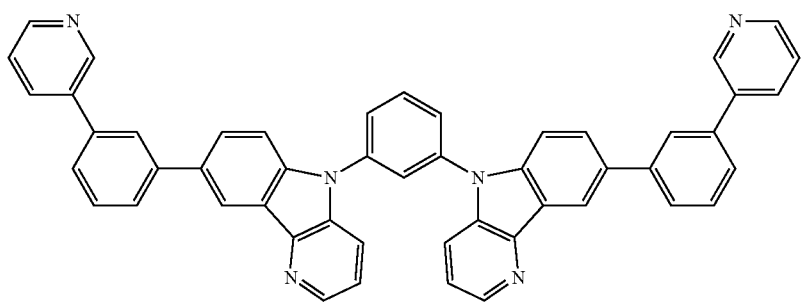
19
[Chem. 13]
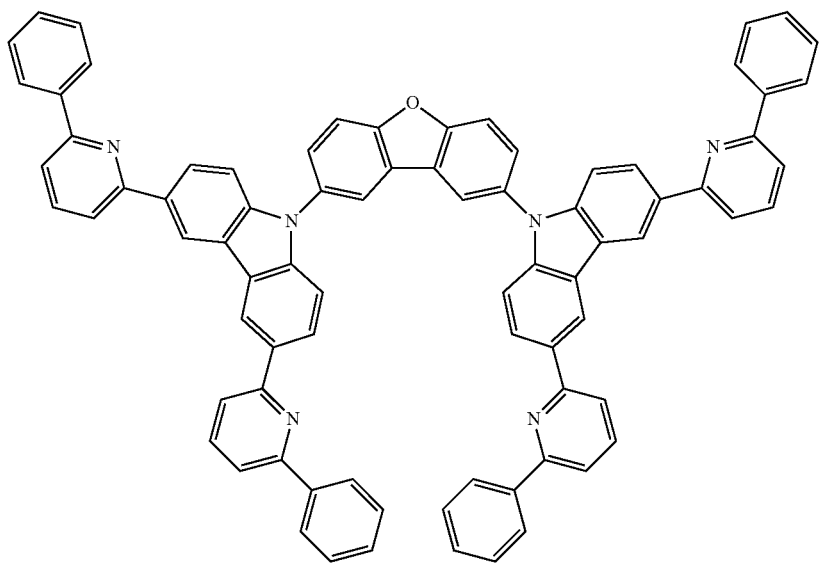
20

-continued
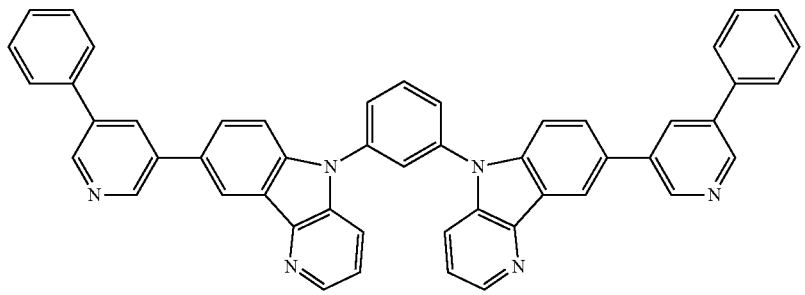
21
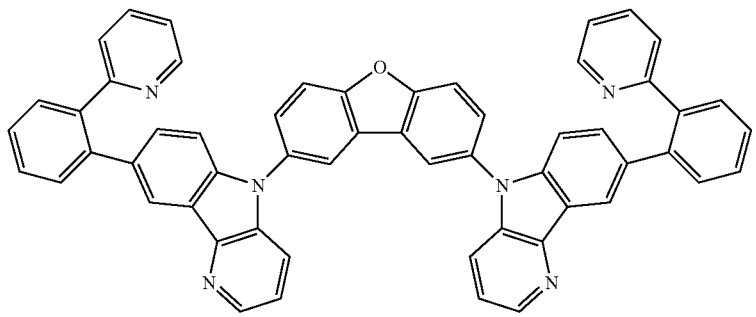
22
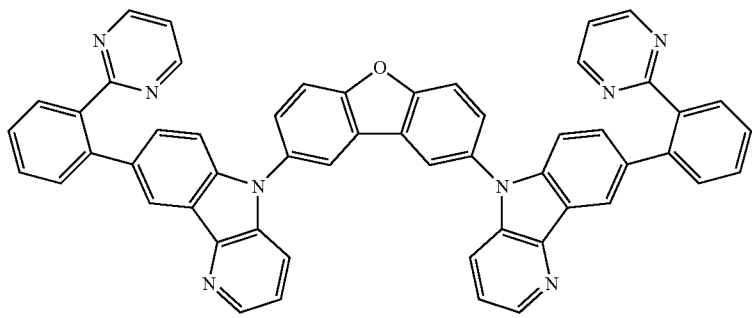
23
[Chem. 14]
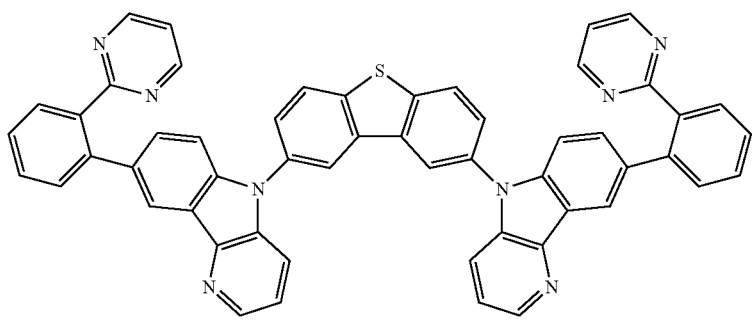
24
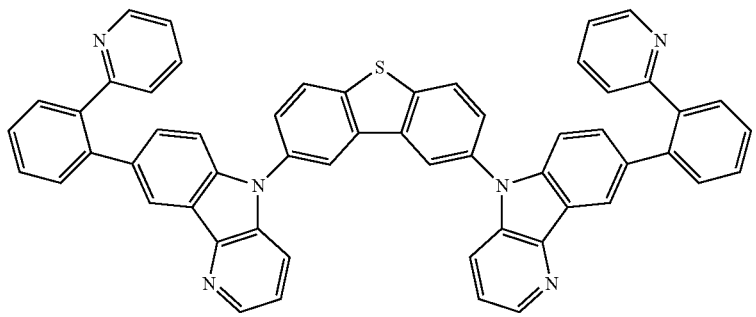
25

-continued
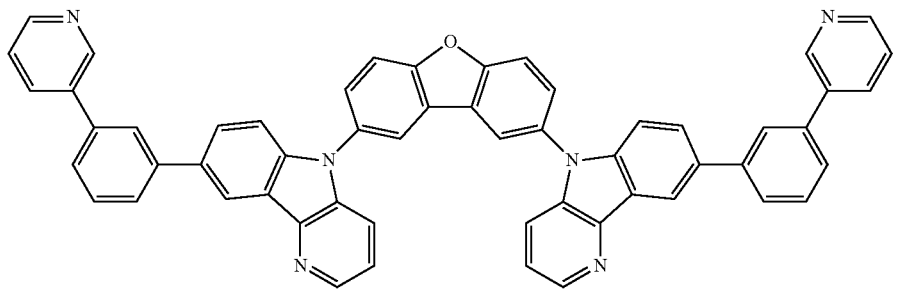
26
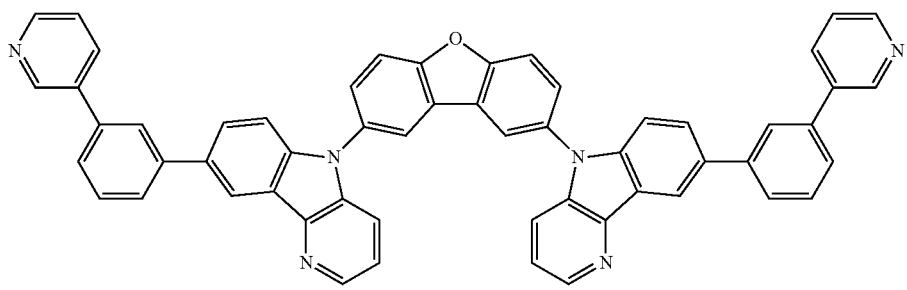
27
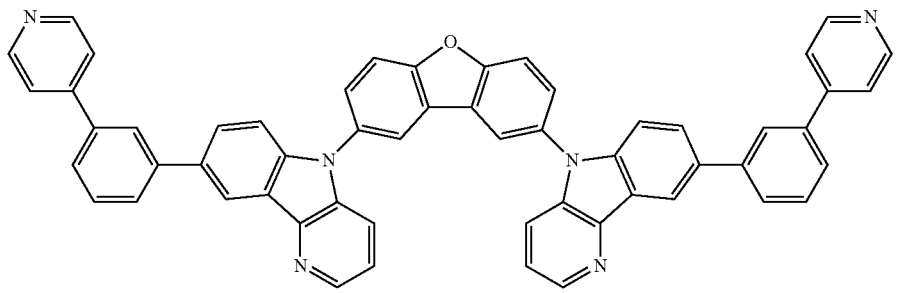
28
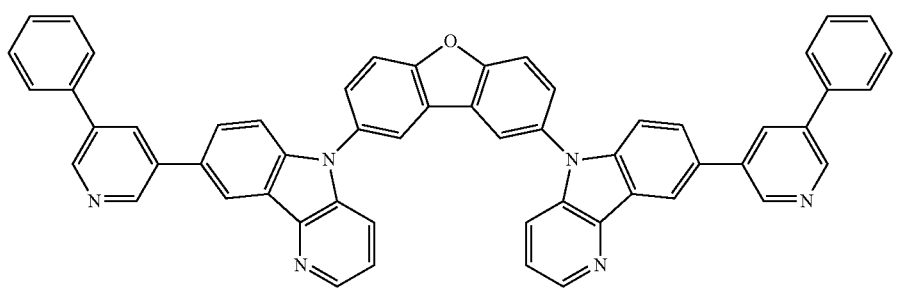
29
[Chem. 15]
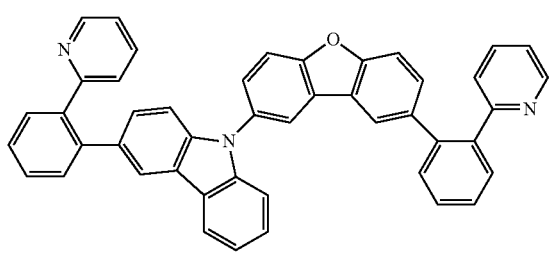
30
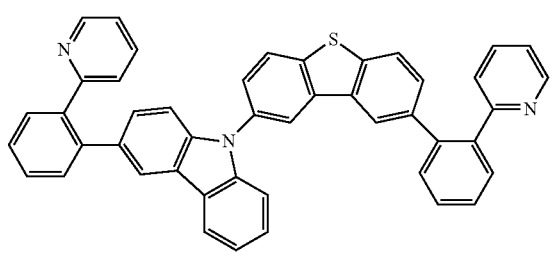
31

-continued
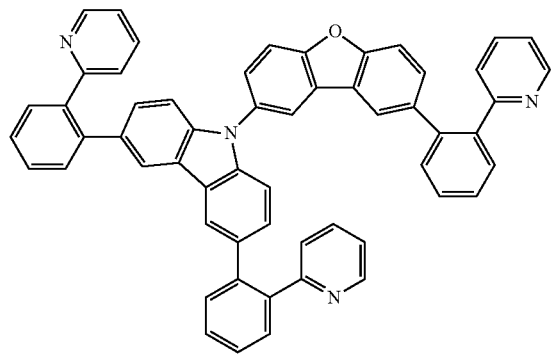
32
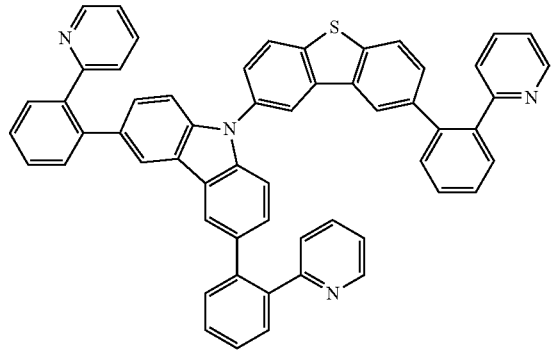
33
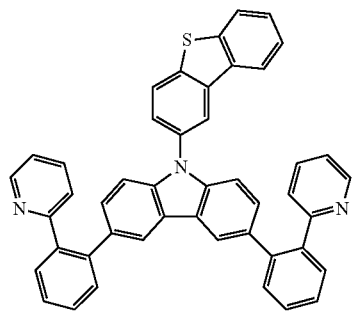
34
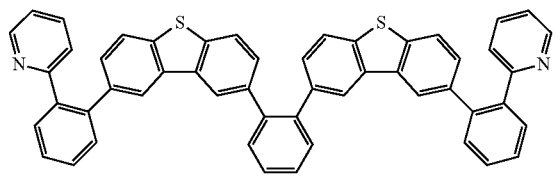
35
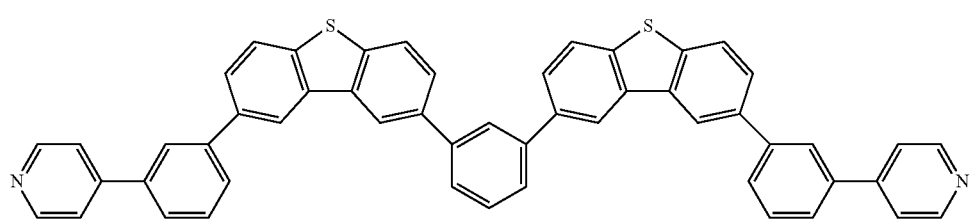
36
[Chem. 16]
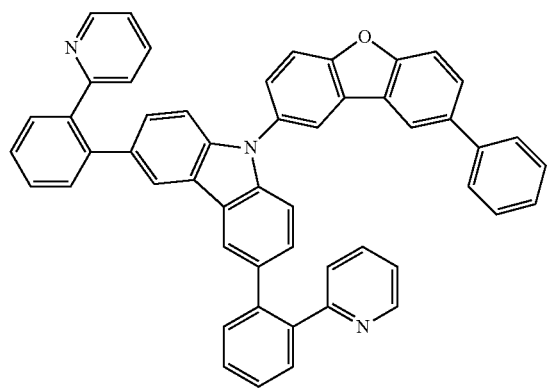
37
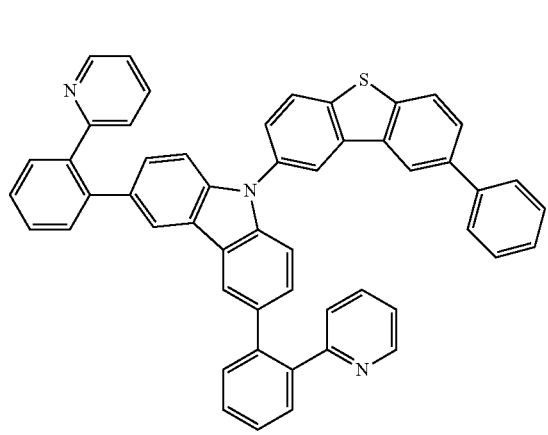
38

-continued
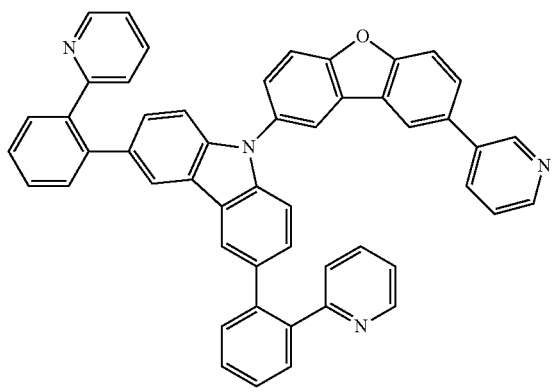
39
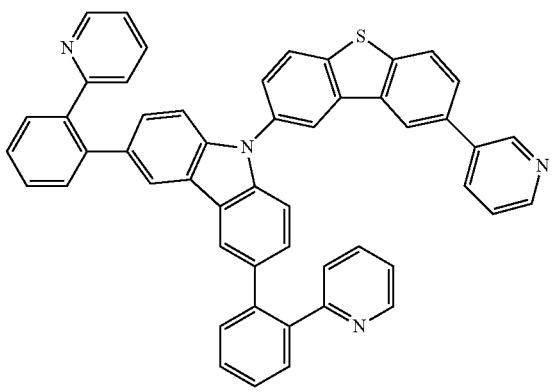
40
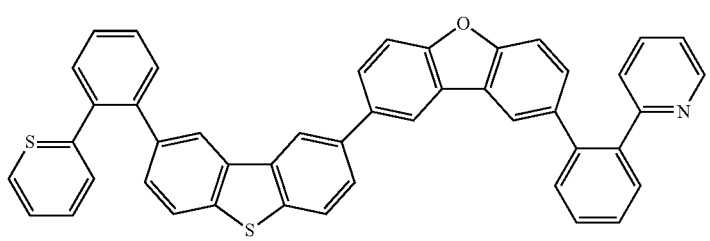
41
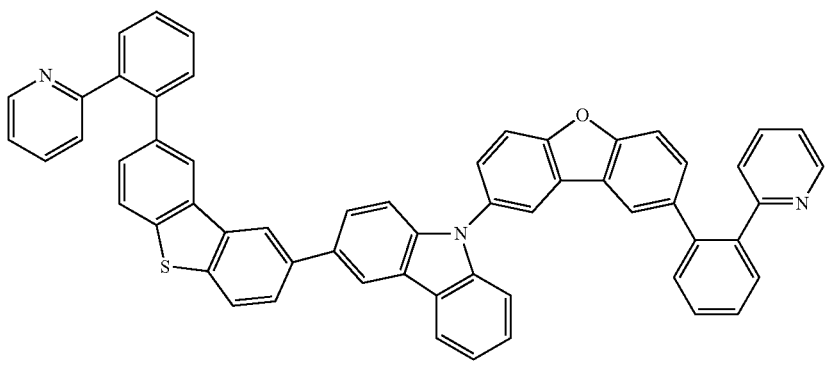
42
[Chem. 17]
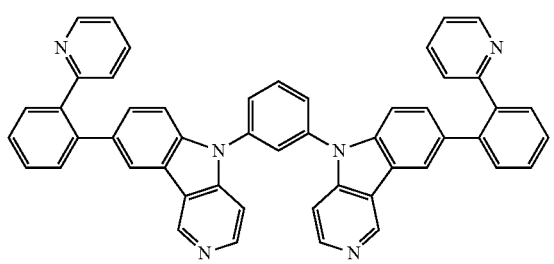
43
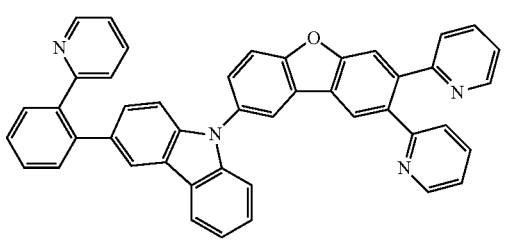
44

-continued
45
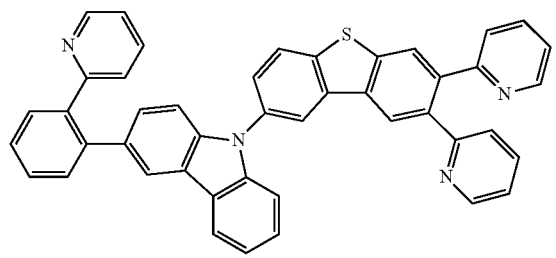
46
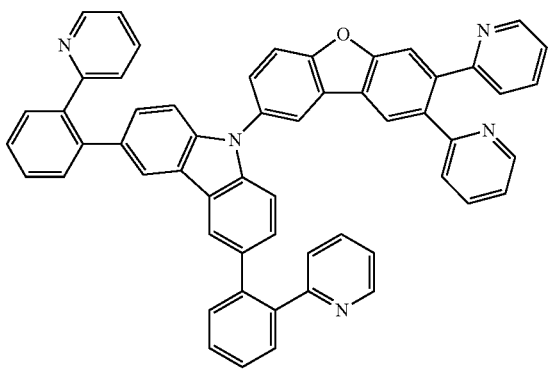
47
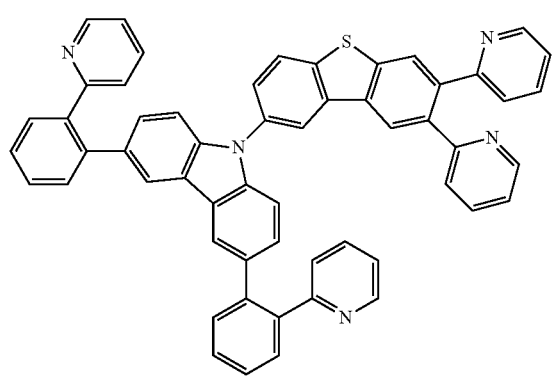
[Chem. 18]
48
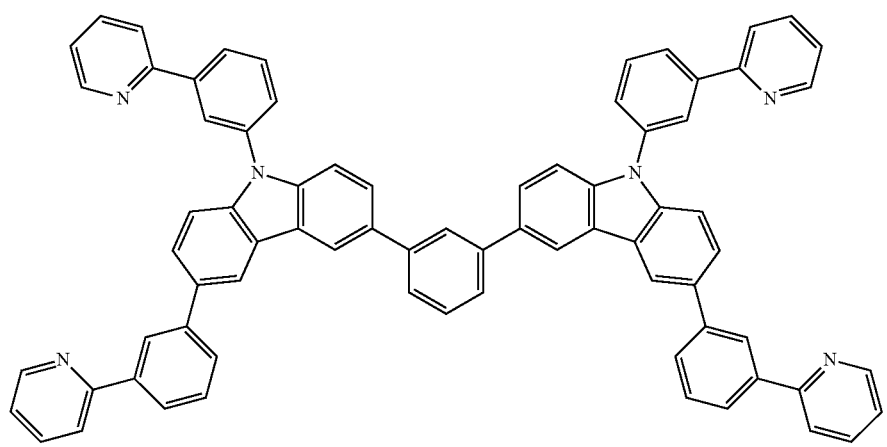
49
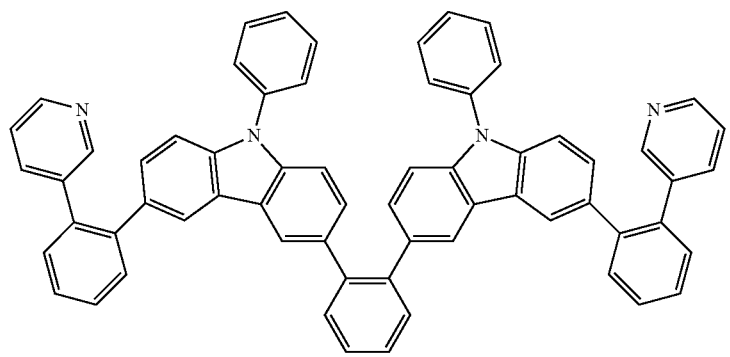

-continued
50
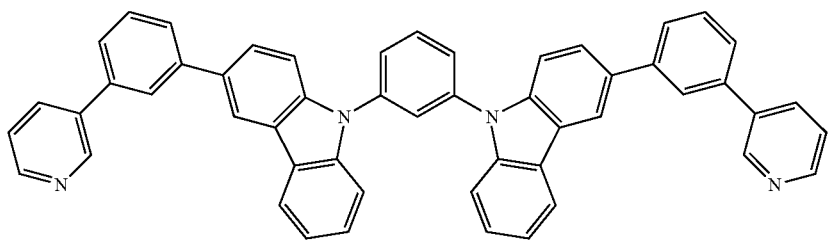
51
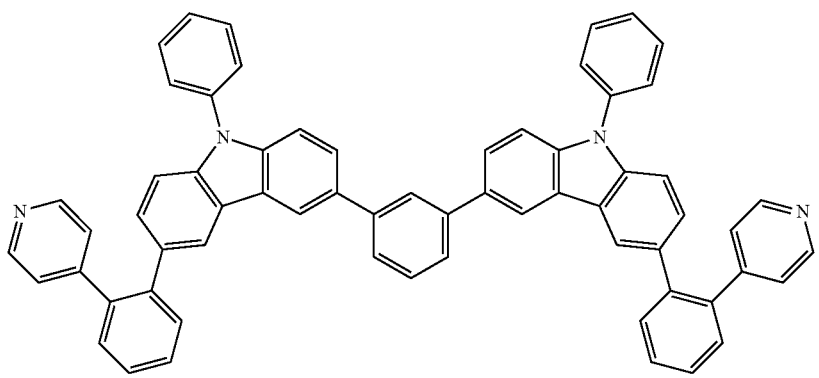
52
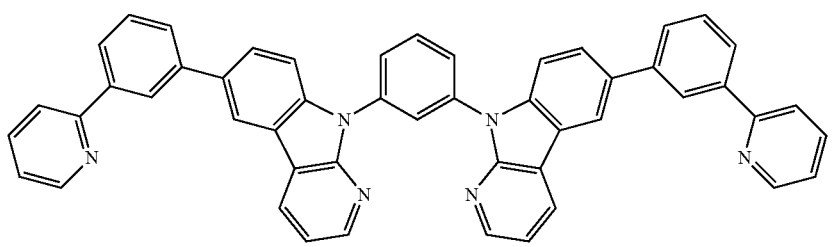
[Chem. 19]
53
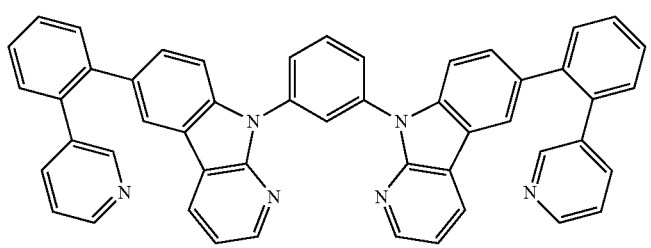
54
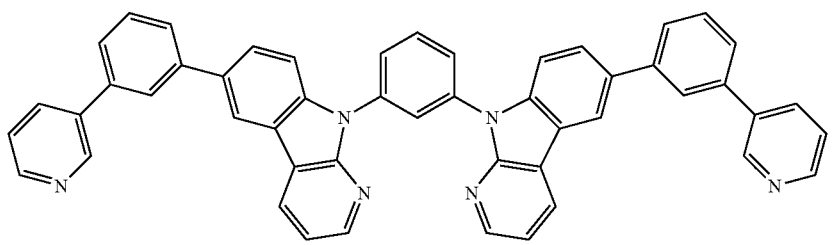
55
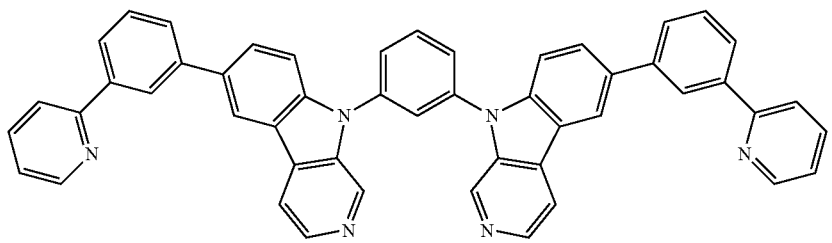

-continued
56
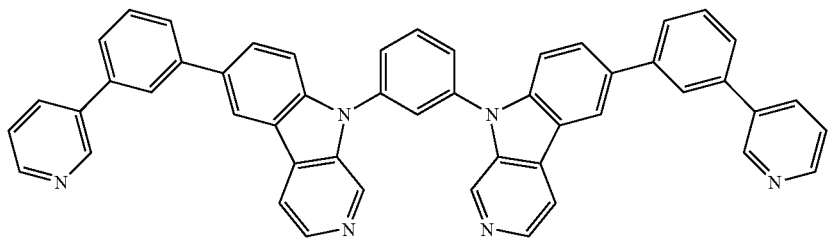
57
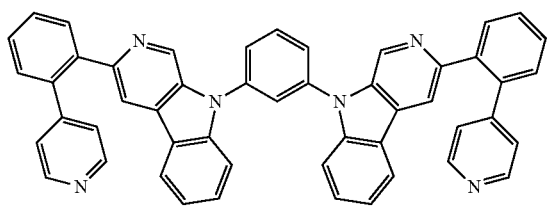
58
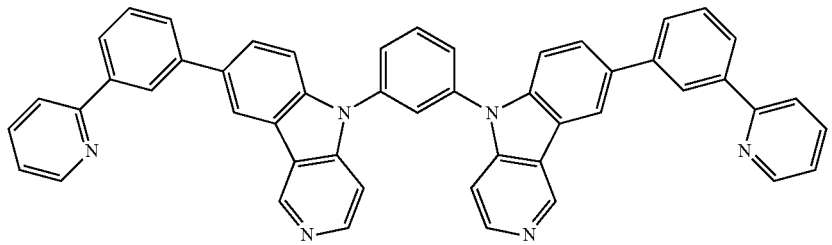
[Chem. 20]
59 60
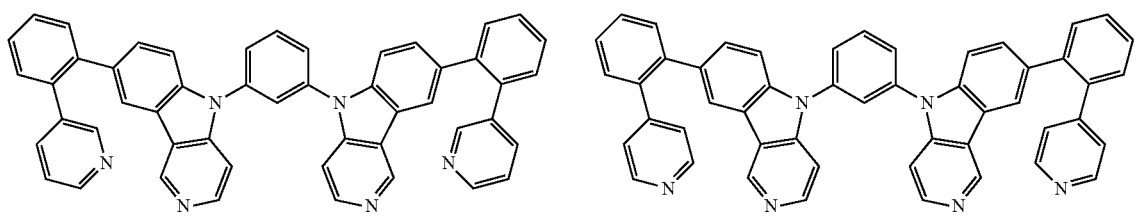
61
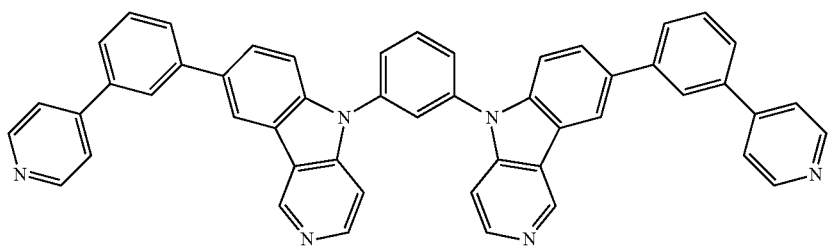
62
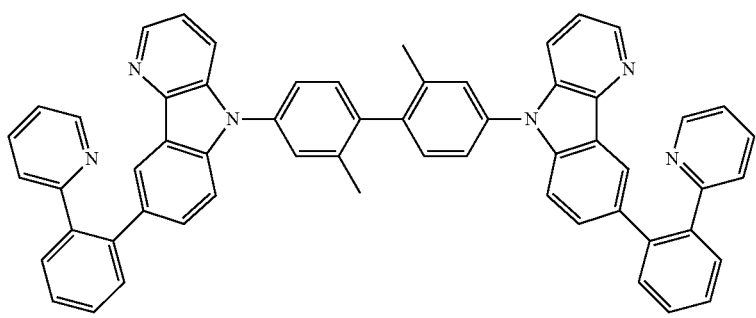

63
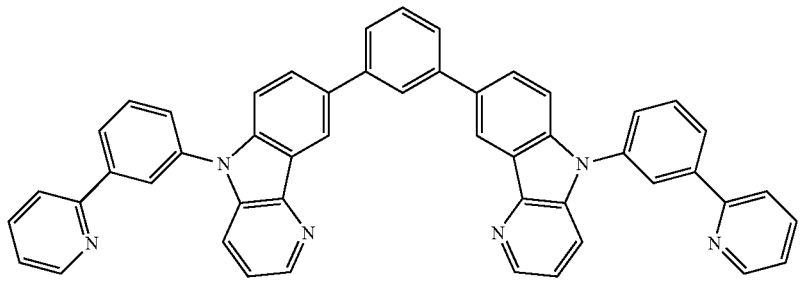
64
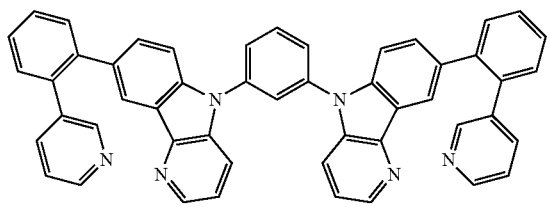
[Chem. 21]
65
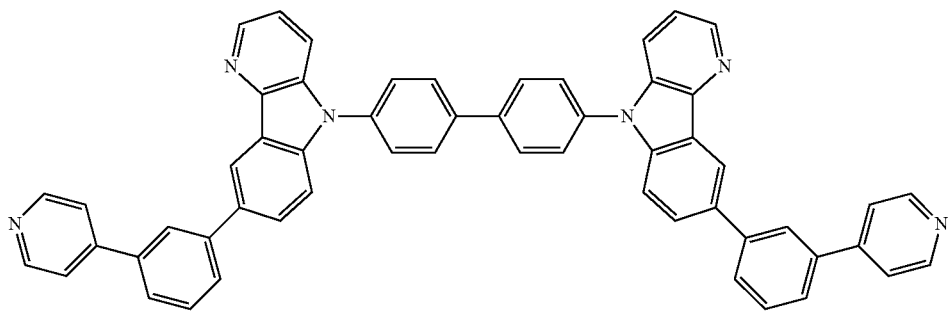
66
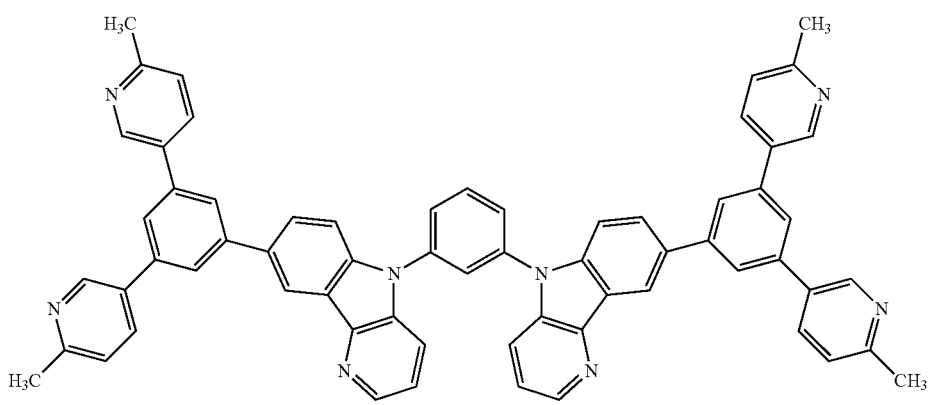

-continued
67
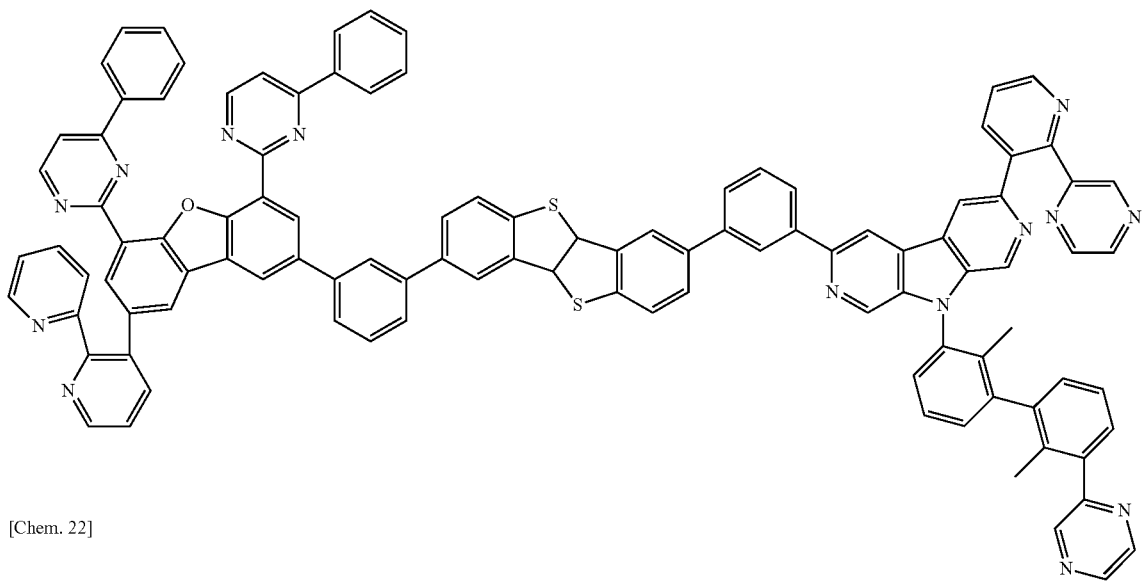
[Chem. 22]
68
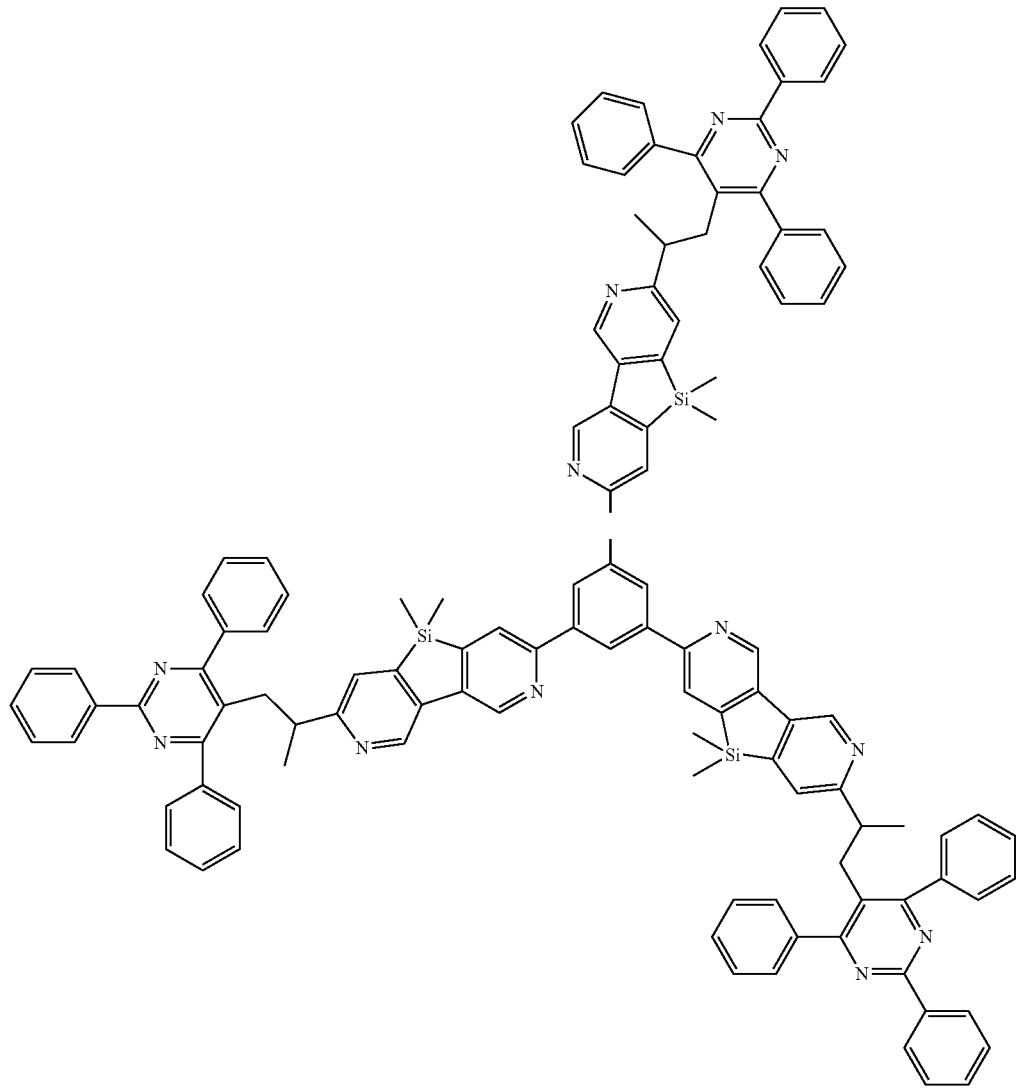

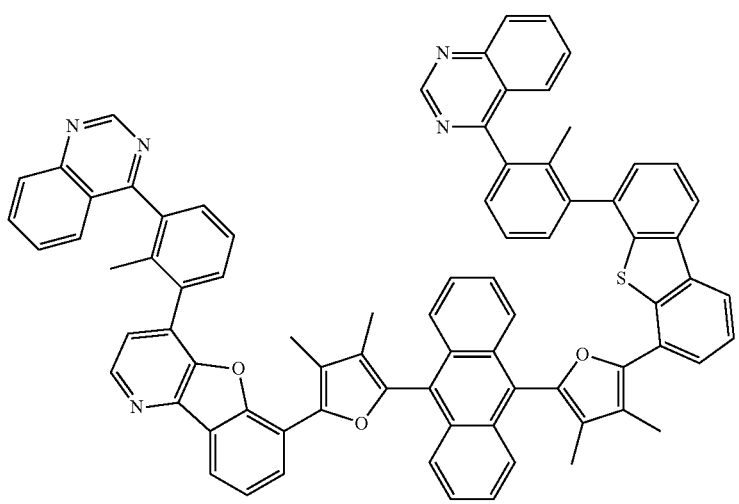
69
[Chem. 23]
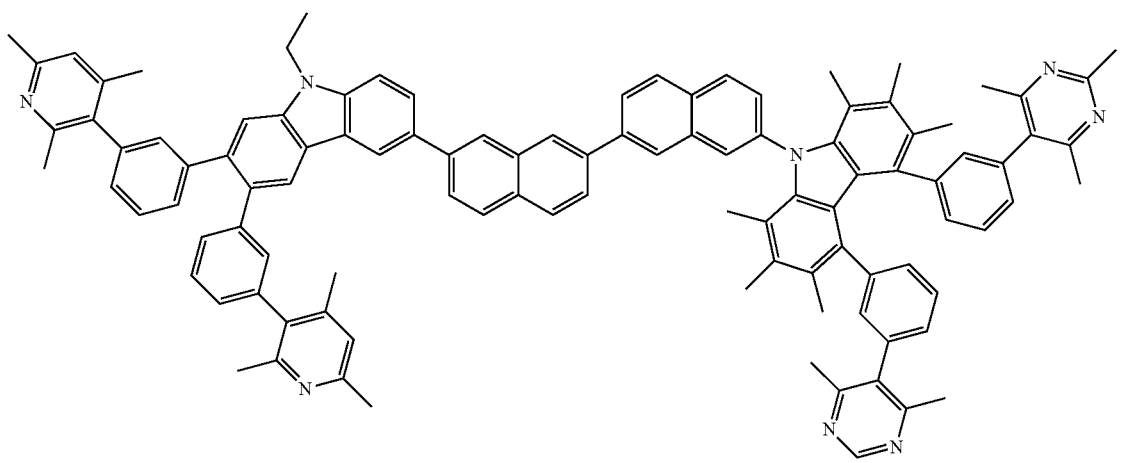
70
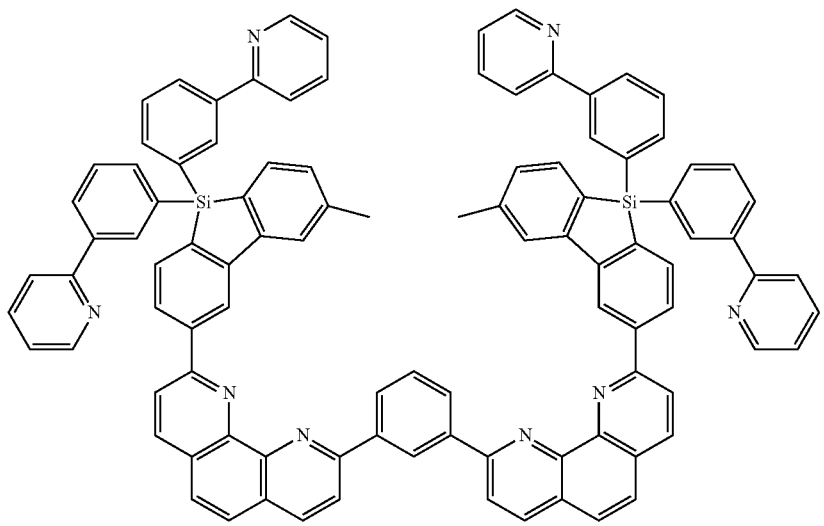
71

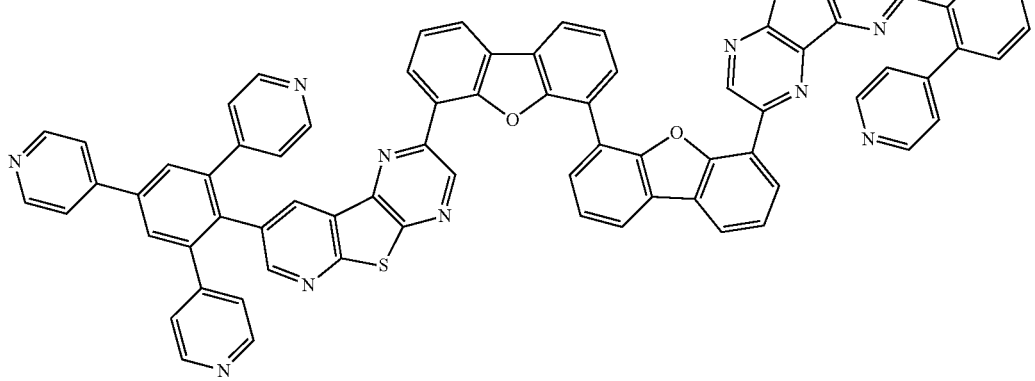
72
[Chem. 24]
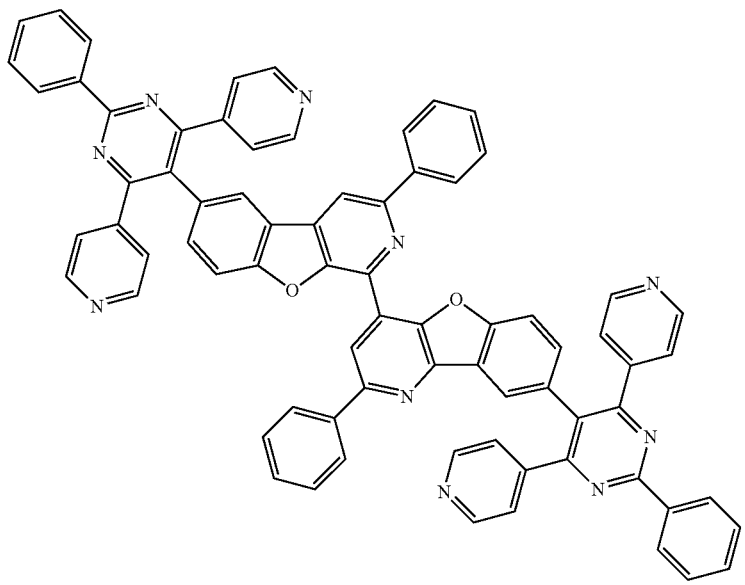
73
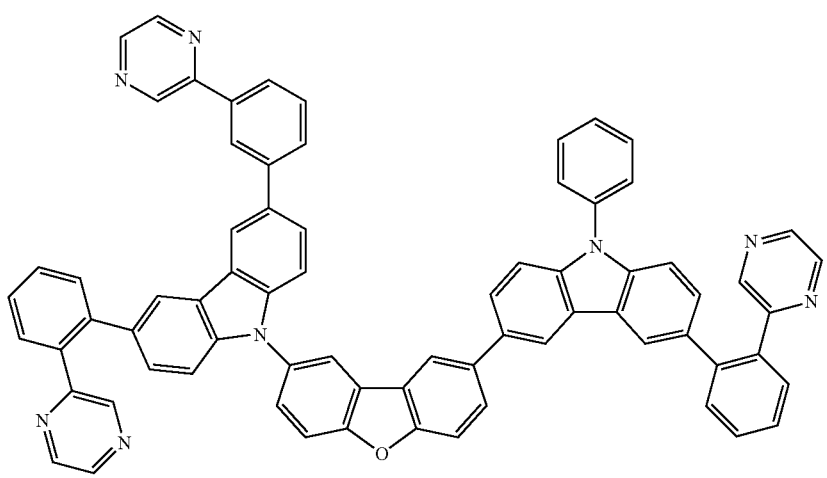
74

75
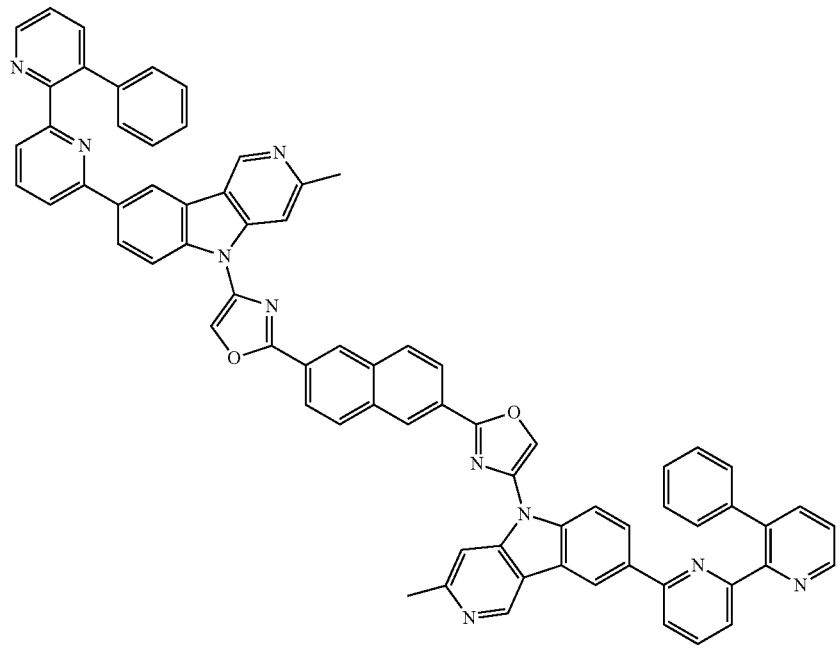
[Chem. 25]
76
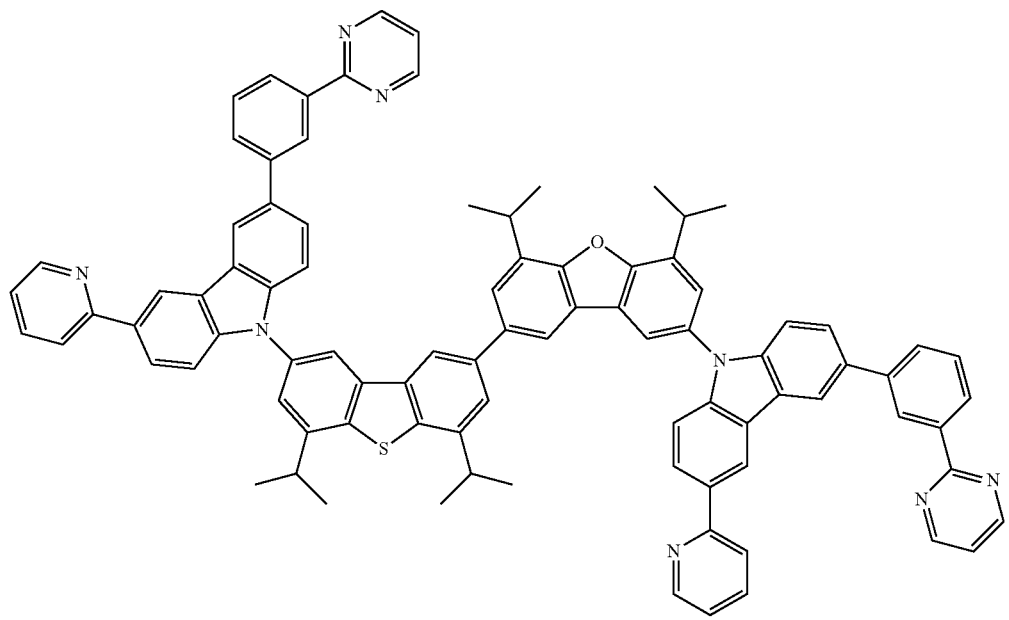

77
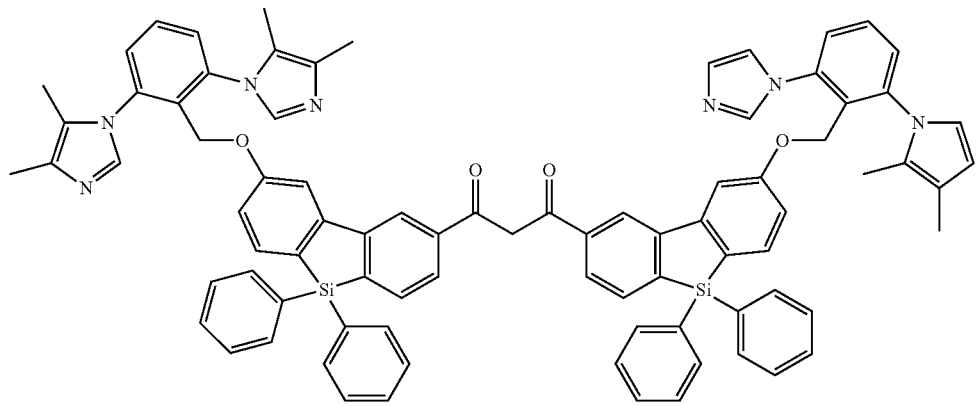
78
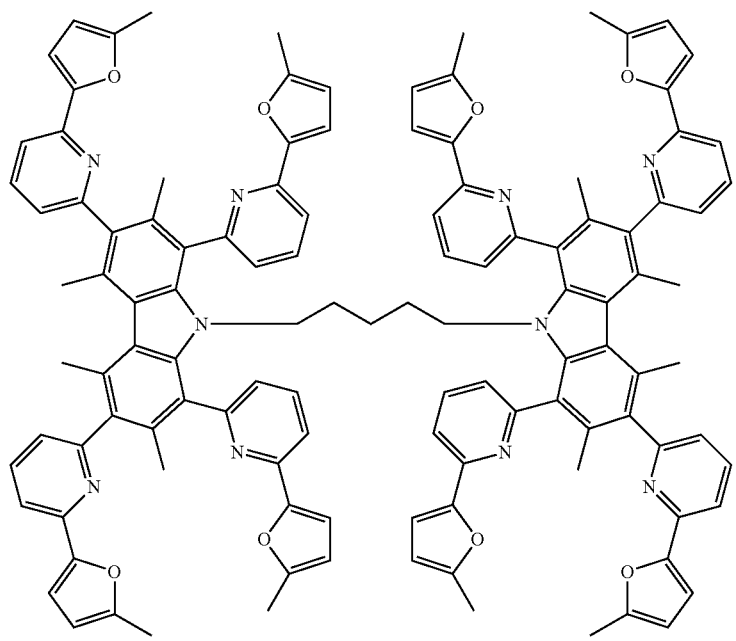
[Chem. 26]
79
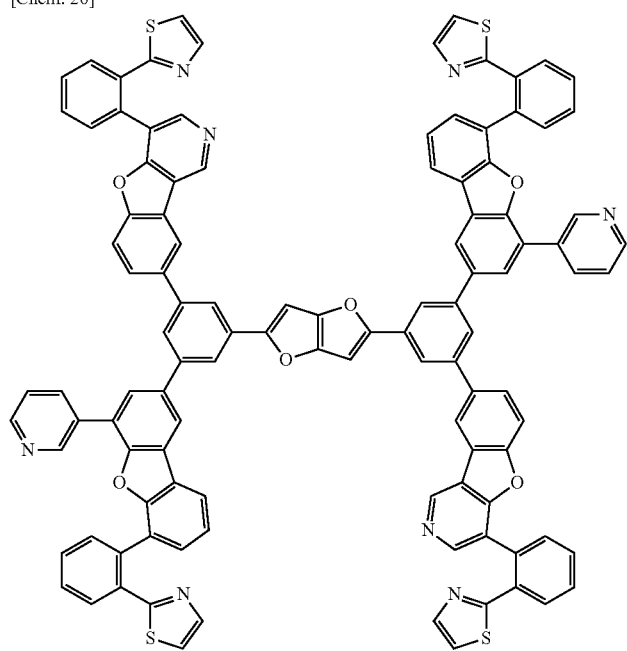

-continued
80
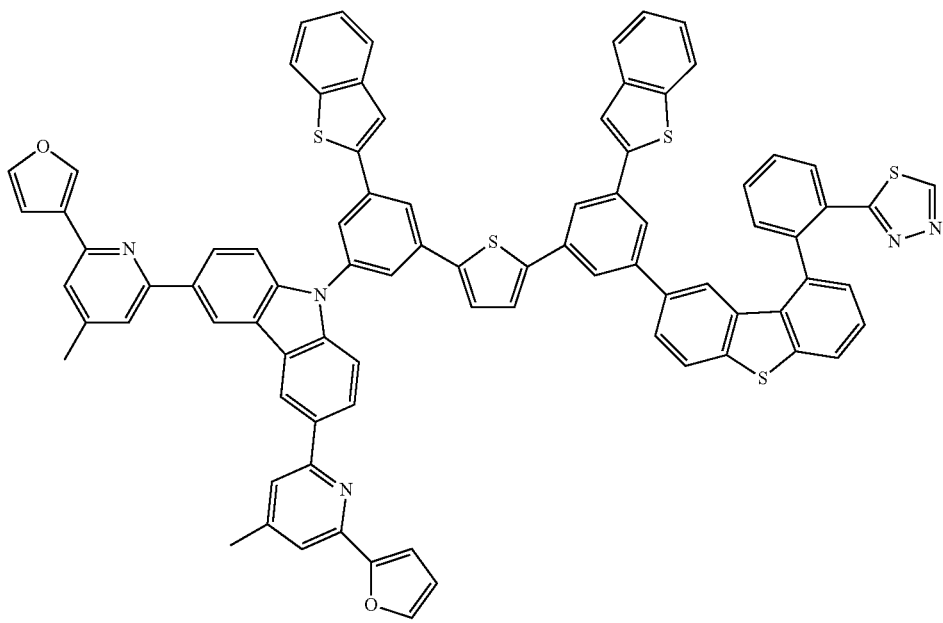
[Chem. 27]
81
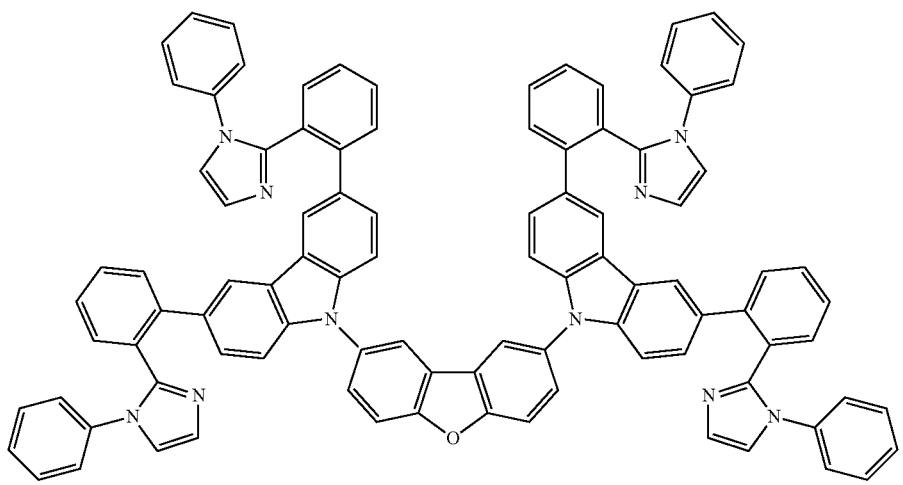
82
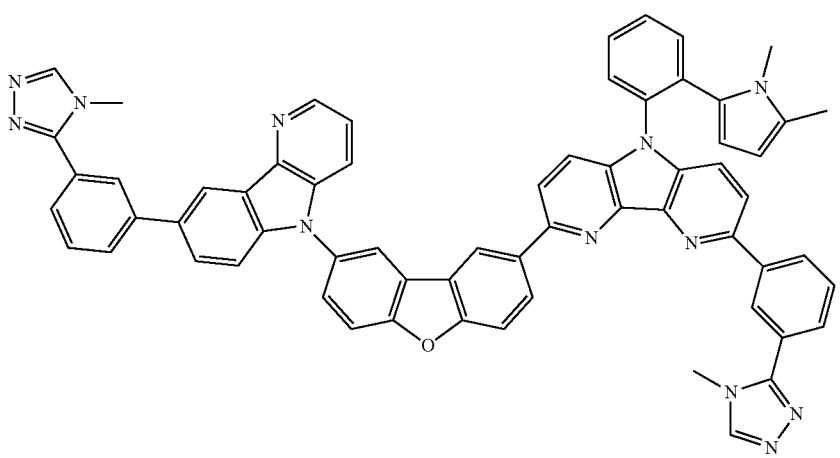

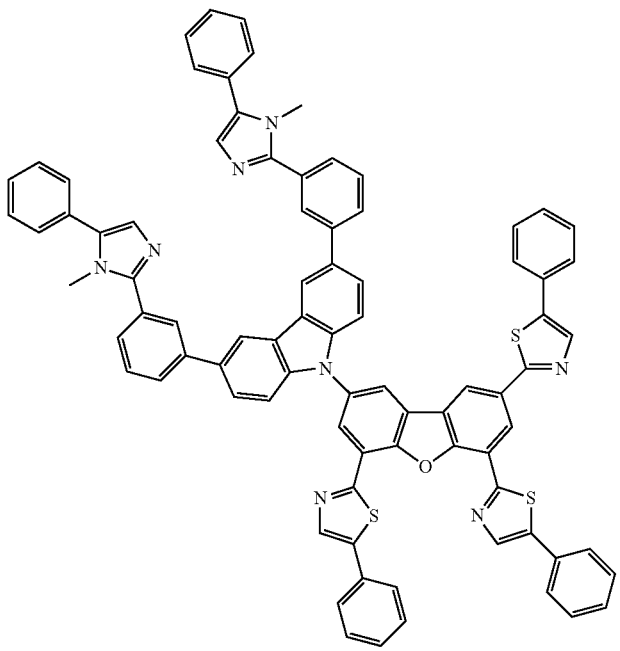
83
[Chem. 28]
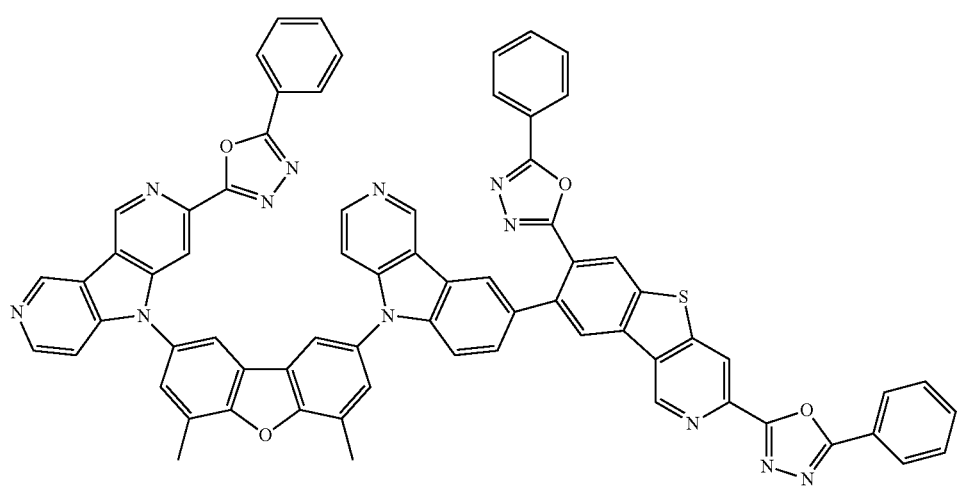
84

85
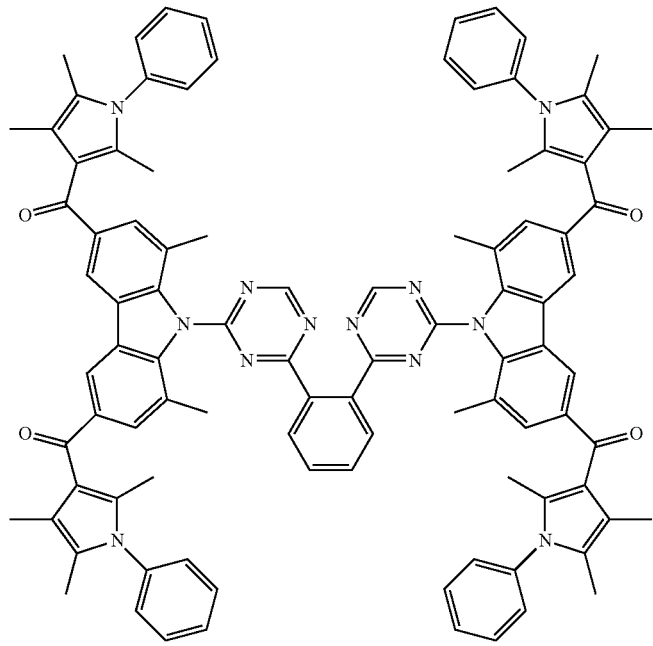
[Chem. 29]
86
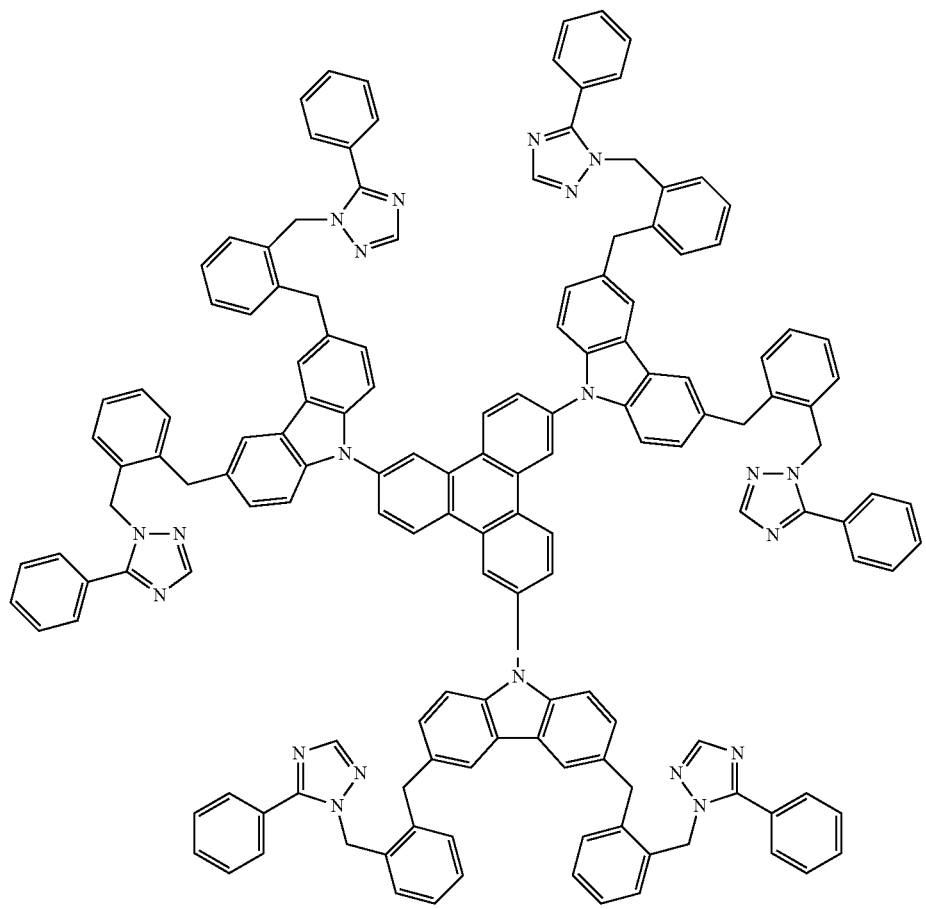

87
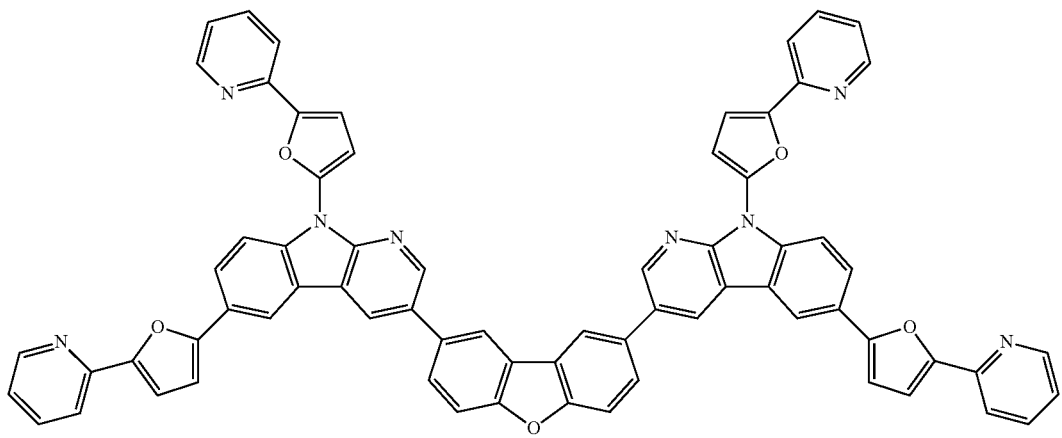
88
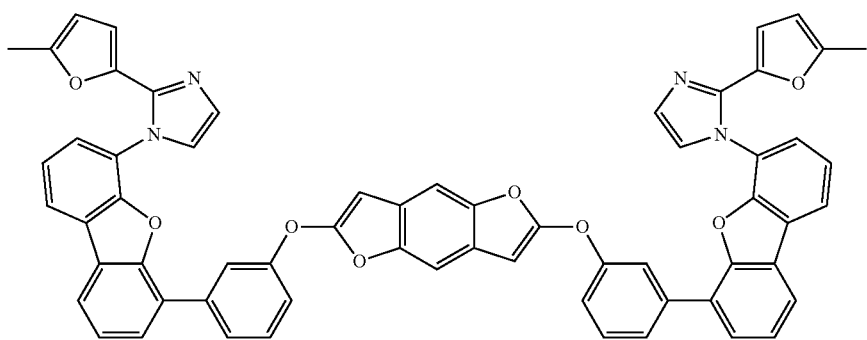
[Chem. 30]
89
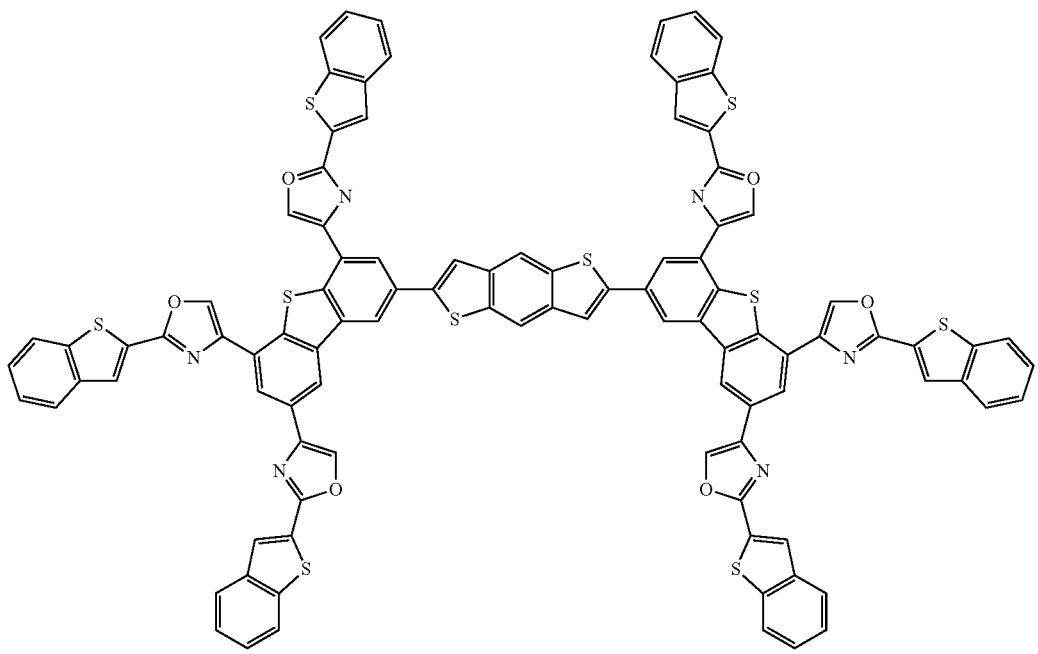

-continued
90
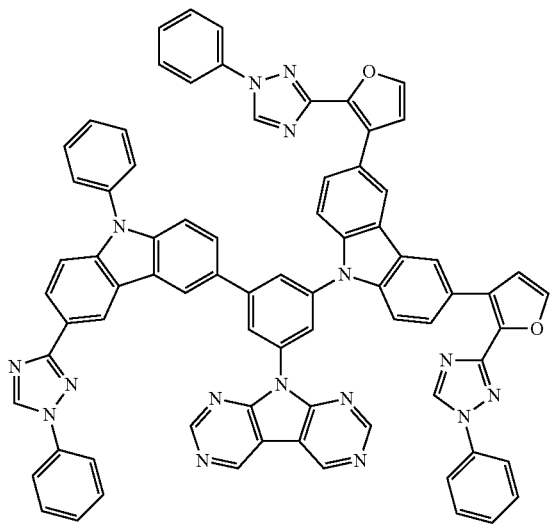
91
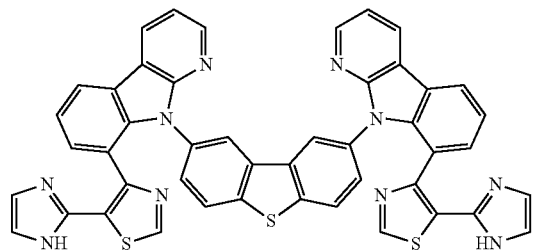
[Chem. 31]
92
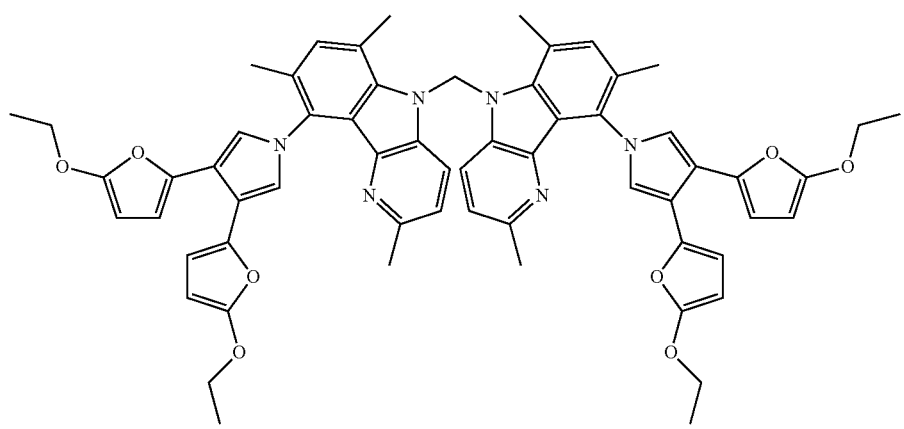
93
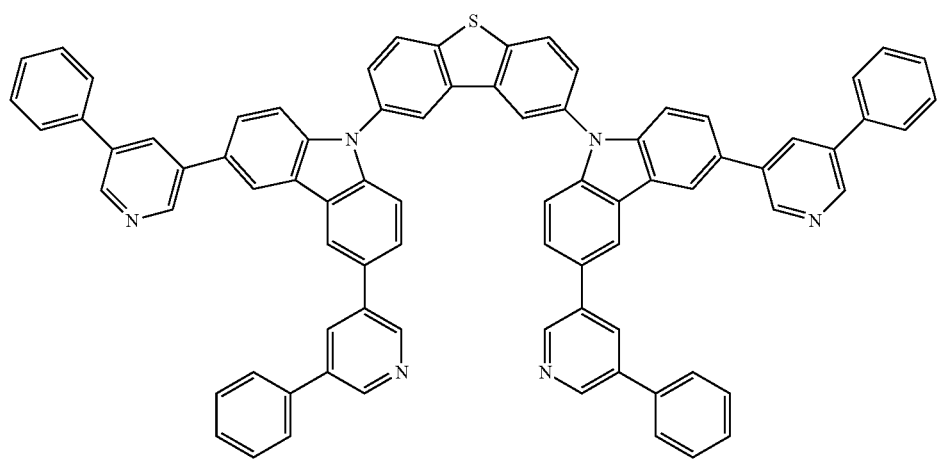

-continued
94
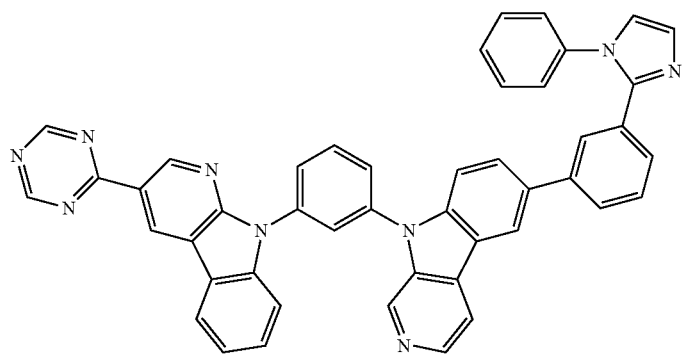
95
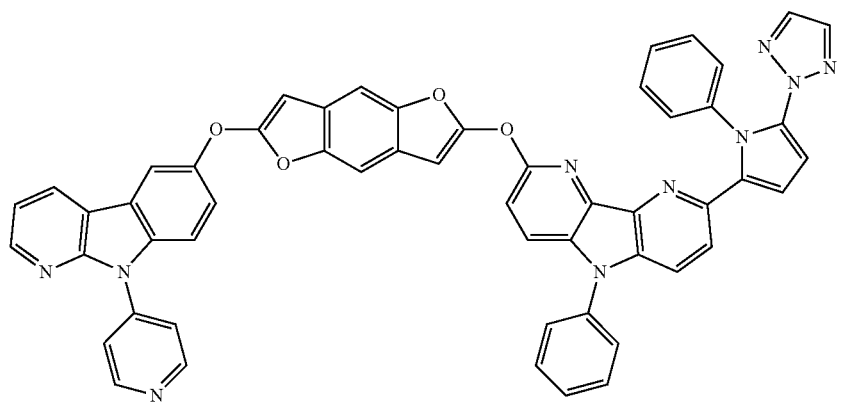
[Chem. 32]
96
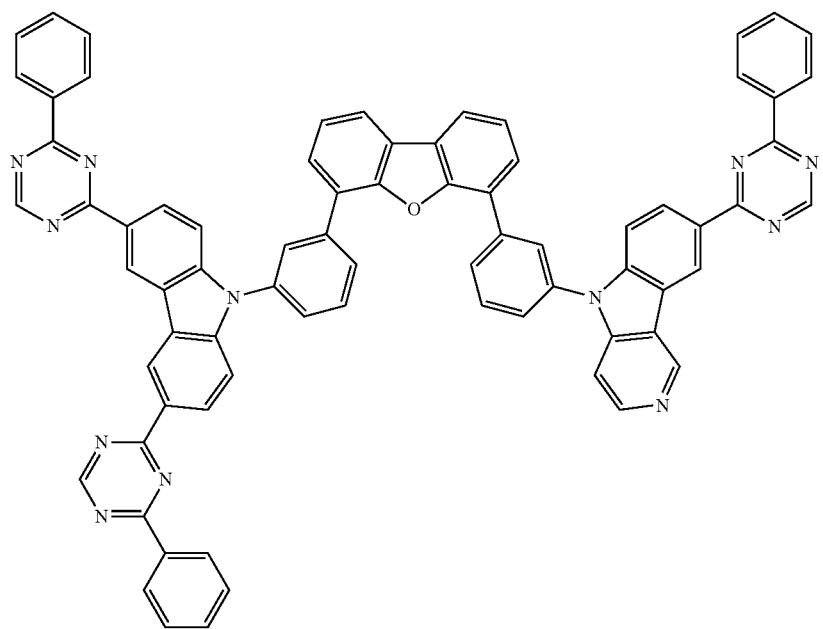

-continued
97
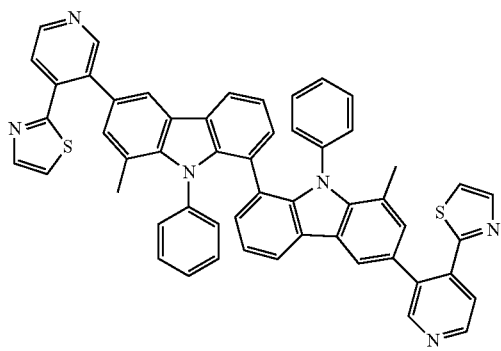
98
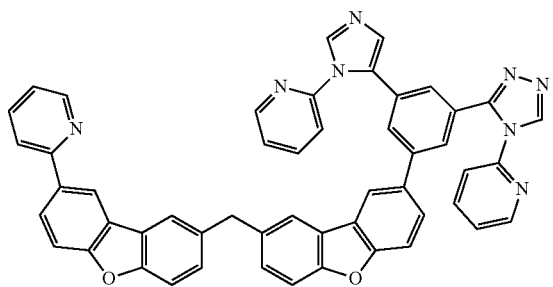
[Chem. 33]
99
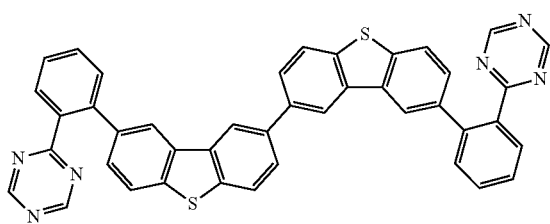
100
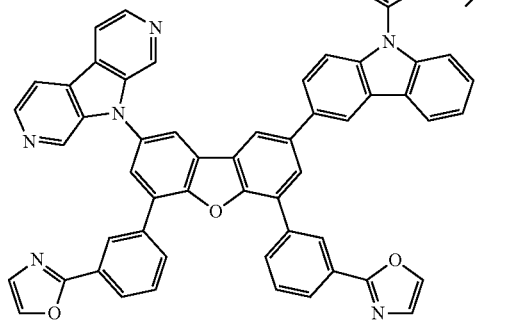
101
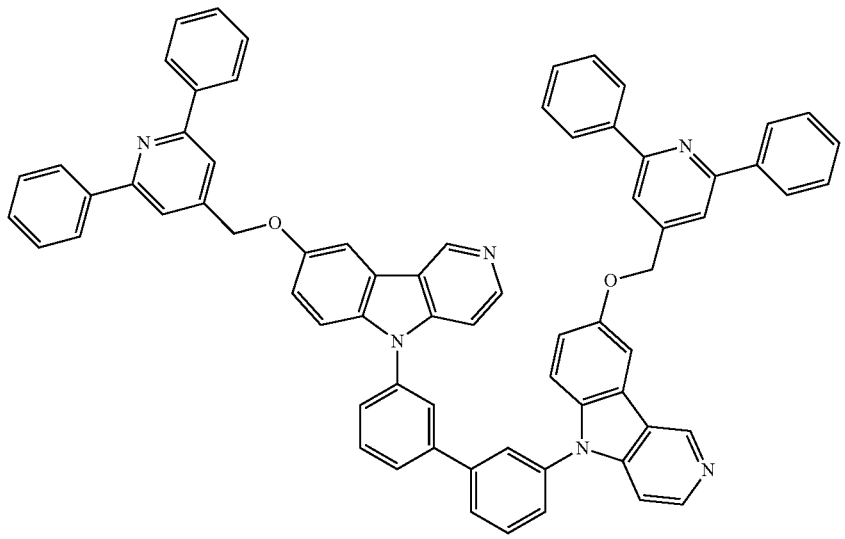

-continued
[Chem. 34]
102
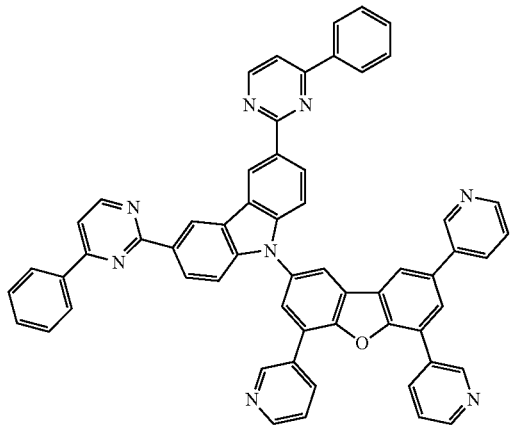
103
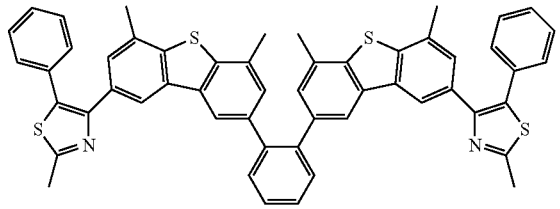
104
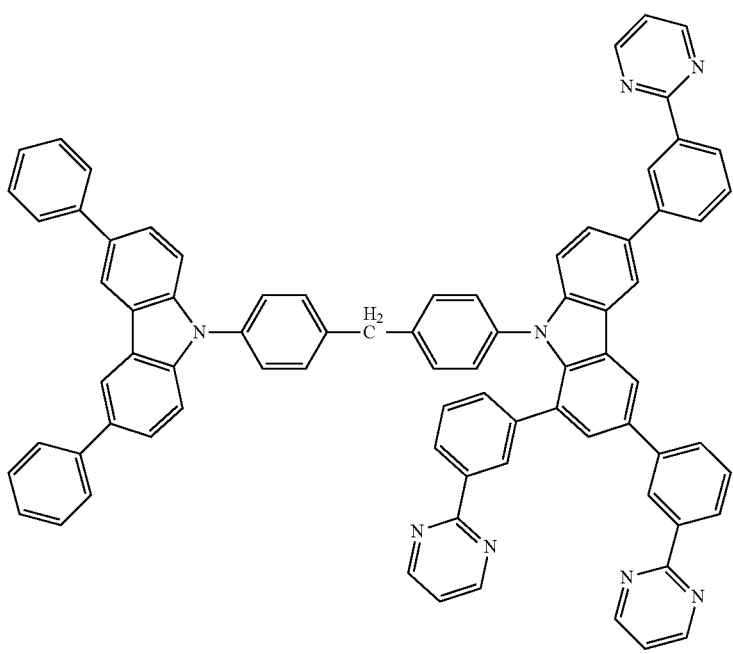
105
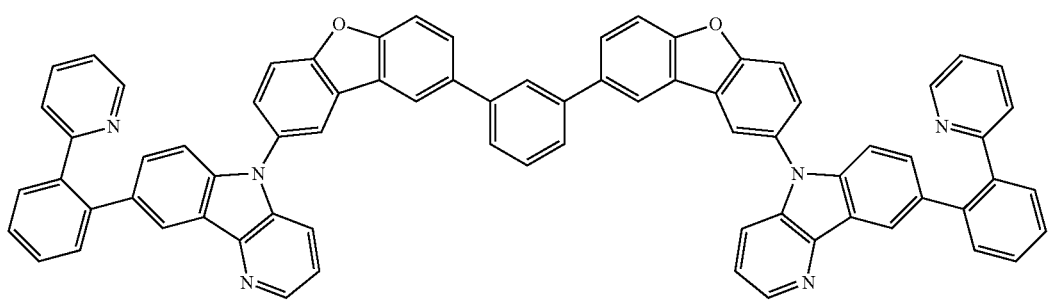

-continued
[Chem. 35]
106
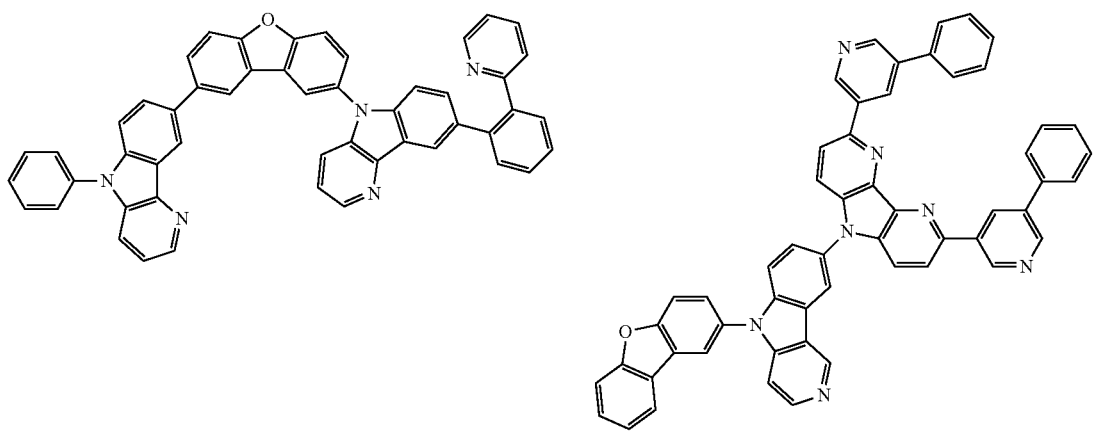
107
108
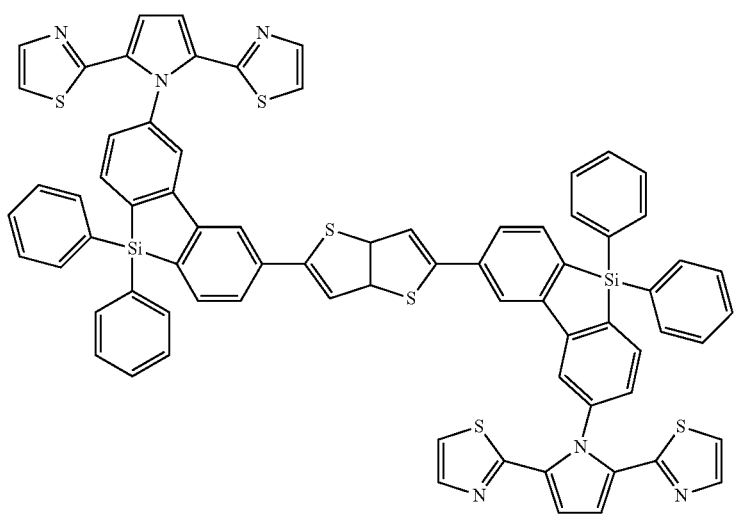
109
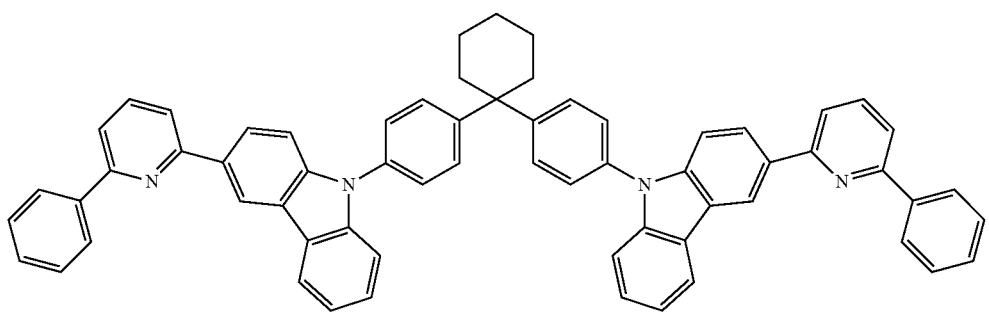

-continued
[Chem. 36]
110 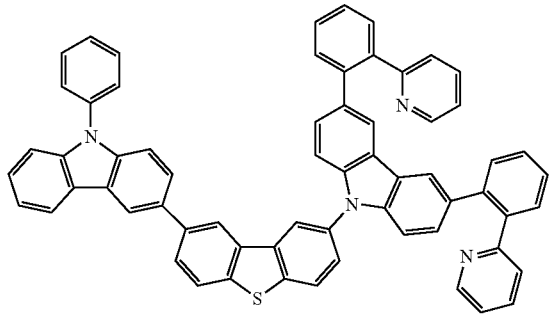
111 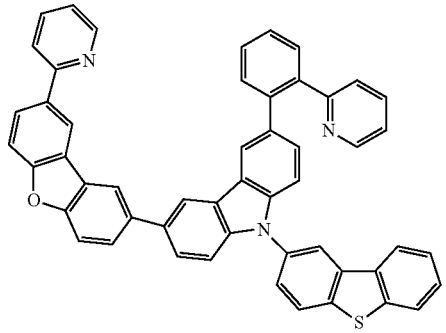
112 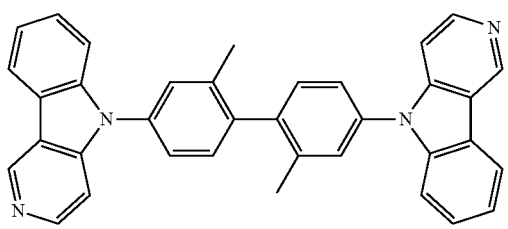
113 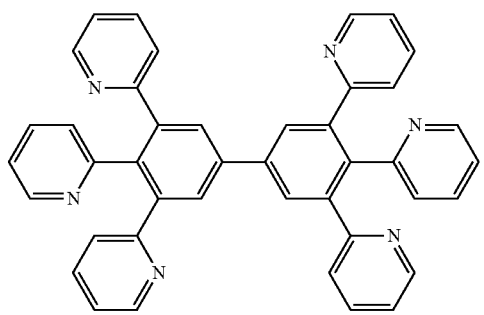
114 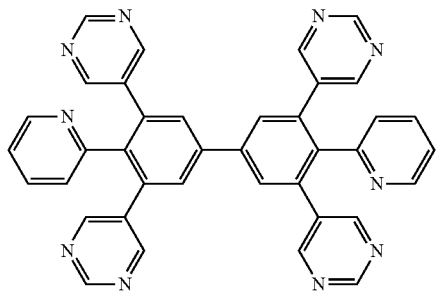
115 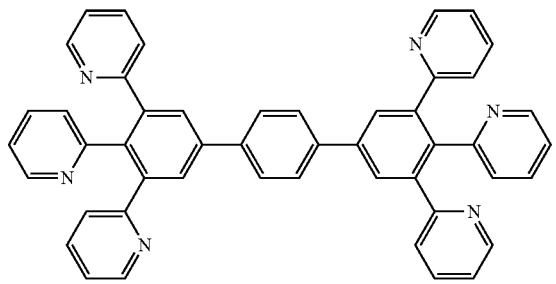
116 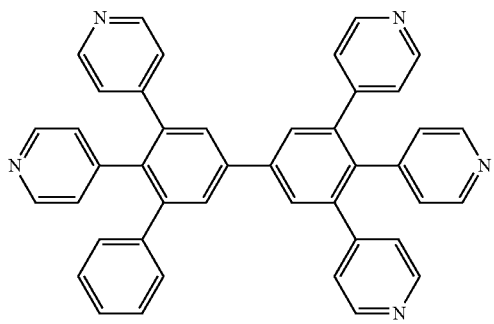
117 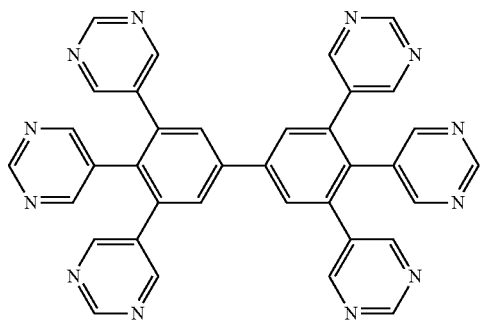
118 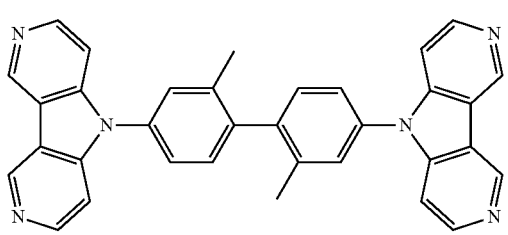

[Chem. 37]
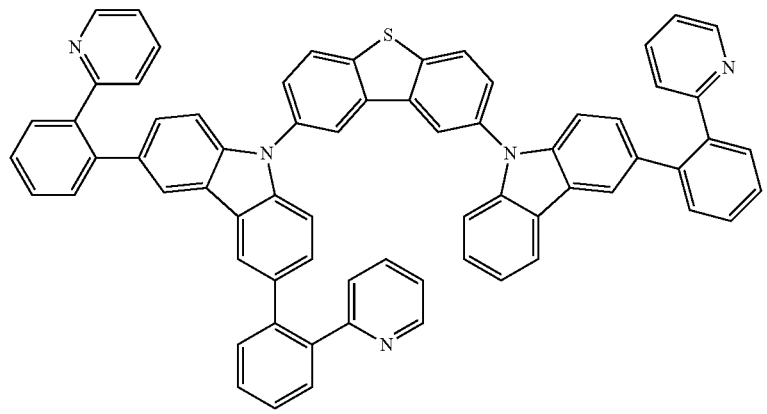
119
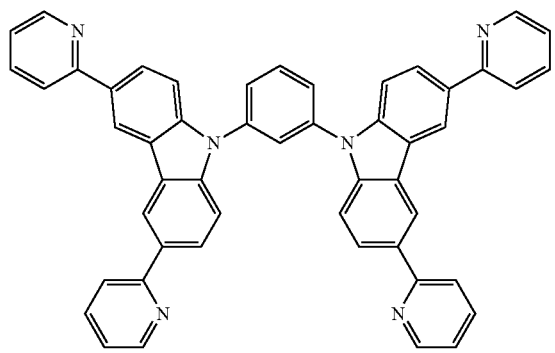
120
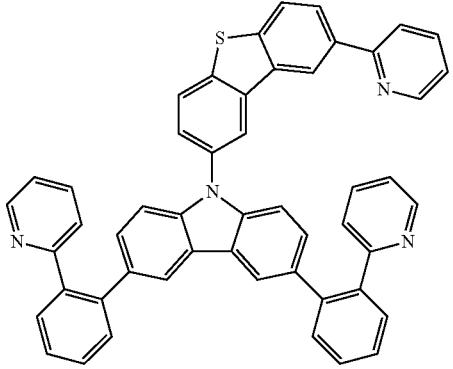
121
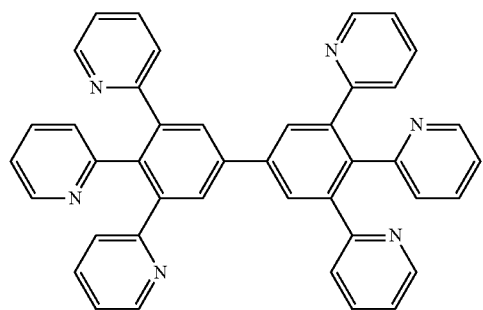
122
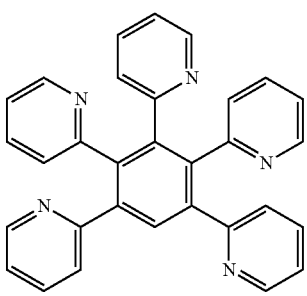
123

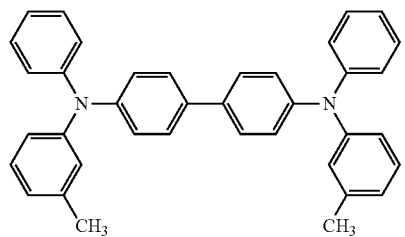
124
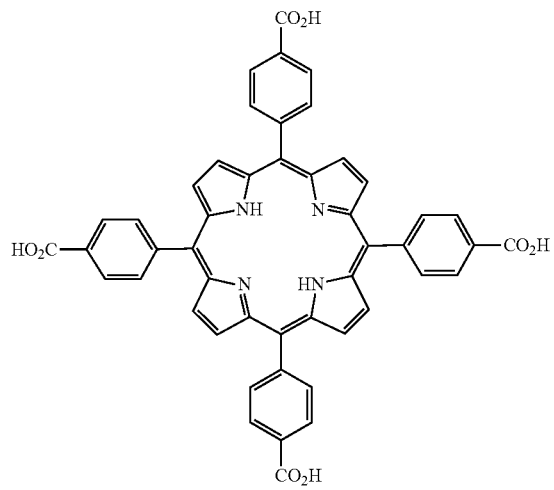
125
[Synthetic Example of Compounds]
Hereinafter, as a synthetic example of a typical compound, a specific synthetic example of Compound 5 will be described, but the present invention is not limited thereto.
[Chem. 38]
Synthesis of Compound 5
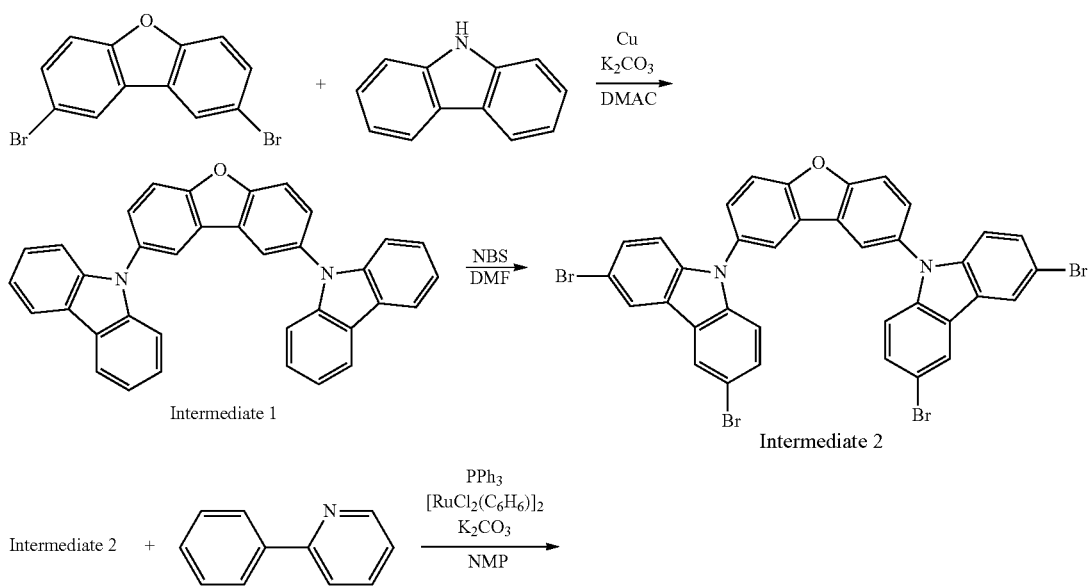

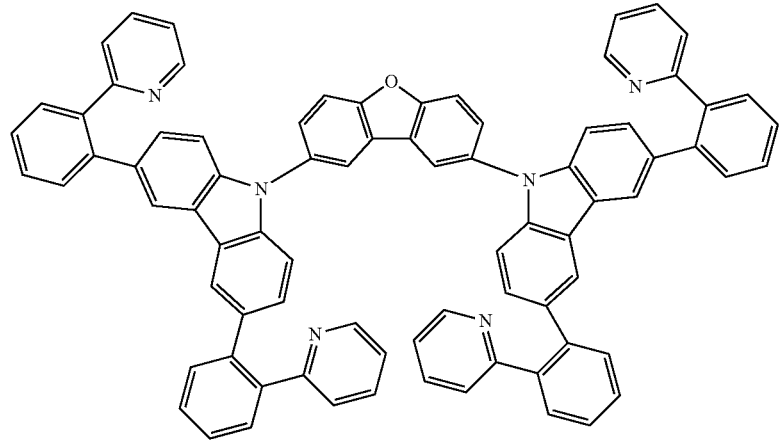

Compound 5

Process 1: (Synthesis of Intermediate 1)

Under nitrogen atmosphere, 2,8-dibromodibenzofuran (1.0 mole), of carbazole (2.0 moles), copper powder (3.0 moles), potassium carbonate (1.5 moles) were mixed in 300 ml of DMAc (dimethylacetamide) and then stirred for 24 hours at 130° C. After the reaction liquid thus obtained was cooled to room temperature, 1 L of toluene was added to the liquid, the resultant liquid was washed three times with distilled water, the solvent was distilled away from the washed layer under reduced pressure, and purification of the residue with silica gel flash chromatography (n-heptane:toluene=4:1 to 3:1) gave Intermediate 1 at a yield of 85%.

Process 2: (Synthesis of Intermediate 2)

At room temperature under atmospheric pressure, Intermediate 1 (0.5 mole) was dissolved into 100 ml of DMF (dimethylformamide), NBS (N-bromosuccinic acid imide) (2.0 moles) was added, and then stirred over one night at room temperature. The obtained precipitate was filtered and washed with methanol, and thus Intermediate 2 was obtained at a yield of 92%.

Process 3: (Synthesis of Compound 5)

Under nitrogen atmosphere, Intermediate 2 (0.25 mole), 2-phenylpyridine (1.0 mole), ruthenium complex [(η6-C6H6)RuCl2]2 (0.05 mole), triphenylphosphine (0.2 mole), potassium carbonate (12 moles) were mixed in 3 L of NMP (N-methyl-2-pyrrolidone), and then stirred over one night at 140° C.

After the reaction liquid was cooled to room temperature, 5 L of dichloromethane was added, and then the liquid was filtered. The solvent was distilled away from the filtrate under reduced pressure (800 Pa, 80° C.), and the residue was purified with silica gel flash chromatography (CH$_2$Cl$_2$:Et$_3$N=20:1 to 10:1).

After the solvent was distilled away under reduced pressure, the residue was again dissolved into dichloromethane and washed three times with water. After the substance obtained by the washing was dried with anhydrous magnesium sulfate, the solvent was distilled away under reduced pressure from the dried substance and thus Compound 5 was obtained at a yield of 68%.

<Substrate 11>

The substrate 11 on which the transparent electrode 1 as described above is formed can include, for example, glass, plastic and the like, but is not limited thereto. In addition, the substrate 11 may be transparent or may not be transparent.

When the transparent electrode 1 of the present invention is used as an electronic device that takes out light from the side of the substrate 11, the substrate 11 is preferably transparent. Preferably used transparent substrate 11 can include glass, quartz, a transparent resin film.

Examples of the glass include silica glass, soda lime silica glass, lead glass, borosilicate glass, non-alkali glass, and the like. From the viewpoints of adhesion to the nitrogen-containing layer 1a, durability, evenness, as necessary, the surface of these glass materials is subjected to physical treatment such as grinding, or a coating film formed of an inorganic material or an organic material, or a hybrid coating film obtained by combining these films is formed on the surface.

Examples of the resin film include polyesters such as polyethylene terephthalate (PET) and polyethylene naphthalate (PEN); polyethylene; polypropylene; cellulose esters or derivative thereof such as cellophane, cellulose diacetate, cellulose triacetate, cellulose acetate butylate, cellulose acetate propionate (CAP), cellulose acetate phthalate (TAC) and cellulose nitrate; polyvinylidene chloride; polyvinyl alcohol; polyethylene vinyl alcohol; syndiotactic polystyrene; polycarbonate; norbornen resin; polymethylpenten; polyether ketone; polyimide; polyether sulphone (PES); polyphenylene sulfide; polysulphones; polyether imide; polyether ketone imide; polyamide; fluoro resin; Nylon; polymethyl methacrylate; acryl or polyallylates; cycloolefins-based resins such as Alton (commercial name of JSR) or APEL (commercial name of Mitsui Chemicals).

A coating film formed of an inorganic material or an organic material, or a hybrid coating film obtained by combining those films may be formed on the surface of the resin film. Such a coating film and a hybrid coating film are each preferably a barrier film (also referred to as barrier membrane or the like) having a water vapor permeability (25±0.5° C., relative humidity 90±2% RH) measured in accordance with the method of JIS-K-7129-1992 of 0.01 g/(m$^2$·24 hr) or less. Furthermore, the coating films are each preferably a high barrier film having an oxygen permeability measured in accordance with the method of JIS-K-7126-1987 of $10^{-3}$ ml/(m$^2$·24 hrs·atm) or less and a water vapor permeability of $10^{-5}$ g/(m$^2$·24 hr) or less.

A material for forming the barrier film as described above may be a material having a function of suppressing penetration of water vapor, oxygen and the like which cause deterioration of the element, and for example, there can be used silicon oxide, silicon dioxide, silicon nitride and the like. Furthermore, in order to improve fragility of the barrier film, it is more preferable to have a laminated structure of the inorganic layer and a layer formed of organic materials (organic layer). The order of lamination of the inorganic layer and the organic layer is not particularly limited, and it is preferable to laminate alternately both of the layers a plurality of times.

The method for forming the barrier film is not particularly limited, and there can be used, for example, vacuum deposition method, spattering method, reactive spattering method, molecular beam epitaxial method, cluster ion beam method, ion platting method, plasma polymerization method, atmospheric pressure plasma polymerization method, plasma CVD method, laser CVD method, thermal CVD method, coating method, and the like. The atmospheric pressure plasma polymerization method described in Japanese Patent Application Laid-Open Publication No. 2004-68143 is particularly preferable.

In contrast, when the substrate 11 is opaque, there can be used, for example, a metal substrate such as an aluminum or stainless steel, an opaque resin substrate, a ceramic substrate and the like. These substrates may be in the form of films which can be flexibly bended.

Meanwhile, the transparent electrode 1 having the electrode layer 1b as described above may have a passivation film with which the top of the electrode layer 1b is covered, or the other electrical conductivity layer laminated on the top of the electrode layer 1b. In this case, the passivation film and the electrical conductivity layer preferably have the sufficient light transmittance to prevent the decline in the light transmittance of the electrode layer 1b. An as-needed layer may be also provided on the downside of the nitrogen-containing layer 1a, that is between the nitrogen-containing layer 1a and the substrate 11. Furthermore, the transparent electrode 1 described in the above embodiment is constituted to be a laminated structure comprising the nitrogen-containing layer 1a and the electrode layer 1b, while the transparent electrode 1 may be constituted to be a single layer structure comprising only the electrode layer 1b.

<Method for Manufacturing Transparent Electrode 1>

Next, a method for manufacturing the transparent electrode 1 will be further described using FIG. 2.

Figure 2A:
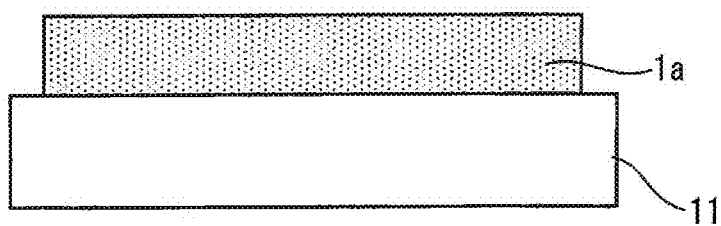
FIGS. 2A and 2B are cross-sectional views individually processed at steps, showing a method for manufacturing the transparent electrode of the present invention.

First, the nitrogen-containing layer 1a is formed on the substrate 11 at a deposition speed of 0.3 nm/s or greater, as shown in FIG. 2A. More preferably, the nitrogen-containing layer 1a is formed at a deposition speed of 0.5 nm/s or greater. Methods for forming the nitrogen-containing layer 1a include a method using a wet process such as an application method, an ink jet printing method, a coating method, or a dip coating method; and a method using a dry process such as a vapor-deposition method (resistance heating, EB method and the like.) or a CVD method. Among them, the vapor-deposition method is more preferably applied from the viewpoints of obtaining a homogeneous membrane easily, of not generating a pinhole easily and the like.

Figure 2B:
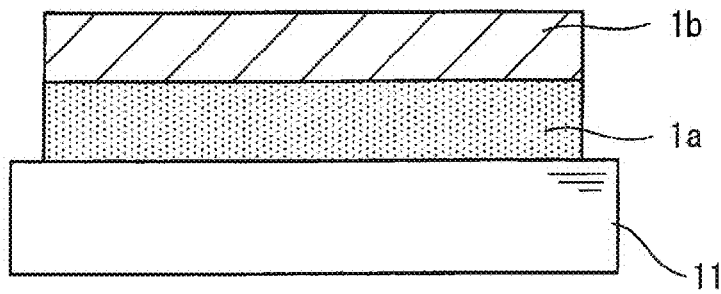

Then, as shown in FIG. 2B, there is formed the electrode layer 1b constituted using silver or an alloy having silver as the main component, adjacent to the nitrogen-containing layer 1a. Methods for forming the electrode layer 1b include a method using a wet process such as an application method, an ink jet printing method, a coating method, or a dip coating method; and a method using a dry process such as a vapor-deposition method (resistance heating, EB method and the like), a sputtering method or a CVD method. Among them, the vapor-deposition method is more preferably applied from the viewpoints of obtaining a homogeneous membrane easily, of not generating a pinhole easily and the like.

Meanwhile, the electrode layer 1b may be also formed adjacent to the nitrogen-containing layer 1a within two minutes after the formation of the nitrogen-containing layer 1a. More preferably, the electrode layer 1b is formed adjacent to the nitrogen-containing layer 1a within one minute after the formation of the nitrogen-containing layer 1a.

Furthermore, in the formation of the electrode layer 1b, the formation is preferably carried out at a deposition speed of 0.3 nm/s or greater. The electrode layer 1b with more superior property of continuity can be formed by formation of the electrode layer 1b at a prescribed deposition speed adjacent to the nitrogen-containing layer 1a formed at a prescribed deposition speed.

From the above, the desired transparent electrode 1 can be obtained on the substrate 11.

<Effects of Transparent Electrode 1>

The transparent electrode 1 constituted as described above has a configuration in which an electrode layer 1b formed of silver or an alloy having silver as the main component is provided adjacent to the nitrogen-containing layer 1a constituted using a compound containing nitrogen atoms. According to the configuration, in the formation of the electrode layer 1b in the upper portion of the nitrogen-containing layer 1a, silver atoms constituting the electrode layer 1b interact with the compound containing nitrogen atoms constituting the nitrogen-containing layer 1a to thereby reduce a diffusion length of the silver atoms on the surface of the nitrogen-containing layer 1a, which causes the suppression of agglomeration of silver. As a result, generally, a silver thin film that is easily isolated in the form of island due to film growth through Volumer-Weber (VW) type (nucleas growth type) is formed due to film growth through Frank-van der Merwe (FM) type (mono-layer growth type). Therefore, an electrode layer having a uniform thickness can be obtained even though the layer is thin. Accordingly, an electrode layer 1b having a uniform thickness can be obtained even though the layer is thin.

It was also confirmed herein that the electrode layer 1b with more superior property of continuity could be obtained, as illustrated in Examples below in more detail, when the electrode layer 1b was provided adjacent to the nitrogen-containing layer 1a within two minutes after the formation of the nitrogen-containing layer 1a, and more preferably within one minute after the formation of the nitrogen-containing layer 1a.

Furthermore, the nitrogen-containing layer 1a is a layer formed at a deposition speed of 0.3 nm/s or greater. More preferably, the nitrogen-containing layer 1a is formed at a deposition speed of 0.5 nm/s or greater. As illustrated in Example below in more detail, it has been confirmed that the faster a deposition speed of the nitrogen-containing layer 1a is, the more superior the property of continuity of the electrode layer 1b provided adjacent to the nitrogen-containing layer 1a is. The following assumption is considered as the reason for this: it has been assumed that, as the nitrogen-containing layer 1a is formed at the faster deposition speed, the surface of the nitrogen-containing layer 1a is put into a more defective and more unstable state, and thus this increases a possibility that the silver atoms constituting the electrode layer 1b interacts with the compound containing nitrogen atoms constituting the nitrogen-containing layer 1a.

Moreover, the electrode layer 1b has a 12 nm or lower film thickness and has a measurable sheet resistance. This results in the electrode layer having suppressed light absorbing or reflecting component while ensuring practicability as the electrode film. Furthermore, the electrode layer 1b having such a thin thickness is provided adjacent to the nitrogen-containing layer 1a as described above, to thereby have a uniform film thickness and a superior continuity. Thus, while the electrode layer 1b is constituted to be an ultra-thin membrane having a thickness of 12 nm or lower, it ensure a conductive property capable of measuring the sheet resistance, as described above. This was identified herein by forming the electrode layer 1b capable of measuring the sheet resistance, even though an ultra-thin membrane, when the nitrogen-containing layer 1a was provided at a deposition speed of at least 0.3 nm/s, and the electrode layer 1b was provided adjacent thereto, as described in Examples below in more detail. It was also confirmed that the electrode layer 1b had the even film thickness and the superior continuity to be an ultra-thin film thickness capable of measuring the sheet resistance, even when the electrode layer 1b was provided adjacent to the nitrogen-containing layer 1a within two minutes after the formation of the nitrogen-containing layer 1a, as described above.

Therefore, the transparent electrode 1 comprising such electrode layer 1b can be provided with both of the improved conductivity and the improved light transmittance because the electrode layer 1b substantially functions as an electrode to ensure the superior electrical conductivity due to its more superior continuity with ensuring high light transmittance due to its lower thickness.

Such transparent electrode 1 is not only low in cost due to the absence of rare metal indium (In), but has advantages in long-term reliability due to the absence of the chemically-unstable material, such as ZnO.

<<2. Use of Transparent Electrode>>

The transparent electrode 1 having the aforementioned configurations can be used for various electronic devices. Examples of the electronic device include an organic electroluminescent element, an LED (light emitting Diode), a liquid crystal element, a solar cell, a touch panel, and the like. The aforementioned transparent electrode 1 can be used as an electrode member that requires light transmission property, in the electronic device.

Hereinafter, as one intended use, there will be explained embodiments of the organic electroluminescent element in which the electrodes are used as an anode and a cathode.

<<3. First Embodiment of Organic Electroluminescent Element>>

<Configuration of Organic Electroluminescent Element EL-1>

Figure 3:
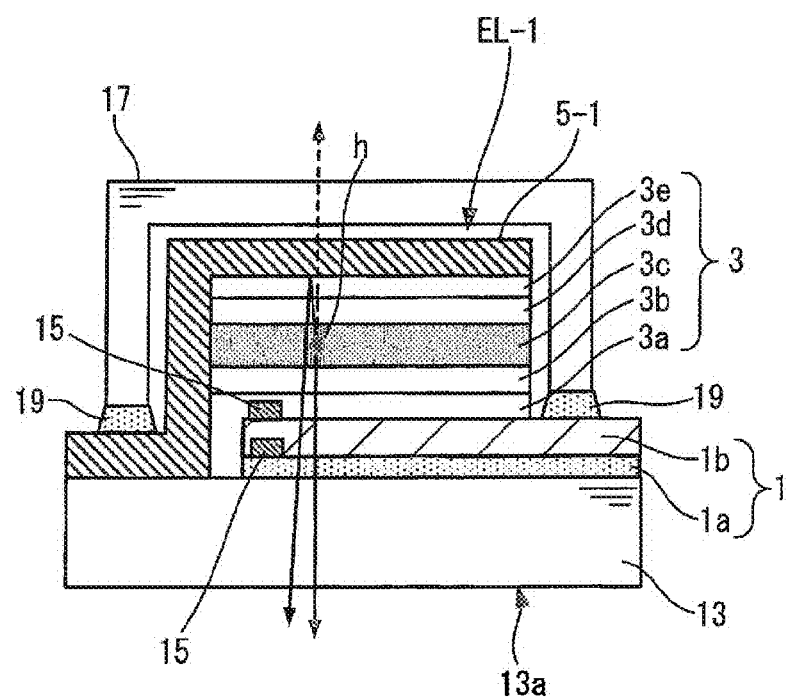
FIG. 3 is a cross-sectional configuration view illustrating a first example of the organic electroluminescent element constituted by using the transparent electrode of the present invention.

FIG. 3 is a cross-sectional configuration view illustrating the first embodiment of the organic electroluminescent element using the transparent electrode 1 described above, as one example of the electronic device according to the present invention. Hereinafter, the configuration of the organic electroluminescent element will be explained on the basis of the FIG. 3.

The organic electroluminescent element EL-1 illustrated in FIG. 3 is provided on the transparent substrate 13, and from the transparent substrate 13 side, the transparent electrode 1, the light emitting functional layer 3 constituted using an organic material or the like, and the counter electrode 5-1 are laminated in this order. In the organic electroluminescent element EL-1, the feature thereof is the use of the transparent electrode 1 of the present invention explained above as the transparent electrode 1. Accordingly the organic electroluminescent element EL-1 is constituted so that a generated light (hereinafter, referred to as emitted light h) is extracted at least from the transparent substrate 13 side.

Furthermore, the layer configuration of the organic electroluminescent element EL-1 is not limited and may be a general layer configuration. Here, it is constituted such that the transparent electrode 1 serves as the anode (i.e., positive terminal) and the counter electrode 5-1 serves as the cathode (i.e., negative terminal). In the case, for example, the light emitting functional layer 3 has an exemplified configuration in which [positive hole injection layer 3a/positive hole transport layer 3b/light emitting layer 3c/electron transport layer 3d/electron injection layer 3e] are laminated in this order from the transparent electrode 1 side being the anode. Among them, it is essential to have a light emitting layer 3c constituted using at least organic material. The positive hole injection layer 3a and the positive hole transport layer 3b may be provided as a positive hole transport/injection layer having positive hole transport property and positive hole injection property. The electron transport layer 3d and the electron injection layer 3e may be provided as an electron-transport/injection layer. In addition, among the light emitting functional layers 3, for example, the electron injection layer 3e may be constituted by an inorganic material.

In addition, in the light emitting functional layer 3, a positive hole blocking layer, an electron blocking layer and the like also other than these layers may be laminated on a required portion, as necessary. Furthermore, the light emitting layer 3c may have light emitting layers of each color corresponding to the respective range of wavelength, and may have a configuration obtained by laminating the light emitting layers via an intermediate layer having non-light emitting property. The intermediate layer may function as the positive hole blocking layer and the electron blocking layer. Moreover, the counter electrode 5-1 being a cathode may also have a laminated structure as necessary. In these configurations, only the portion in which the light emitting functional layer is sandwiched between the transparent electrode 1 and the counter electrode 5-1 serves as the light emitting region in the organic electroluminescent element EL-1.

Furthermore, in the above layer configuration, in order to reduce electric resistance of the transparent electrode 1, an auxiliary electrode 15 may be provided in contact with the electrode layer 1b of the transparent electrode 1.

The organic electroluminescent element EL-1 having the above configuration is sealed by a transparent sealing material 17 described below on the transparent substrate 13 in order to prevent the degradation of the light emitting functional layer 3 constituted using organic materials. The transparent sealing material 17 is fixed on the transparent substrate 13 side via an adhesive 19. However, terminal portions of the transparent electrode 1 and the counter electrode 5-1 are set to be provided in a state in which they are exposed from the sealing material 17 while maintaining electric insulation with each other by the light emitting functional layer 3 on the transparent substrate 13.

Hereinafter, the details of the main layers for constituting the above organic electroluminescent element EL-1 will be explained in order of the transparent substrate 13, the transparent electrode 1, the counter electrode 5-1, the light emitting layer 3c of the light emitting functional layer 3, other layers of the light emitting functional layer 3, the auxiliary electrode 15, and the sealing material 17. After that, production method of the organic electroluminescent element EL-1 will be explained.

[Transparent Electrode 13]

The transparent substrate 13 is a substrate 11 to be provided with the transparent electrode 1 of the present invention described above, and a transparent substrate 11 having high light transmission property among the aforementioned substrates 11 is used.

[Transparent Electrode 1 (Anode)]

The transparent electrode 1 is the aforementioned transparent electrode 1 of the present invention, and has a configuration in which the nitrogen-containing layer 1a and the electrode layer 1b are formed in order from the transparent substrate 13 side. Specifically, the transparent electrode 1 herein functions as the anode, i.e. the electrode layer 1b substantially serves as the anode.

[Counter Electrode 5-1 (Cathode)

The counter electrode 5-1 is an electrode membrane having a function as a cathode for supplying an electron to the light emitting functional layer 3, and a metal, an alloy, an organic or inorganic electric conductive compound, and a mixture thereof are used for the counter electrode. Examples include aluminum, silver, magnesium, lithium, a mixture of magnesium/copper, a mixture of magnesium/silver, a mixture of magnesium/aluminum, a mixture of magnesium/indium, indium, a mixture of lithium/aluminum, a rare-earth metal, an oxide semiconductor such as ITO, ZnO, TiO2 or SnO2.

The counter electrode 5-1 can be produced by forming a thin film from the electric conductive material through the use of a method such as vapor evaporation or sputtering. The sheet resistance of the counter electrode 5-1 is preferably several hundreds of Ω/sq. or less. The thickness is generally selected within the range of 5 nm to 5 μm, preferably within the range of 5 nm to 200 nm.

When the organic electroluminescent element EL-1 is an element in which emitting light h can also be extracted from the counter electrode 5-1 side, the counter electrode 5-1 may be constituted by selecting an electrically conductive material having a good light transmission property among the aforementioned electrically conductive materials.

[Light Emitting Layer 3c]

The light emitting layer 3c used in the present invention contains a phosphorescence emitting compound as a light emitting material.

The light emitting layer 3c of the present invention is a layer which emits light through recombination of electrons injected from an electrode or an electron transport layer 3d and positive holes injected from the positive hole transport layer 3b. A portion that emits light may be either the inside of the light emitting layer 3c or an interface between the light emitting layer 3c and its adjacent layer.

The configuration of the light emitting layer 3c is not particularly limited as long as the light emitting material contained therein satisfies a light emission requirement. In addition, there may be a plurality of light emitting layers having the same emission spectrum and/or emission maximum wavelength. In the case, it is preferable that non-luminescent intermediate layers (not shown) are present between the light emitting layers 3c.

The total thickness of the light emitting layers 3c is preferably within a range of 1 to 100 nm, and more preferably within a range of 1 to 30 nm from the viewpoint of obtaining a lower driving voltage. Meanwhile, the total thickness of the light emitting layers 3c is a thickness including the thickness of the intermediate layers when the non-luminescent intermediate layers are present between the light emitting layers 3c.

In the case of the light emitting layer 3c constituted by lamination of a plurality of layers, it is preferable to adjust the thickness of individual light emitting layer to be within a range of 1 to 50 nm and it is more preferable to adjust the thickness thereof to be within a range of 1 to 20 nm. When the plurality of the laminated light emitting layers corresponds to the emitted color of blue, green and red, respectively, the relationship between the respective thickness of the light emitting layers of blue, green and red is not particularly limited.

The above light emitting layer 3c can be formed through the film-formation of a light emitting material and a host compound, which are mentioned below, by a well-known thin film forming method such as a vacuum evaporation method, a spin coating method, a casting method, an LB method or an ink-jet method.

In addition, in the light emitting layer 3c, a plurality of light emitting materials may be mixed. Furthermore, a phosphorescence emitting material and a fluorescence emitting material (also referred to as fluorescence emitting dopant, fluorescence emitting compound) may be mixed in the same light emitting layer 3c.

It is preferable that the light emitting layer 3c is constituted so as to contain a host compound (also referred to as emitting host) and a light emitting material (also referred to as light emitting dopant compound, a guest compound), and emit light through the light emitting material.

(Host Compound)

The host compound contained in the light emitting layer 3c is preferably a compound having a phosphorescence quantum yield in phosphorescence emission of less than 0.1 at room temperature (25° C.). The host compound more preferably has a phosphorescent quantum yield of less than 0.01. Furthermore, among the compounds contained in the light emitting layer 3c, a volume ratio in the layer of 50% or greater is preferable.

A well-known host compound may be used as the host compound, alone or in combination of a plurality of kinds. The use of a plurality of host compounds makes it possible to adjust transfer of charges, and to increase an efficiency of the organic electroluminescent element EL-1. Furthermore, the use of a plurality of light emitting materials mentioned below makes it possible to mix different colors of light to be emitted, and to thereby produce any luminous color.

The host compound to be used may be a well-known low molecular compound, a high molecular compound having a repeating unit or a low molecular compound having a polymerizable group such as a vinyl group or an epoxy group (evaporation-polymerizable light emission host) may be used.

The well-known host compound is preferably a compound preventing a light emission wavelength from becoming longer and having a high Tg (glass transition temperature), while having a positive hole transport ability and an electron transport ability. The glass transition temperature Tg herein is a value measured using DSC (Differential Scanning Colorimetry) in accordance with JIS-K-7121.

Hereinafter, specific examples of the host compounds (H1 to H79) which can be used in the present invention are shown, and the present invention is not limited thereto. Meanwhile, the host compound H68 to H79, x and y represent ratio of random copolymer. The ratio may be set to, for example, x:y=1:10.

[Chem. 39]
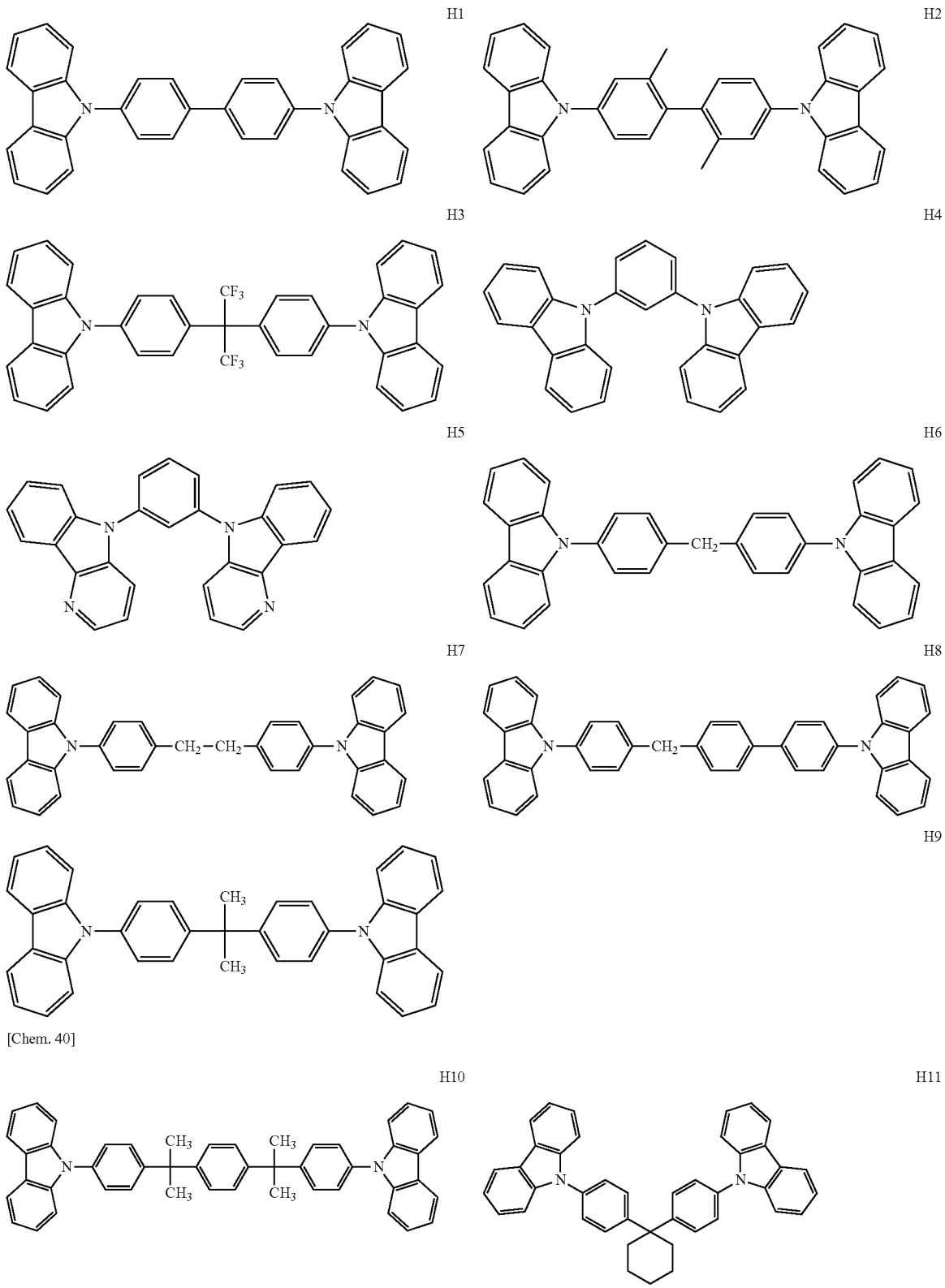
[Chem. 40]

-continued
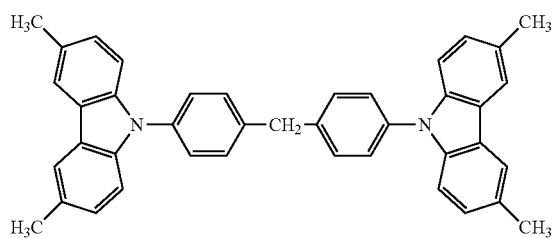
H12
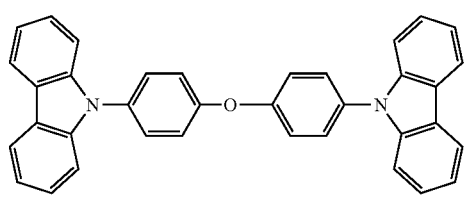
H13
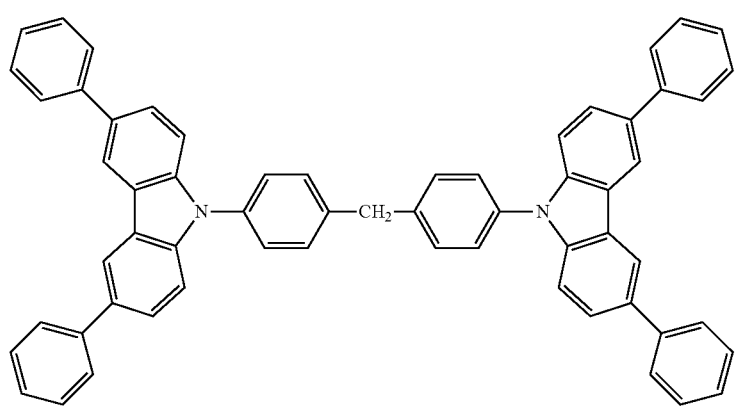
H14
[Chem. 41]
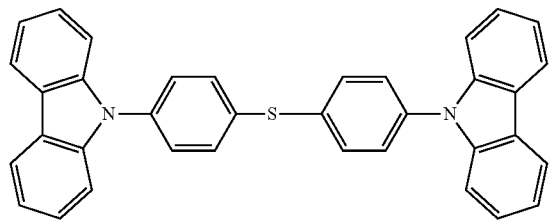
H15
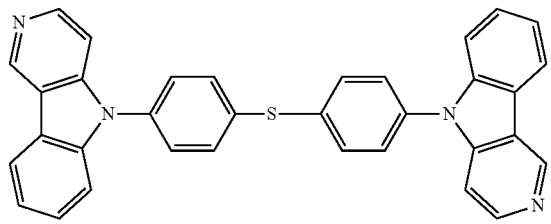
H16
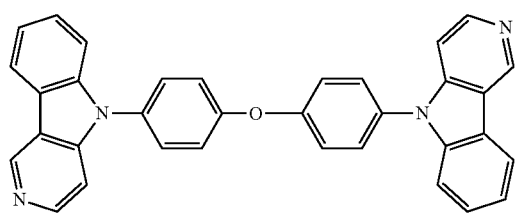
H17
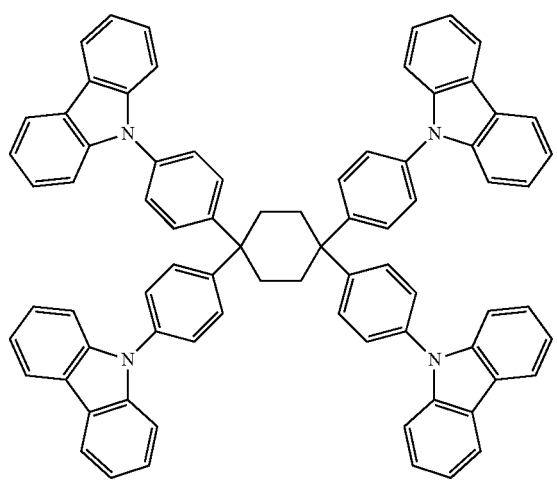
H18

-continued
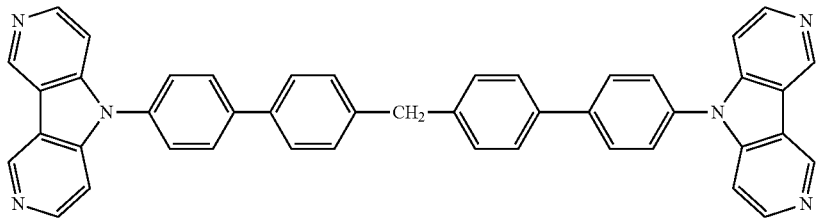
H19
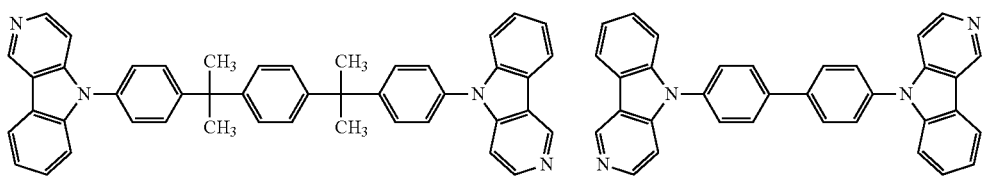
H20 H21
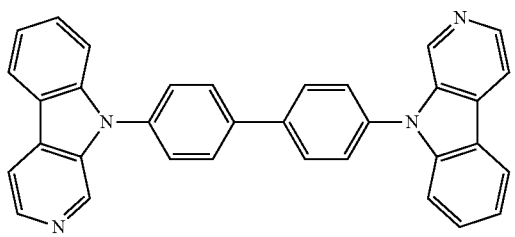
H22
[Chem. 42]
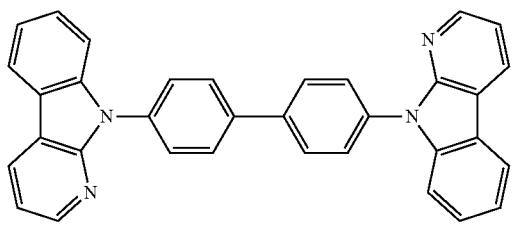
H23
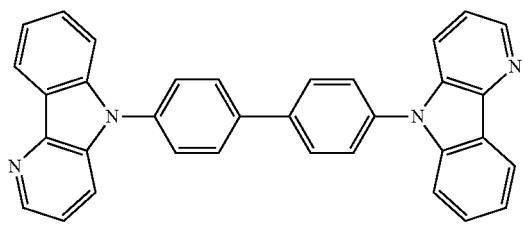
H24
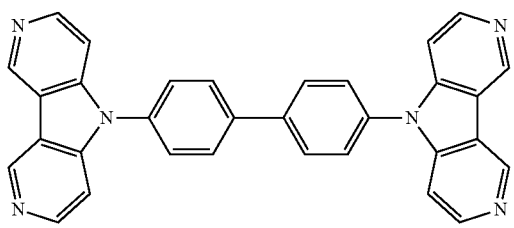
H25
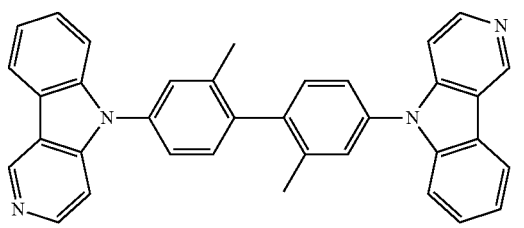
H26
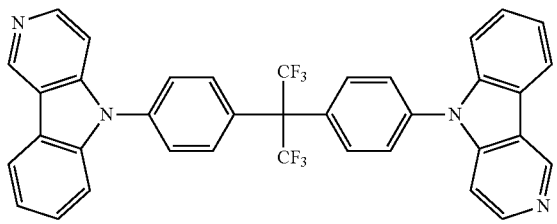
H27
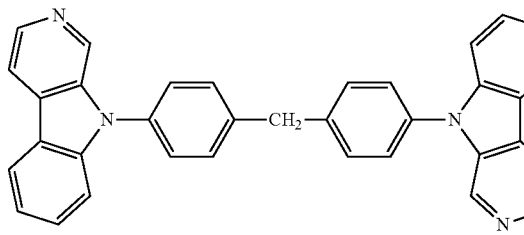
H28

-continued
H29 H30
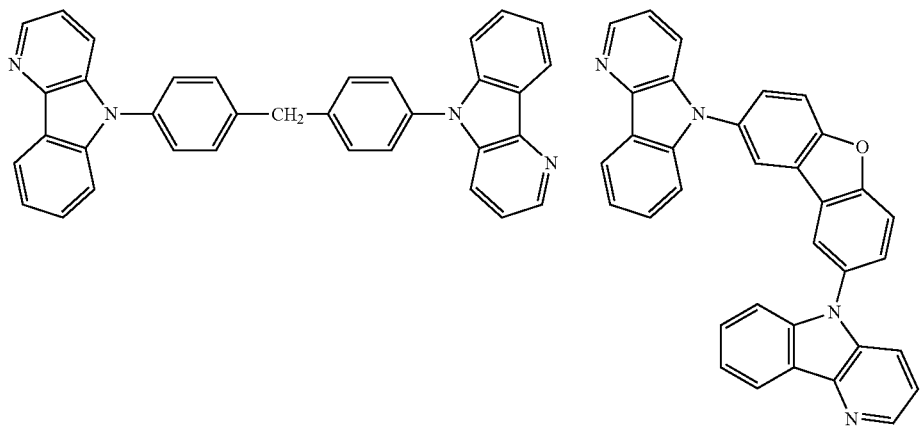
[Chem. 43]
H31 H32
H33
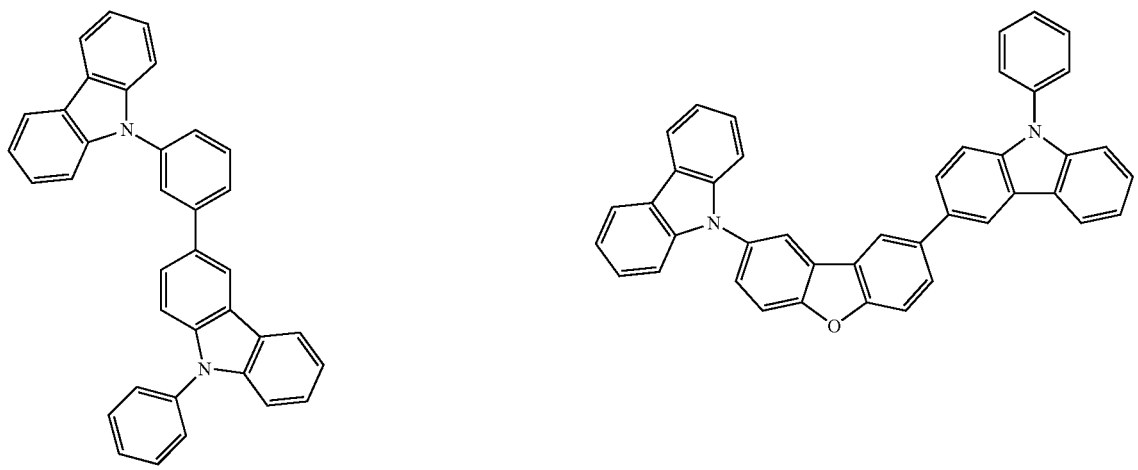
[Chem. 44]
H34
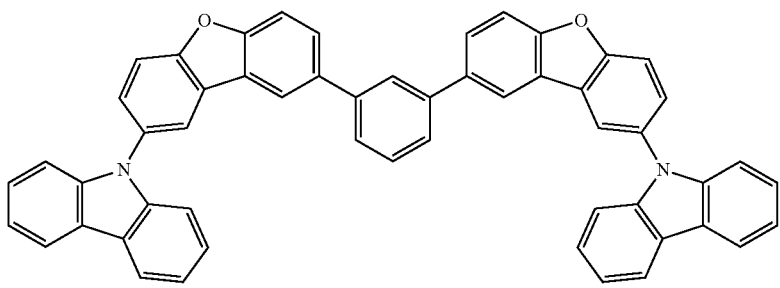
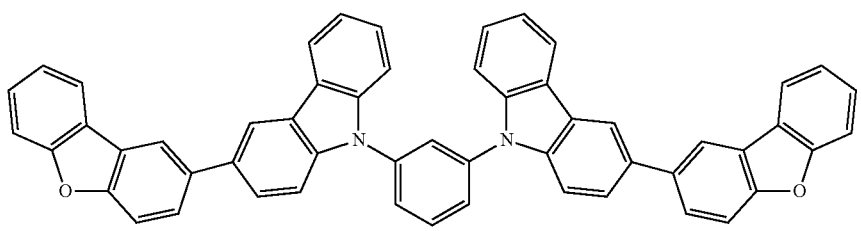

-continued
H35
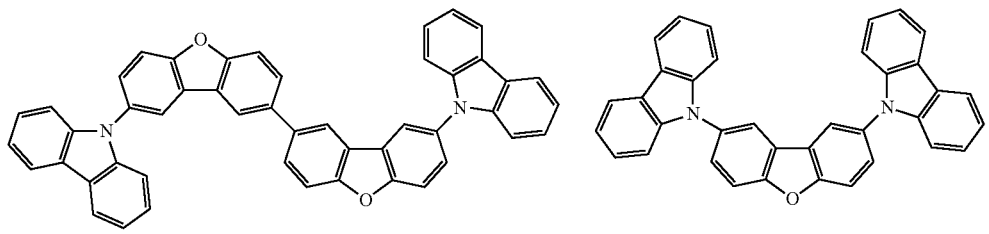
H36
H37
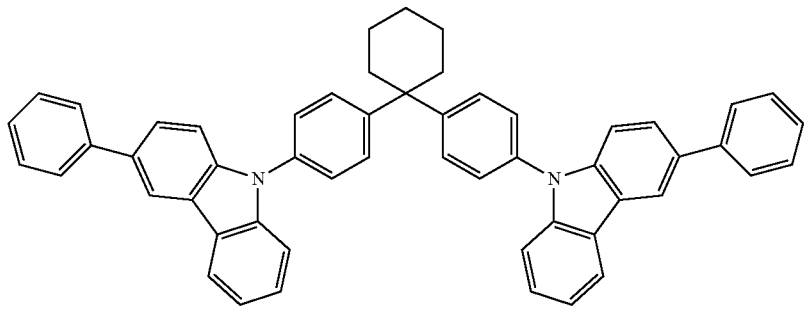
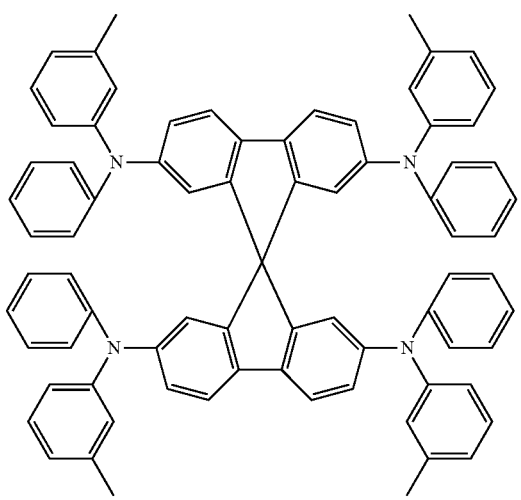
H38
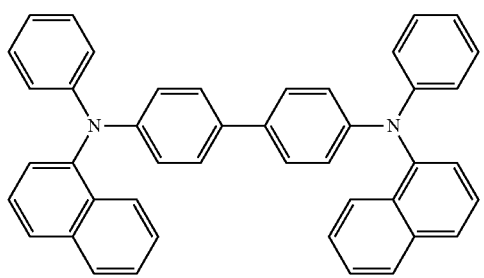
H39
[Chem. 45]
H40
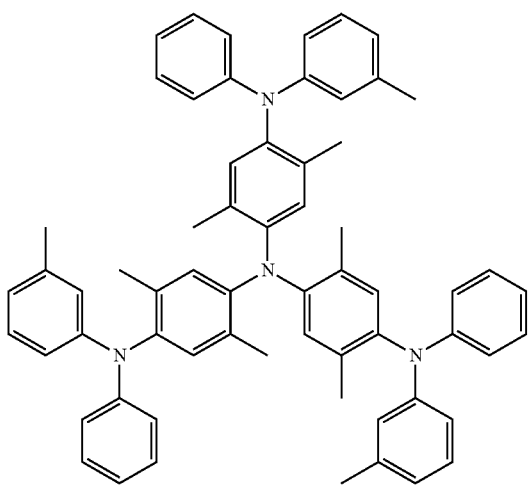
H41
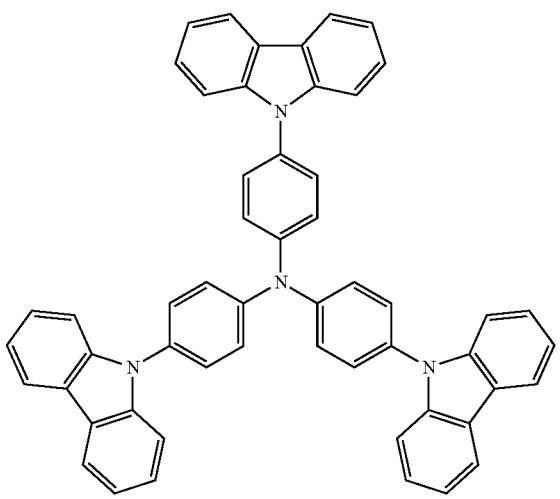

-continued
H42
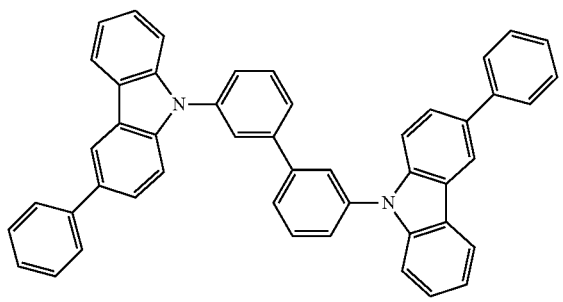
H43
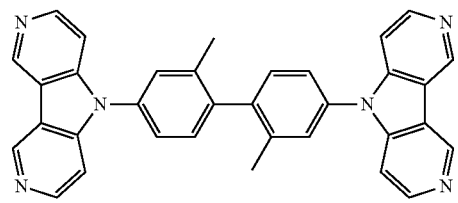
H44
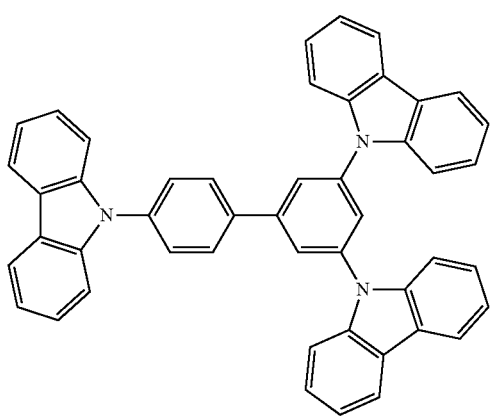
H45
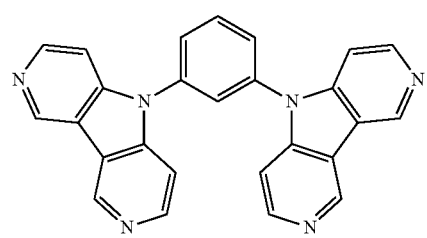
H46
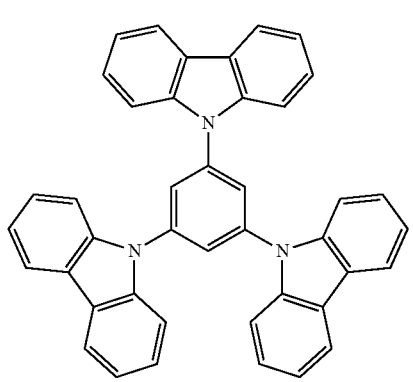
H47
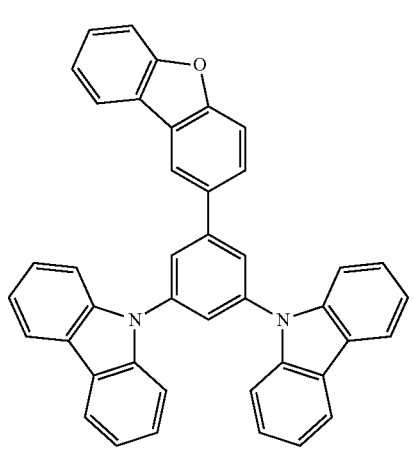
[Chem. 46]
H48
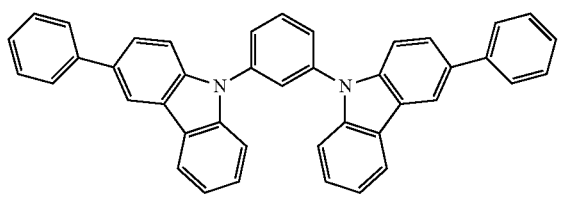
H49
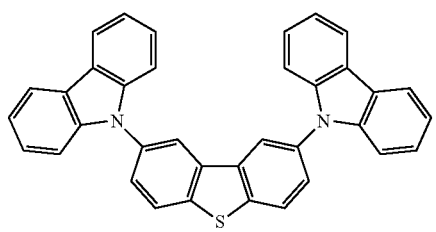

-continued
H50 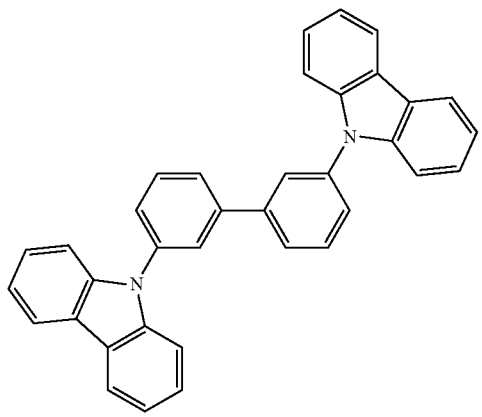
H51 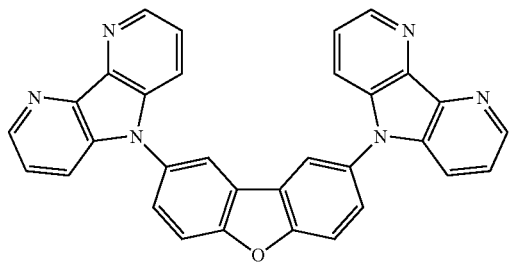
H52 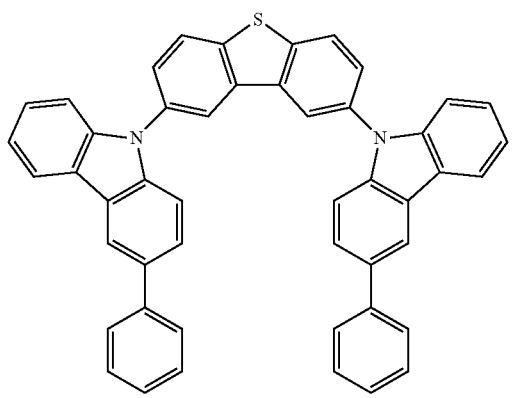
H53 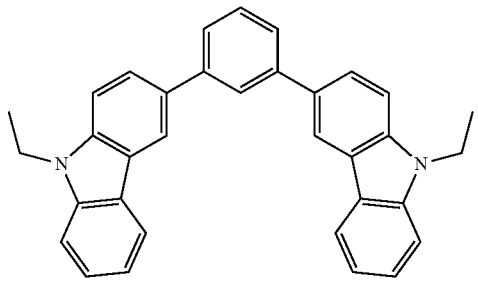
H54 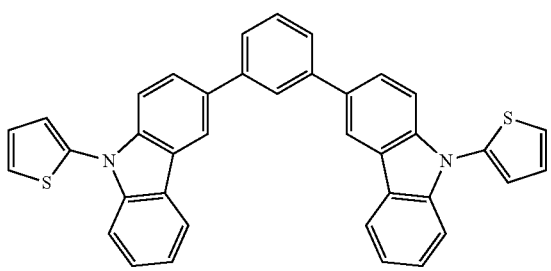
H55 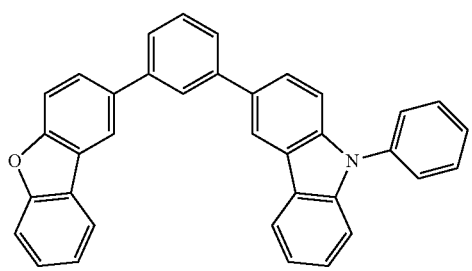
[Chem. 47]
H56 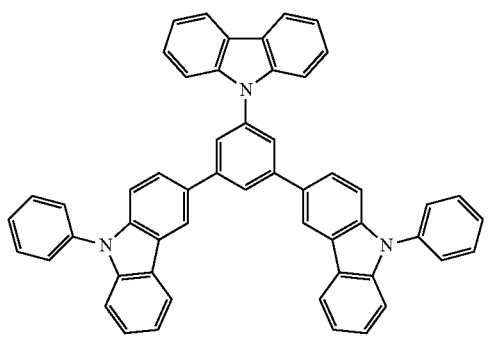
H57 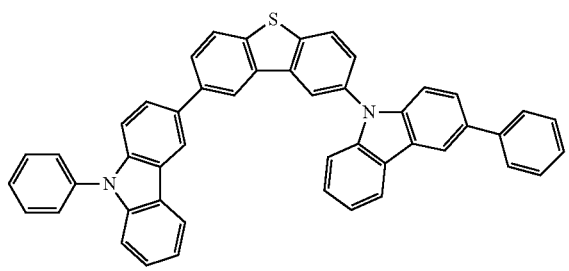

-continued
H58
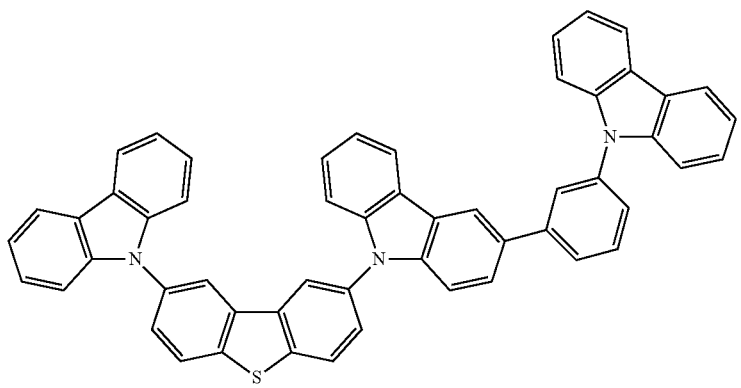
H59
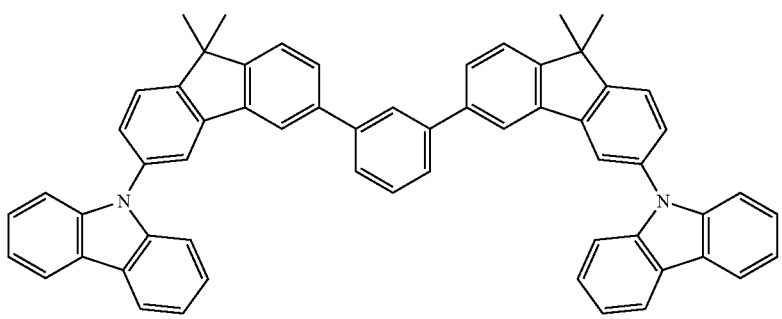
[Chem. 48]
H60
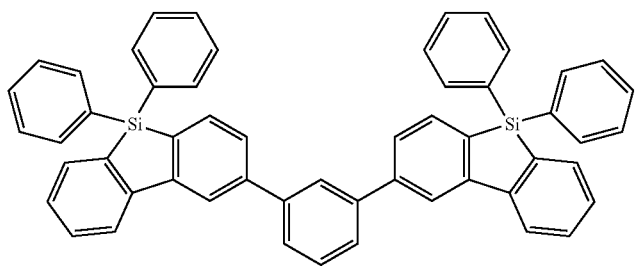
H61
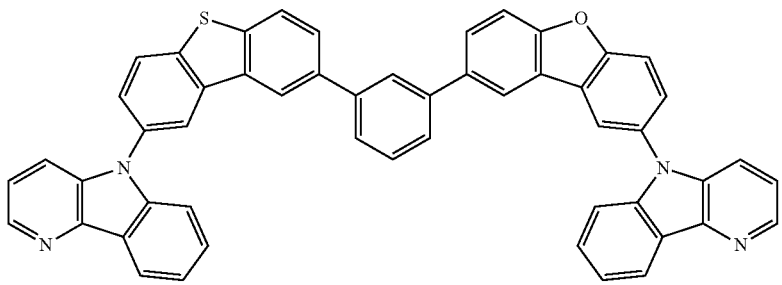
H62
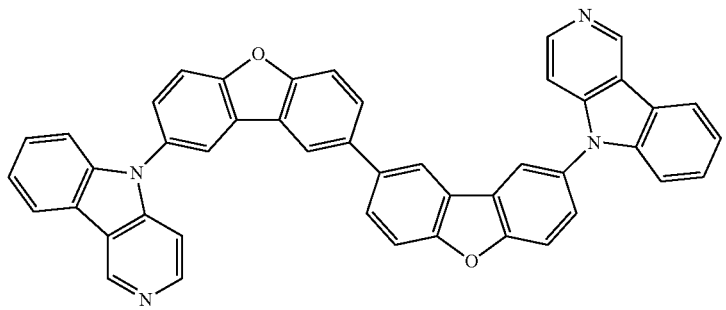

H63
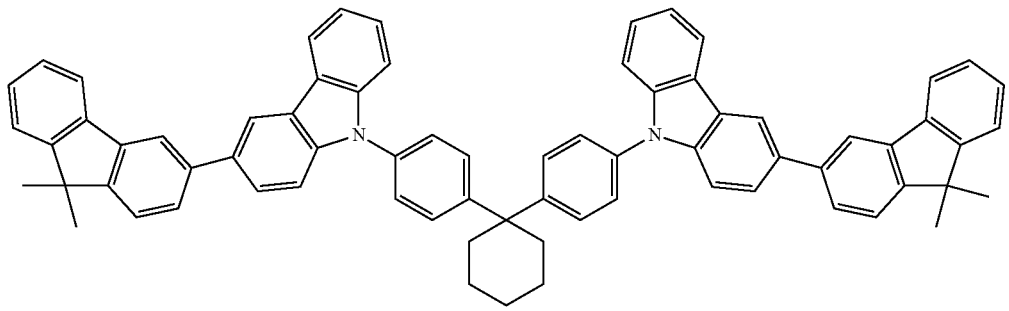
H64
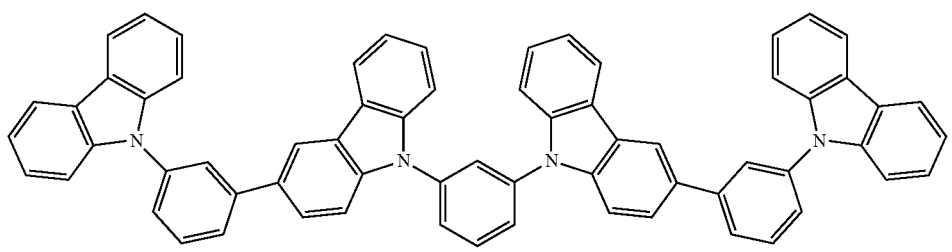
[Chem. 49]
H65
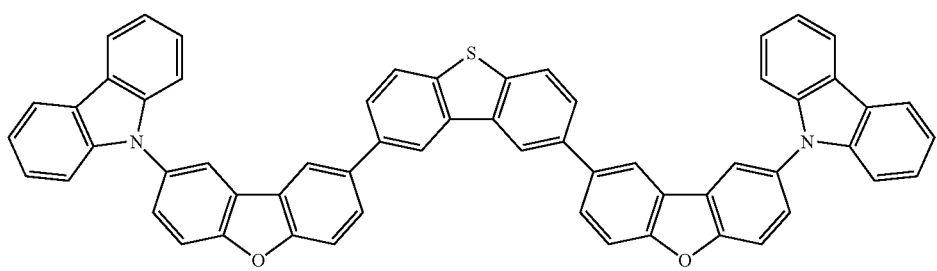
H66
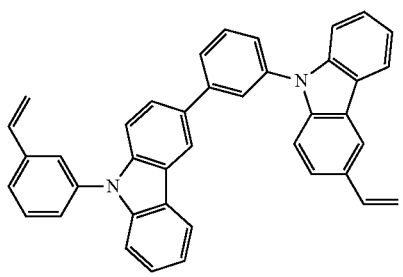
H67
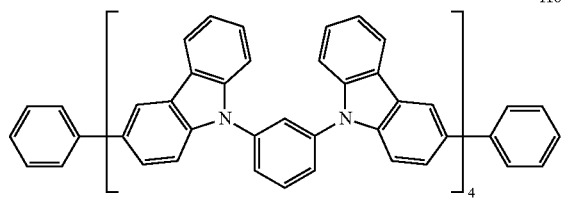

-continued
[Chem. 50]
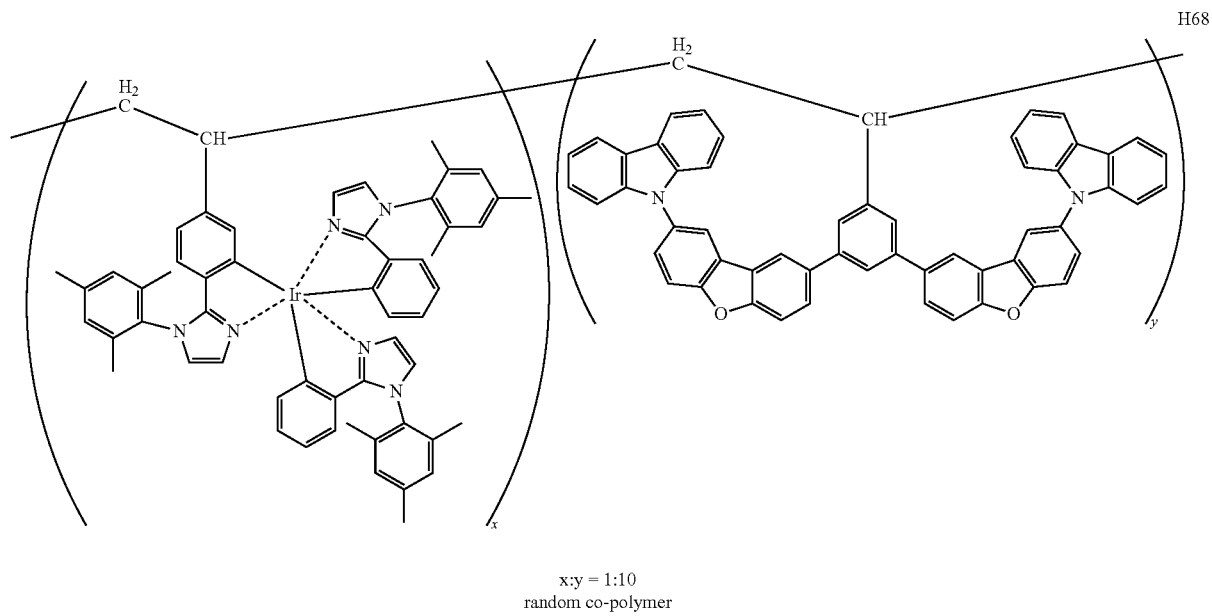
x:y = 1:10
random co-polymer
[Chem. 51]
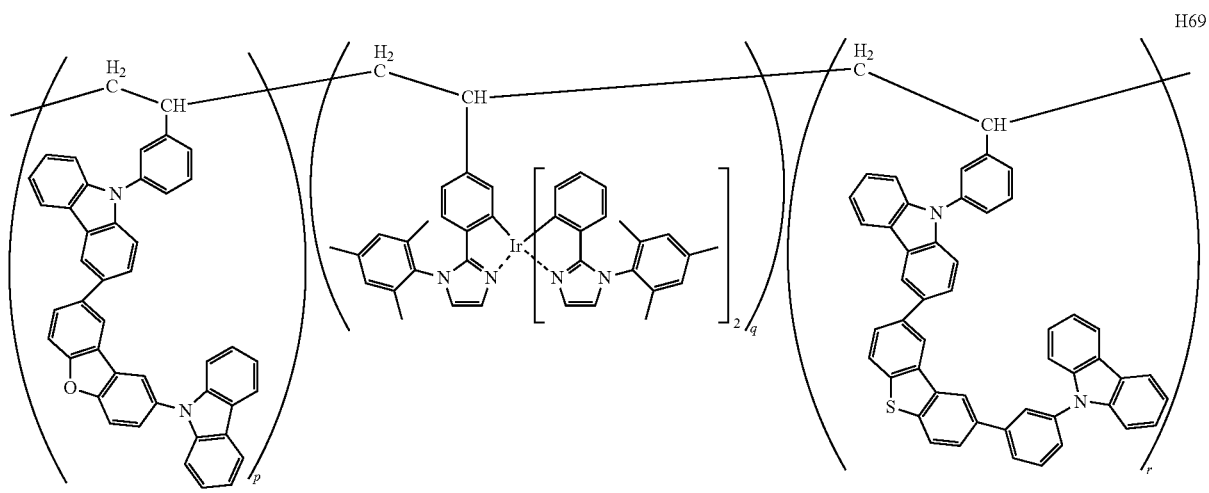

[Chem. 52]
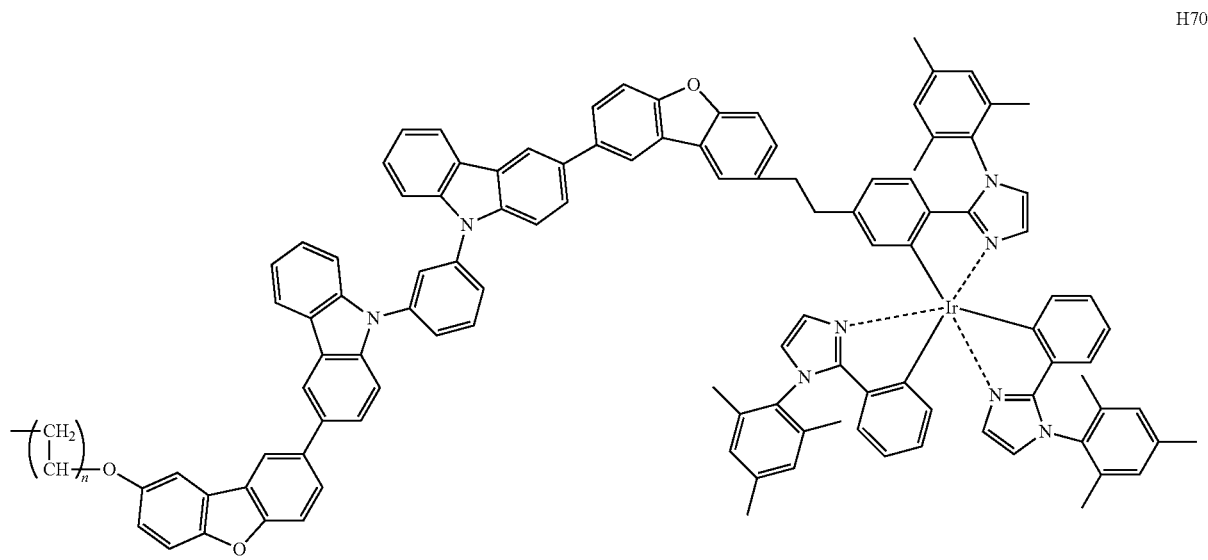
[Chem. 53]
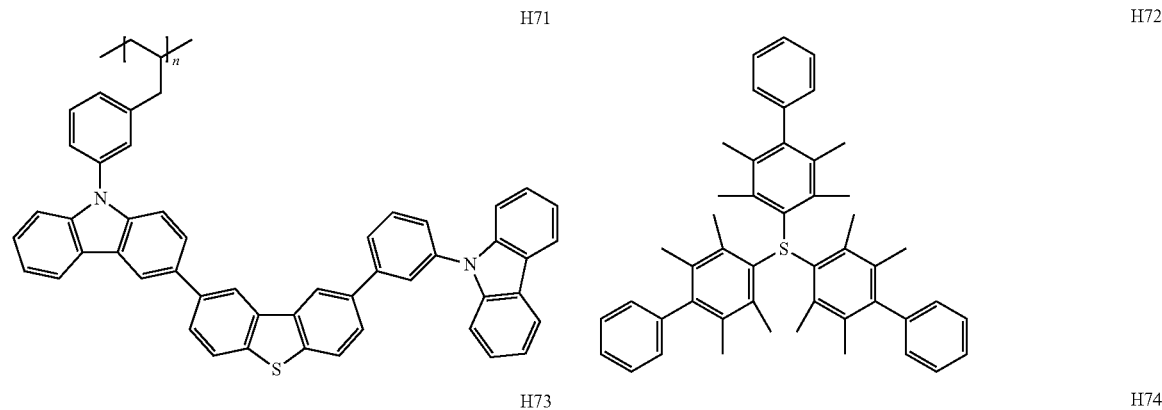
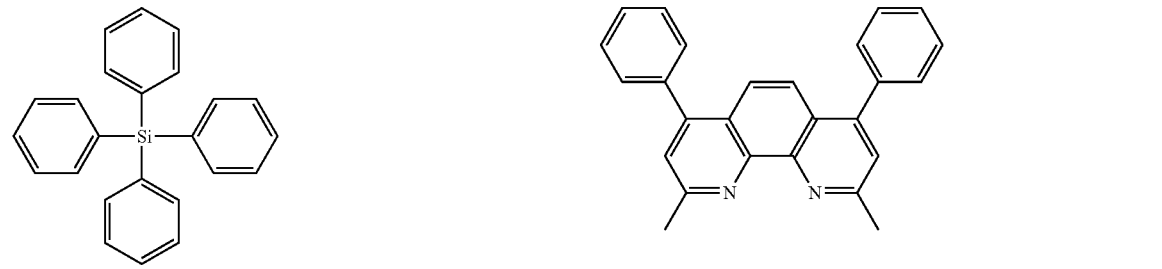
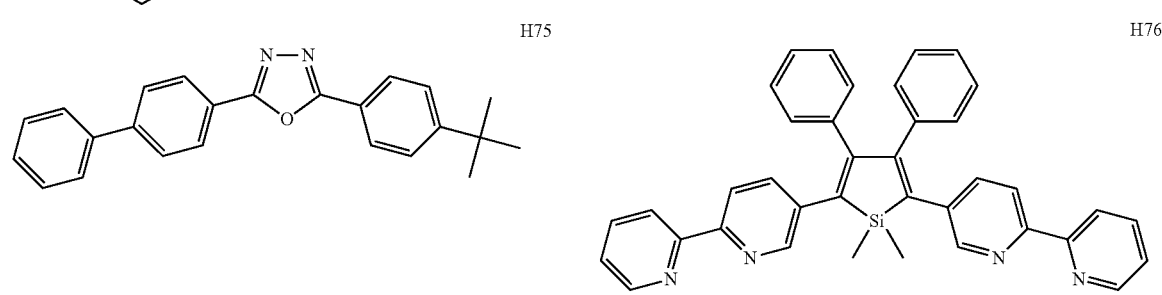

-continued

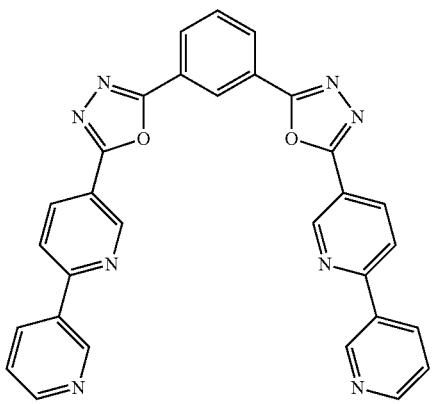
H77

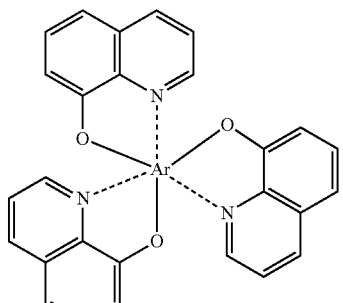
H78

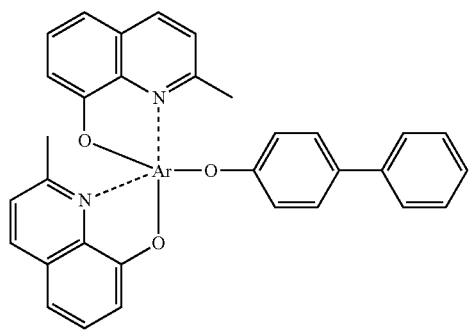
H79

Examples of the well-known host compound include compounds described in the following documents; Japanese Patent Application Laid-Open Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837 and the like.

(Light Emitting Material)

The light emitting material that can be used includes a phosphorescent compound (also referred to as a phosphorescent compound or a phosphorescence emitting compound).

The phosphorescent compound is defined as a compound in which light emission from an excited triplet state is observed, and specifically, a compound which emits phosphorescence at room temperature (25° C.) and a phosphorescence quantum yield at 25° C. is 0.01 or greater, and preferable phosphorescence quantum yield is 0.1 or greater.

The phosphorescence quantum yield can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum yield in a solution can be measured by using various solvents, and in the case of using the phosphorescence emitting compound in the present invention, it is sufficient that the aforementioned phosphorescent quantum yield (0.01 or greater) is achieved in any of arbitrary solvents.

There are two kinds of principles regarding light emission of the phosphorescent compound. One is an energy transfer type, in which recombination of carriers occurs on a host compound which transfers the carriers to thereby produce an excited state of the host compound, this energy is transferred to a phosphorescent compound, and then light emission from the phosphorescent compound is obtained. The other is a carrier trap type, in which a phosphorescent compound serves as a carrier trap, recombination of carriers occurs on the phosphorescent compound, and then light emission from the phosphorescent compound is obtained. In either case, the excited state energy of the phosphorescent compound is required to be lower than that of the host compound.

The phosphorescent compound can be used by being appropriately selected from the well-known phosphorescent compounds used for light emitting layers of organic electroluminescent elements, and is preferably a complex compound containing metal of the groups 8 to 10 in the element periodic table, more preferably an iridium compound, an osmium compound, a platinum compound (a platinum complex compound) or a rare earth complex, and most preferably an iridium compound.

In the present invention, at least one light emitting layer 3c may contain two or greater types of phosphorescent compounds, and a ratio of concentration of the phosphorescent compound in the light emitting layer 3c may vary in the thickness direction of the light emitting layer 3c.

An amount of the phosphorescent compound is preferably 0.1% by volume or greater and 30% by volume or less relative to the total volume of the light emitting layer 3c.

(Compound of General Formula (5))

The compound (phosphorescent compound) contained in the light emitting layer 3c is preferably the compound of the following general formula (5).

For the preferred embodiment, the phosphorescent compound (also called a phosphorescent metal complex) of the general formula (5) may be contained in the light emitting layer 3c of the organic electroluminescent element EL-1 as a luminescent dopant, or in the light emitting functional layer other than the light emitting layer 3c.

[Chem. 54]

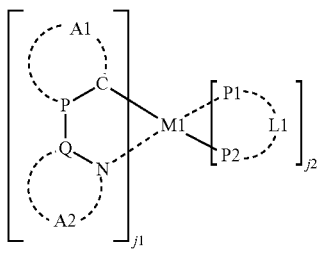

General formula (5)

In the general formula (5), P and Q each represent a carbon atom or a nitrogen atom, A1 represents an atom group which forms an aromatic hydrocarbon ring or an aromatic heterocyclic ring with P—C. A2 represents an atom group which forms an aromatic heterocyclic ring with Q-N. P1-L1-P2 represents a bidentate ligand, P1 and P2 each independently represent a carbon atom, a nitrogen atom or an oxygen atom. L1 represents an atom group which forms a bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

In the general formula (5), P, Q each represent a carbon atom or a nitrogen atom.

Examples of the aromatic hydrocarbon ring which is formed by A1 with P—C in the general formula (5) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

These rings may further include the substituent group represented by Y1 in the general formula (1).

Examples of the aromatic heterocyclic ring which is formed by A1 with P—C in the general formula (5) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, benzimidazole ring, benzothiazole ring, benzoxazole ring, quinoxaline ring, quinazoline ring, phthalazine ring, carbazole ring, azacarbazole ring and the like.

Here, the azacarbazole ring indicates a ring obtained by substituting one or greater carbon atoms of benzene ring constituting carbazole ring by a nitrogen atom.

These rings may further include the substituent group represented by Y1 in the general formula (1).

Examples of the aromatic heterocyclic ring which is formed by A2 with Q-N in the general formula (5) include oxazole ring, oxadiazole ring, oxatriazole ring, isoxazole ring, tetrazole ring, thiadiazole ring, thiatriazole ring, isothiazole ring, pyrrole ring, pyridine ring, pyridazine ring, pyrimidine ring, pyrazine ring, triazine ring, imidazole ring, pyrazole ring, triazole ring and the like.

These rings may further include the substituent group represented by Y1 in the general formula (1).

In the general formula (5), P1-L1-P2 represents a bidentate ligand, P1 and P2 each independently represent carbon atom, nitrogen atom or oxygen atom. L1 represents an atom group which forms a bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid and the like.

In the general formula (5), j1 represents an integer of 1 to 3, and j2 represents an integer of 0 to 2, but the sum of j1 and j2 is 2 or 3. Among them, j2 is preferably 0.

In the general formula (5), M1 represents a transition metal element (simply referred to as a transition metal) of the groups 8 to 10 in the element periodic table. Among them, M1 is preferably iridium.
(Compound Represented by the General Formula (6))

Among compounds represented by the general formula (5), a compound represented by following the general formula (6) is more preferable.

[Chem. 55]

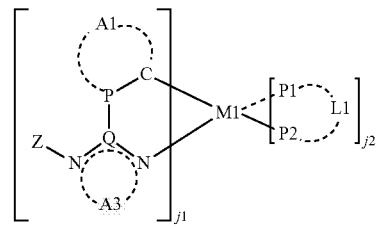

General formula (6)

In the above general formula (6), Z represents a hydrocarbon ring group or a heterocyclic group. Each of P and Q represents a carbon atom or a nitrogen atom, A1 represents an atom group which forms an aromatic hydrocarbon ring or an aromatic heterocyclic ring with P—C. A3 represents —C(R01)=C(R02)-, —N=C(R02)-, —C(R01)=N—, or —N=N—, and each of R01 and R02 represents a hydrogen atom or a substituent group. P1-L-P2 represents a bidentate ligand, and each of P1 and P2 represents a carbon atom, a nitrogen atom, or an oxygen atom independently. L1 represents an atom group forming the bidentate ligand together with P1 and P2. While j1 represents an integer of 1 to 3 and j2 represents an integer of 0 to 2, j1+j2 is 2 or 3. M1 represents a transition metal element from group 8 to group 10 in the repetition table of the elements.

In the general formula (6), examples of the hydrocarbon ring group represented by Z include a no-aromatic hydrocarbon ring group and an aromatic hydrocarbon ring group, and examples of the non-aromatic hydrocarbon ring group include a cyclopropyl group, a cyclopentyl group, a cyclohexyl group, and the like. Each of these groups may not include a substituent group or may include the substituent group represented by Y1 in the general formula (1).

Furthermore, examples of the aromatic hydrocarbon ring group (also called aromatic hydrocarbon group or aryl group) include a phenyl group, a p-chlorophenyl group, a mesityl group, a tolyl group, a xilyl group, a naphthyl group, an anthryl group, an azulenyl group, an acenaphthenyl group, a fluorenyl group, a phenanthryl group, an indenyl group, a pyrenyl group, a biphenylyl group, and the like.

Each of these groups may not include a substituent group or may include the substituent group represented by Y1 in the general formula (1).

In the general formula (6), examples of the heterocyclic group represented by Z include a non-aromatic heterocyclic group, an aromatic heterocyclic group, and the like, and examples of the non-aromatic heterocyclic group include an epoxy ring, an aziridine ring, a thiirane ring, an oxetane ring, an azetidine group, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine, a hexahydropyrimidine, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, and the like.

Each of these rings may not include a substituent group or may include the substituent group represented by Y1 in the general formula (1).

Examples of the aromatic heterocyclic group include a pyridyl group, a pyrimidinyl group, a furyl group, a pyrrolyl group, an imidazolyl group, a bemzoimidazolyl group, a pyrazolyl group, a pyrazinyl group, a triazolyl group (e.g., 1,2,4-triazole-1-yl group, 1,2,3-triazole-1-yl group, etc.), an oxazolyl group, a benzo oxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacarbazolyl group (indicating a group in which one of carbon atoms constituting a carboline ring in the carbonyl group is substituted by a nitrogen atom), a quinoxalinyl group, a pyridazinyl group, a triazinyl group, a quinazolinyl group, a phthalazinyl group, and the like.

Each of these groups may not include a substituent group or may include the substituent group represented by Y1 in the general formula (1).

Preferably, the group represented by Z is an aromatic hydrocarbon ring group or an aromatic heterocyclic group.

In the general formula (6), examples of the aromatic hydrocarbon ring which A1 forms together with P—C include a benzene ring, a biphenyl ring, a naphthalene ring, an azylene ring, an anthracene ring, a phenathrene ring, a pyrene ring, a chrysene ring, a naphthacene ring, a triphenylene ring, an o-terphenyl ring, an m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthraanthrene ring, and the like.

Each of these rings may include the substituent group represented by Y1 in the general formula (1).

In the general formula (6), examples of the aromatic hetero ring which A1 forms together with P—C include a furan ring, a thiophene ring, an oxazole ring, a pyrrol ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a thiazole ring, an indole ring, a benzoimidazole ring, a benzothiazole ring, a benzooxazole ring, a quinoxaline ring, a quinazoline ring, a phthalazine ring, a carbazole ring, a carboline ring, an azacarbazole ring, and the like.

Here, the azacarbazole ring indicates a ring in which one or more carbon atoms of a benzene ring constituting the carbazole ring is substituted by nitrogen atoms.

Each of these rings may include the substituent group represented by Y1 in the general formula (1).

In —C(R01)=C(R02)-, —N=C(R02)-, —C(R01)=N— which are represented by A3 in the general formula (6), the substituent group represented by each of R01 and R02 is synonymous with the substituent group represented by Y1 in the general formula (1).

In the general formula (6), examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

Furthermore, while j1 represents an integer of 1 to 3 and j2 represents an integer of 0 to 2, j1+j2 represents 2 or 3. Among them, j2 is preferably 0.

The transition metal element (also simply called transition metal) from group 8 to group 10 in the repetition table of the elements which is represented by M1 in the general formula (6) is synonymous with the transition metal element from group 8 to group 10 in the repetition table of the elements which is represented by M1 in the general formula (5).
(Compound Represented by the General Formula (7))

Examples of a preferable mode of a compound represented by the above general formula (6) include a compound represented by following the general formula (7).

[Chem. 56]

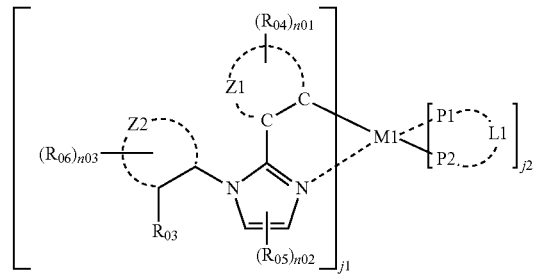

General formula (7)

In the above general formula (7), R03 represents a substituent group, R04 represents a hydrogen atom or a substituent group, and a plurality of R04 may bind with one another to form a ring. n01 represents an integer of 1 to 4. R05 represents a hydrogen atom or a substituent group, and a plurality of R05 may bind with one another to form a ring. n02 represents an integer of 1 to 2. R06 represents a hydrogen atom or a substituent group, a plurality of R06 may bind with one another to form a ring. n03 represents an integer of 1 to 4. Z1 represents an atom group necessary for forming a 6-seat aromatic hydrocarbon ring or a 5-seat or 6-seat aromatic hetero ring together with C—C. Z2 represents an atom group necessary for forming a hydrocarbon ring group or a heterocyclic group. P1-L1-P2 represents a bidentate ligand, and each of P1 and P2 represents a carbon atom, a nitrogen atom, or an oxygen atom independently. L1 represents an atom group forming the bidentate ligand together with P1 and P2. While j1 represents an integer of 1 to 3 and j2 represents an integer of 0 to 2, j1+j2 is 2 or 3. M1 represents a transition metal element from group 8 to group 10 in the repetition table of the elements. Each pair of R03 and R06, R04 and R06, and R05 and R06 may bind with each other to form a ring.

In the general formula (7), the substituent group represented by each of R03, R04, R05, and R06 is synonymous with the substituent group represented by Y1 in the general formula (1).

In the general formula (7), examples of the 6-seat aromatic hydrocarbon ring which Z1 forms together with C—C include a benzene ring and the like.

Each of these rings may further include the substituent group represented by Y1 in the general formula (1).

In the general formula (7), examples of the 5-seat or 6-seat aromatic hetero ring which Z1 forms together with C—C include an oxazole ring, an oxadiazole ring, an oxatriazole ring, an isooxazole ring, a tetrazole ring, a thiadiazole ring, a thiatriazole ring, an isothiazole ring, a thiophene ring, a furan ring, a pyrrol ring, a pyridine ring, a pyridazine ring, a pyrimidine ring, a pyrazine ring, a triazine ring, an imidazole ring, a pyrazole ring, a triazole ring, and the like.

Each of these rings may further include the substituent group represented by Y1 in the general formula (1).

In the general formula (7), example of the hydrocarbon ring group represented by Z2 include a non-aromatic hydrocarbon ring group and an aromatic hydrocarbon ring group, and examples of the non-aromatic hydrocarbon ring group include a cyclopropyl group, a cyclopentyl group, a cyclohexyl group, and the like. Each of these groups may not include a substituent group or may include the substituent group represented by Y1 in the general formula (1).

Furthermore, examples of the aromatic hydrocarbon ring group (also called aromatic hydrocarbon group or aryl group) include a phenyl group, a p-chlorophenyl group, a mesityl group, a tolyl group, a xylyl group, a naphtyl group, an anthryl group, an azulenyl group, an acenaphthenyl group, a fluorenyl group, a phenanthryl group, an indenyl group, a pyrenyl group, a biphenylyl group, and the like. Each of these groups may not include a substituent group or may include the substituent group represented by Y1 in the general formula (1).

In the general formula (7), examples of the heterocyclic group represented by Z2 include a non-aromatic heterocyclic group, an aromatic heterocyclic group, and the like, and example of the non-aromatic heterocyclic group include groups derived from an epoxy ring, an aziridine ring, a thiirane ring, an oxetane ring, an azetidine group, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine, a hexahydropyrimidine, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, and the like. Each of these groups may not include a substituent group or may include the substituent group represented by Y1 in the general formula (1).

Examples of the aromatic heterocyclic group include a pyridyl group, a pyrimidinyl group, a furyl group, a pyrrolyl group, an imidazolyl group, a bemzoimidazolyl group, pyrazolyl group, a pyrazinyl group, a triazolyl group (e.g., 1,2,4-triazole-1-yl group, 1,2,3-triazole-1-yl group, etc.), an oxazolyl group, a benzooxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacarbazolyl group (indicating a group in which one of carbon atoms constituting a carboline group in the carbonyl group is substituted by a nitrogen atom), a quinoxalinyl group, a pyridazinyl group, a triazinyl group, a quinazolinyl group, a phthalazinyl group, and the like.

Each of these rings may not include a substituent group or may include the substituent group represented by Y1 in the general formula (1).

In the general formula (7), preferably the group formed by Z1 and Z2 is a benzene ring.

In the general formula (7), the bidentate ligand represented by P1-L1-P2 is anonymous with the bidentate ligand represented by P1-L1-P2 in the general formula (5).

In the general formula (7), the transition metal element represented by M1 from group 8 to group 10 in the repetition table of the elements is anonymous with the transition metal element from group 8 to group 10 in the repetition table of the elements which is represented by M1 in the general formula (5).

Furthermore, the phosphorescent compound can be selected to be used from the publicly known compounds used as the light emitting layer 3c of the organic electroluminescent element EL-1.

The phosphorescent compound according to the present invention is preferably a complex series compound including metal from group 8 to group 10 in the repetition table of the elements and more preferably an iridium compound, an osmium compound, a platinum compound (platinum-complex-bases compound), or a rare earth complex, and the most preferable compound thereamong is the iridium compound.

While specific examples (Pt-1 to Pt-3, A-1, and Ir-1 to Ir-50) of the phosphorescent compound according to the present embodiment will be shown in the following, the present invention is not limited to these examples. Here, in these compounds, each of m and n represents the number of repetitions.

[Chem. 57]

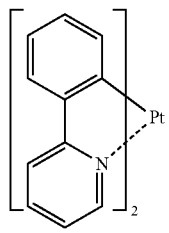

Pt-1

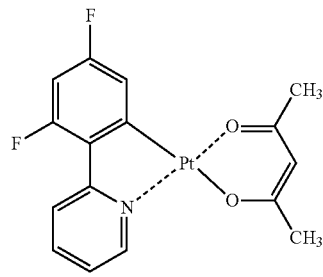

Pt-2

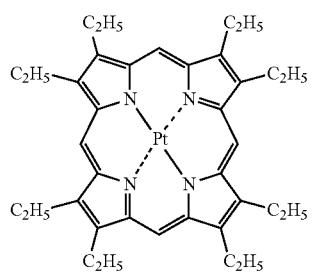
113
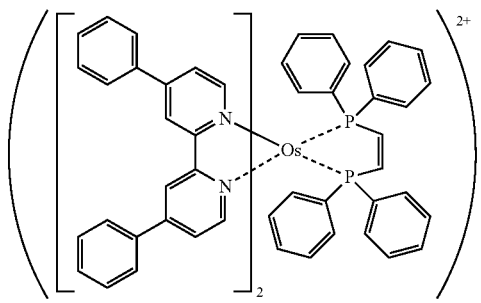
Pt-3
A-1
-continued
[Chem. 58]
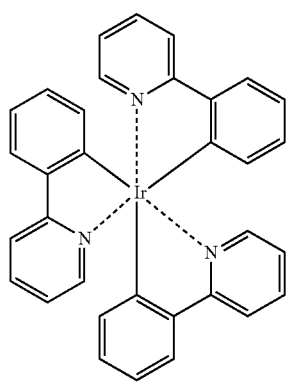
Ir-1
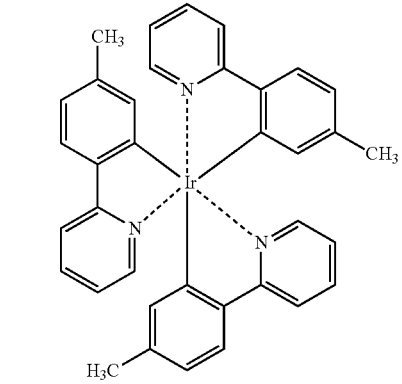
Ir-2
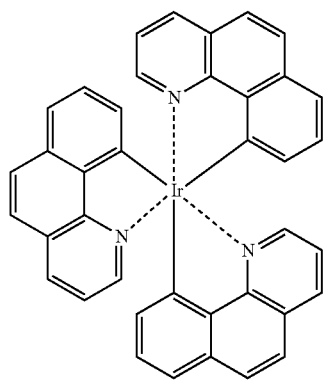
Ir-3
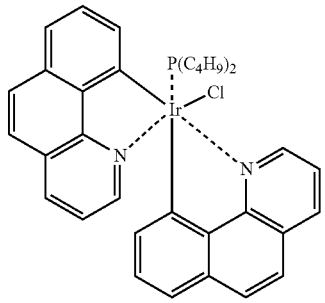
Ir-4
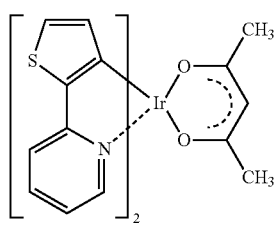
Ir-5
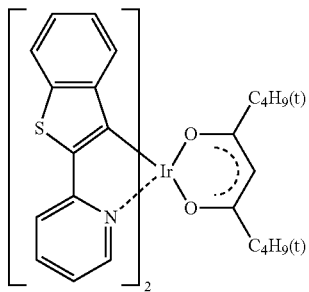
Ir-6

-continued
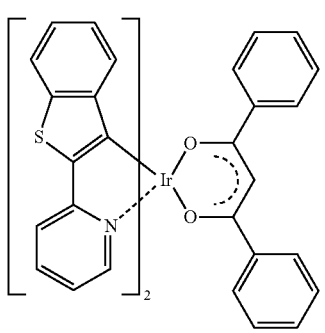
Ir-7
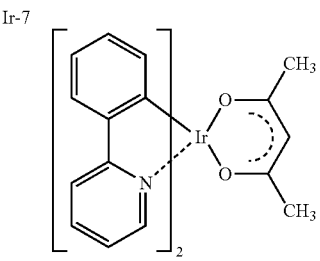
Ir-8
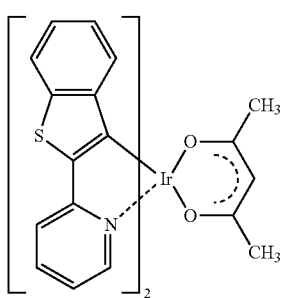
Ir-9
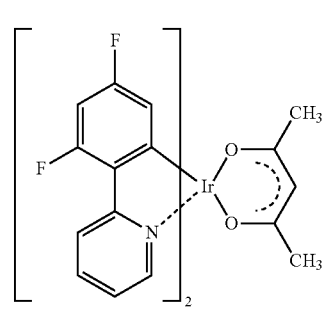
Ir-10
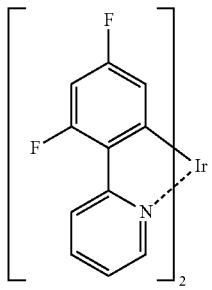
Ir-11
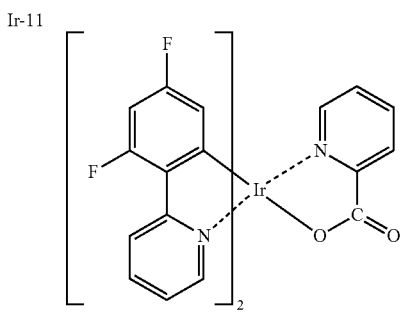
Ir-12
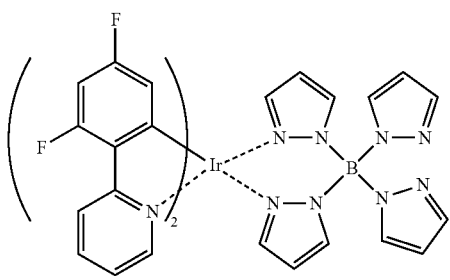
Ir-13
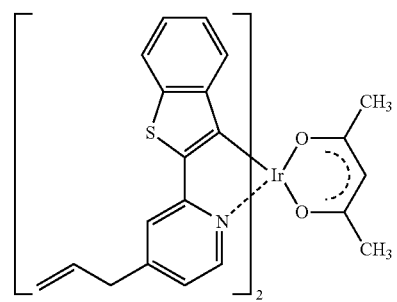
Ir-14
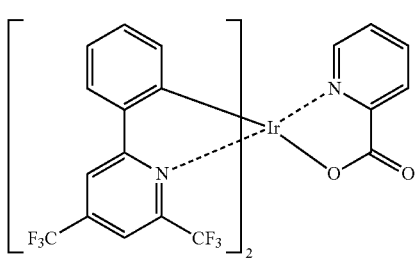
Ir-15
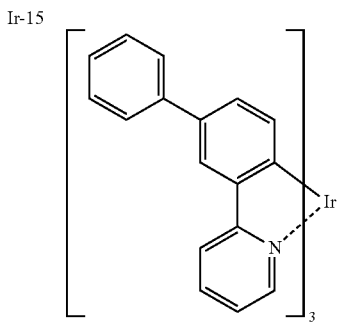
Ir-16

-continued
Ir-17
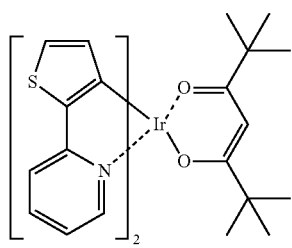
Ir-18
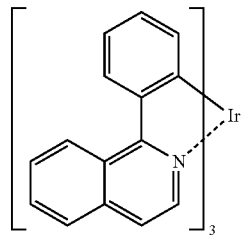
Ir-19
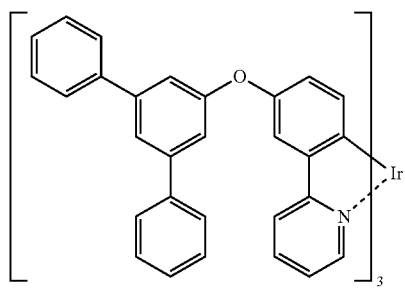
Ir-20
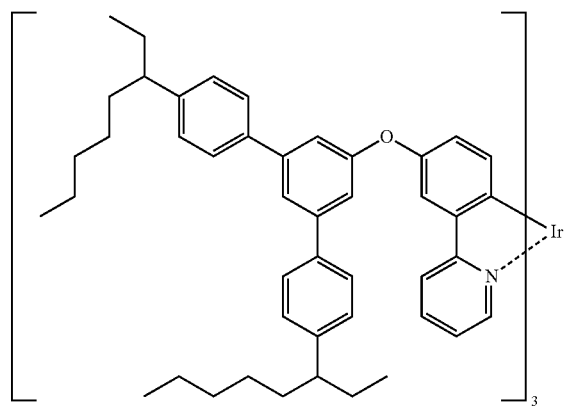
Ir-21
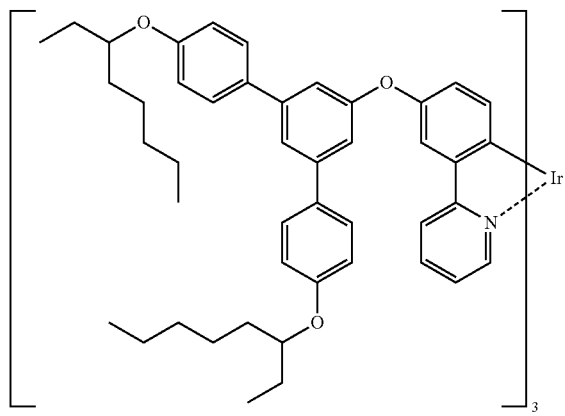
[Chem. 61]
Ir-22
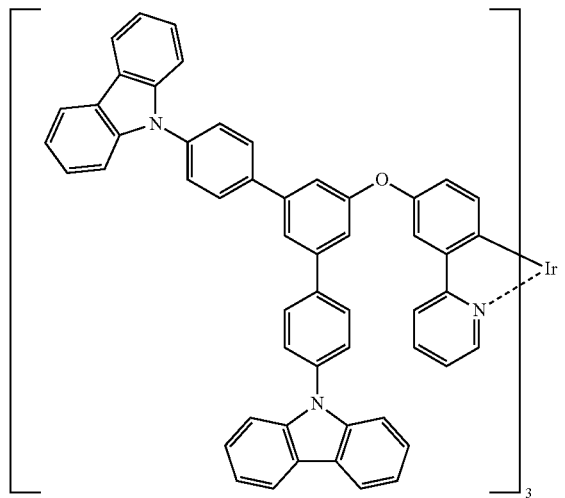
Ir-23
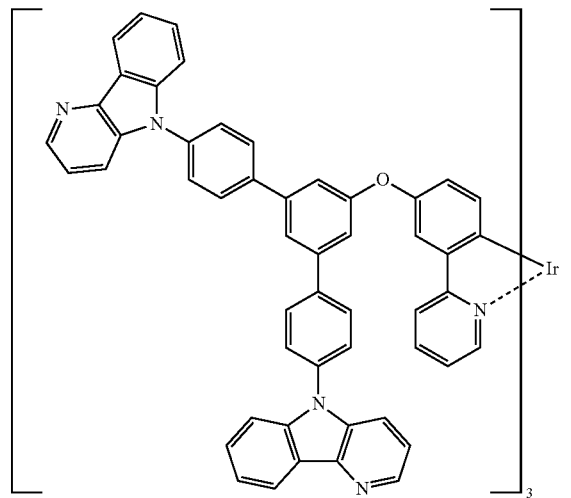

-continued
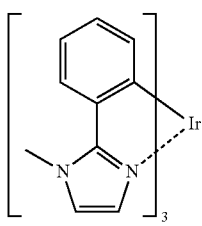
Ir-24
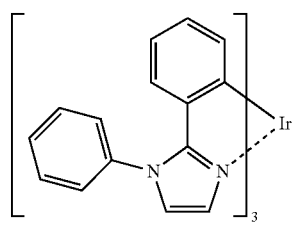
Ir-25
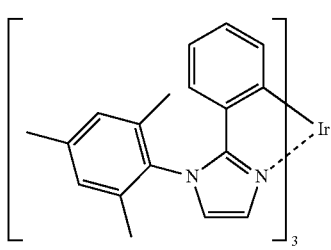
Ir-26
[Chem. 62]
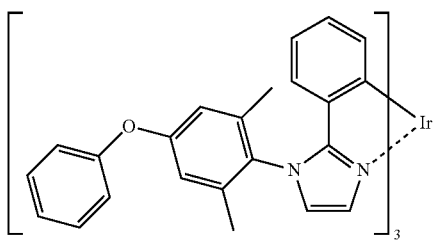
Ir-27
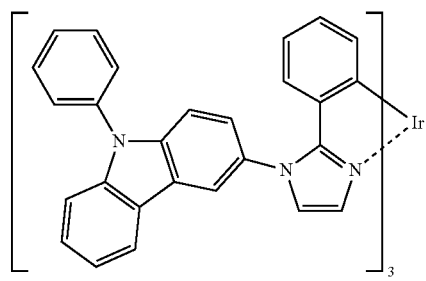
Ir-28
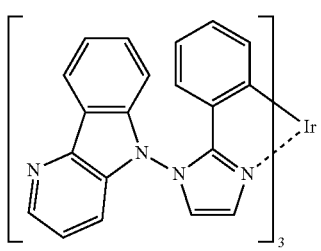
Ir-29
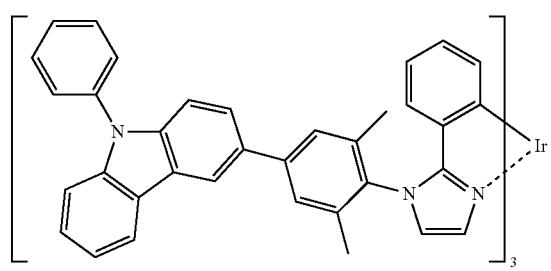
Ir-30
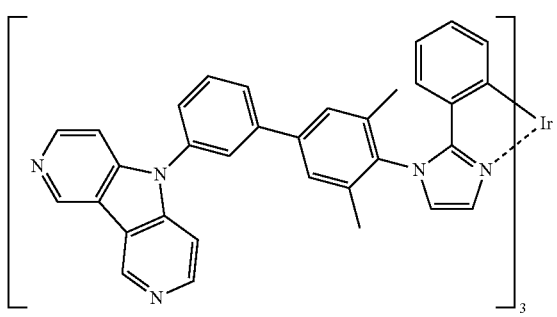
Ir-31

-continued
Ir-32
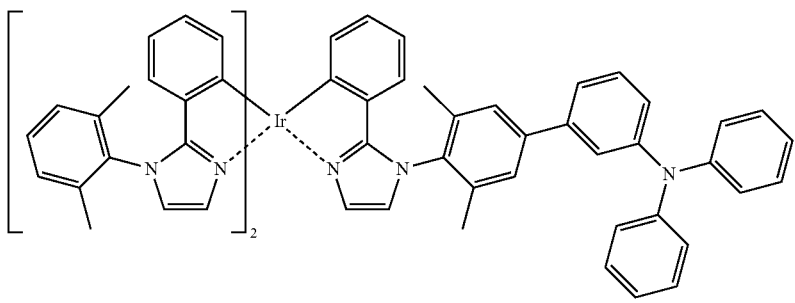
Ir-33
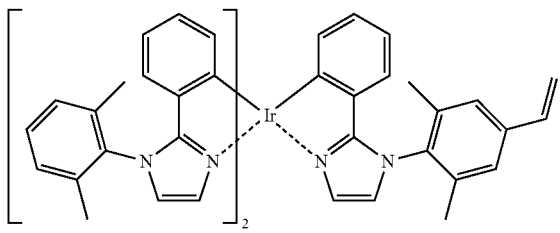
[Chem. 63]
Ir-34
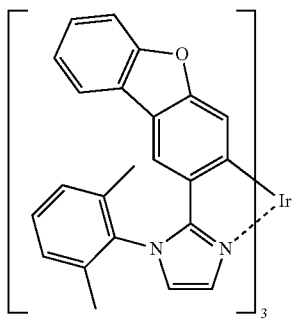
Ir-35
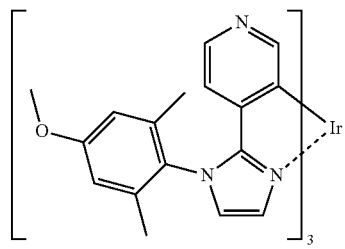
Ir-36
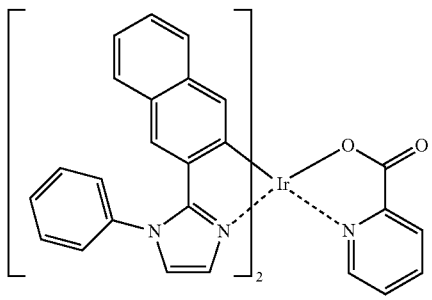
Ir-37
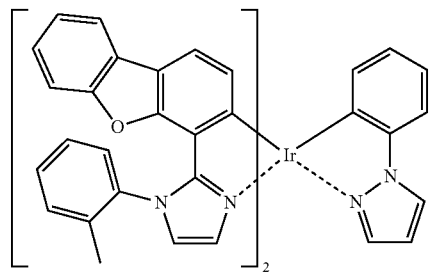
Ir-38
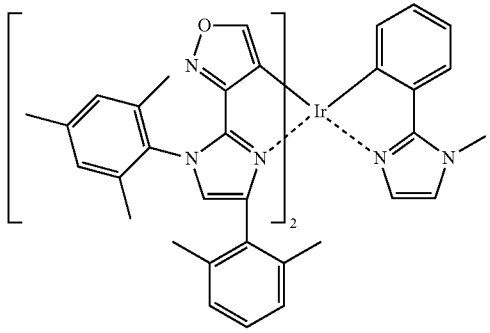
Ir-39
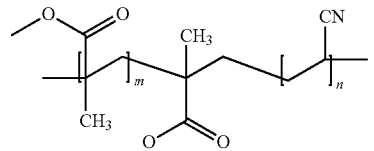
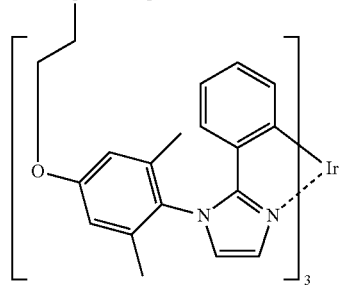

[Chem. 64]
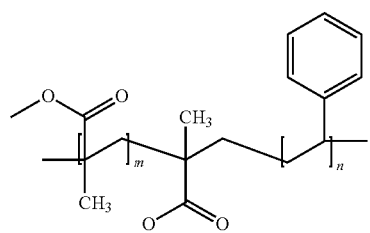
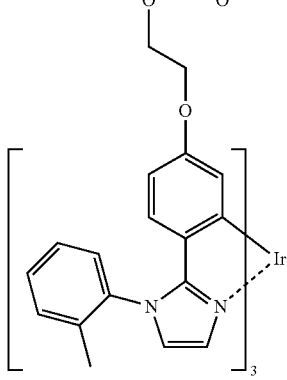
Ir-40
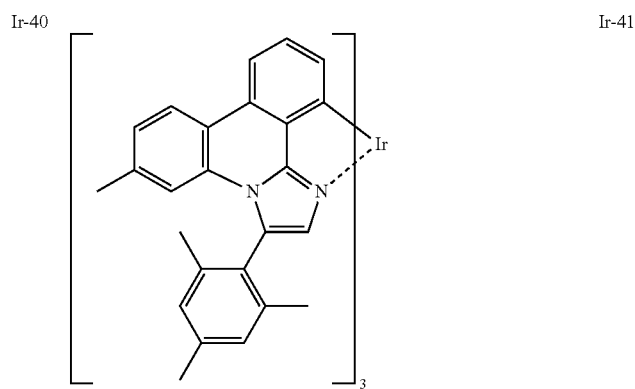
Ir-41
Ir-42
Ir-43
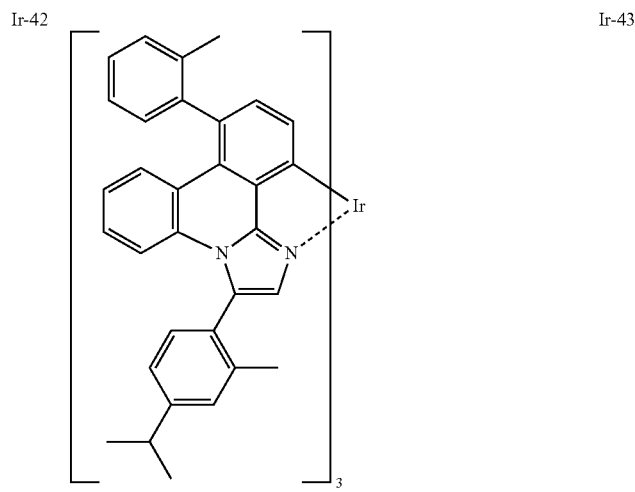
Ir-44
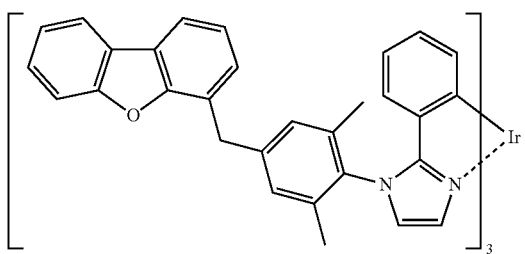
Ir-45
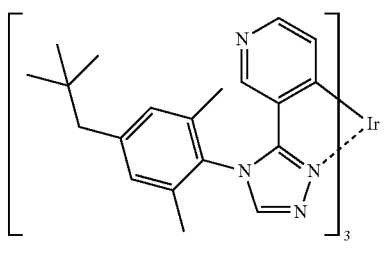

[Chem. 65]

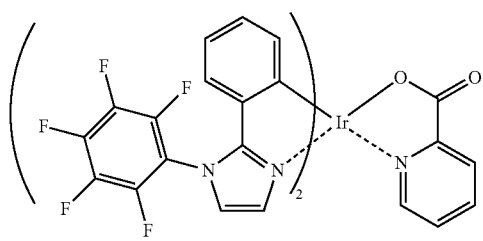
Ir-46

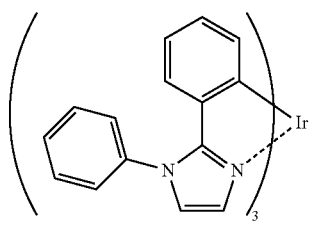
Ir-47

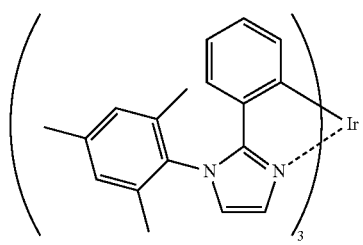
Ir-48

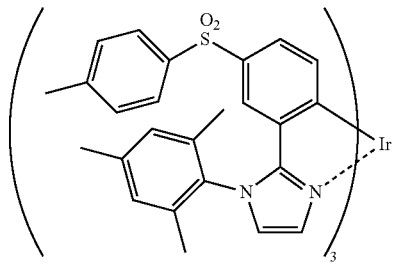
Ir-49

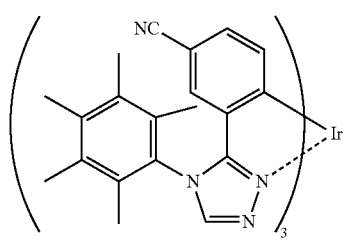
Ir-50

The aforementioned phosphorescent compounds (also referred to as phosphorescent metal complexes and the like) can be synthesized by employing methods described in documents such as Organic Letter, vol. 3, No. 16, pp. 2579-2581 (2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescent Material)

Examples of the fluorescent material include a coumarin-based dye, a pyran-based dye, a cyanine-based dye, a croconium-based dye, a squarylium-based dye, an oxobenzanthracene-based dye, a fluorescein-based dye, a rhodamine-based dye, a pyrylium-based dye, a perylene-based dye, a stilbene-based dye, a polythiophene-based dye, or a rare earth complex-based fluorescent material or the like.

[Injection Layer: Positive Hole Injection Layer 3a, Electron Injection Layer 3e]

The injection layer is a layer disposed between an electrode and the light emitting layer 3c in order to decrease a driving voltage and to improve luminance of light emitted, which is described in detail in Part 2, Chapter 2 "Denkyoku Zairyo" (pp. 123-166) of "Yuki EL Soshi To Sono Kogyoka Saizensen (Nov. 30, 1998, published by N.T.S Co., Ltd.)", and examples thereof include a positive hole injection layer 3a and an electron injection layer 3e.

The injection layer is provided as necessary. The positive hole injection layer 3a may be present between an anode and the light emitting layer 3c or the positive transport layer 3b, and the electron injection layer 3e may be present between a cathode and the light emitting layer 3c or the electron transport layer 3d.

The positive hole injection layer 3a is also described in detail in documents such as Japanese Patent Application Laid-Open Publication Nos. 09-45479, 09-260062 and 08-288069, and examples thereof include a phthalocyanine layer represented by copper phthalocyanine, an oxide layer represented by vanadium oxide, an amorphous carbon layer, a polymer layer using a conductive polymer such as polyaniline (emeraldine) or polythiophene and the like.

The electron injection layer 3e is also described in detail in documents such as Japanese Patent Application Laid-Open Publication Nos. 06-325871, 09-17574 and 10-74586, and examples thereof include: a metal layer represented by strontium or aluminum, an alkali metal halide layer represented by potassium fluoride, an alkali earth metal compound layer represented by magnesium fluoride, an oxide layer represented by molybdenum oxide and the like. It is preferable that the electron injection layer 3e of the present invention is a very thin film, and the thickness thereof is within a range of 1 nm to 10 μm although it depends on the material thereof.

[Positive Hole Transport Layer 3b]

The positive hole transport layer 3b is formed of a positive hole transport material having a function of transporting positive holes, and a positive hole injection layer 3a and an electron blocking layer are also included in the positive hole transport layer 3b in the broad sense of the word. The positive hole transport layer 3b may be provided as a sole layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer, particularly, a thiophene oligomer and the like.

Those described above can be used as the positive hole transport material. However, it is preferable to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, for instance, 4,4'-bis[N-(1-naphthyl)-N-phenylamino]biphenyl (NDP), 4,4',4"-tris[N-(3-methylphenyl)-N-phenylamino]triphenylamine (MTDATA) in which three triphenylamine units are bonded in a star burst form described in Japanese Patent Application Laid-Open Publication No. 04-308688 and the like.

Furthermore, polymer materials in which these materials are introduced into a polymer chain or constitute a main chain of a polymer can also be used. Moreover, inorganic compounds such as a p type-Si and a p type-SiC can also be used as the positive hole injection material and the positive hole transport material.

In addition, it is also possible to use so-called p type positive hole transport materials described in documents such as Japanese Patent Application Laid-Open Publication No. 11-251067 and Applied Physics Letters 80 (2002), p. 139 by J. Huang et. al. In the present invention, it is preferable to use these materials in view of producing a light emitting element having high efficiency.

The positive hole transport layer $3b$ can be formed by making the aforementioned positive hole transport material a thin film by a well-known method such as the vacuum evaporation method, the spin coating method, the casting method, the printing method including the ink-jet method or the LB method. The thickness of the positive hole transport layer $3b$ is not particularly limited, but the thickness is generally within a range about of 5 nm to 5 μm, preferably within a range of 5 nm to 200 nm. This positive hole transport layer $3b$ may have a single layer configuration constituted of one or two or greater of the aforementioned materials.

Furthermore, it is possible to enhance the p property by doping the material of the positive hole transport layer $3b$ with impurities. Examples include those described in documents such as Japanese Patent Application Laid-Open Publication Nos. 04-297076, 2000-196140, 2001-102175 and J. Appl. Phys., 95, 5773 (2004).

As described above, it is preferable that enhancement of a high p property of the positive hole transport layer $3b$ makes it possible to produce an element which consumes lower electric power.

[Electron Transport Layer $3d$]

The electron transport layer $3d$ is formed of a material having a function of transporting electrons, and, in a broad sense, the electron injection layer $3e$ and a positive hole blocking layer (not shown) are involved in the electron transport layer $3d$. The electron transport layer $3d$ can be provided as a single layer or a laminated layer of a plurality of layers.

In the electron transport layer $3d$ having a single layer configuration and the electron transport layer $3d$ having a laminated layer configuration, the electron transport material constituting a layer provided adjacent to the light emitting layer $3c$ has a function of transporting electrons injected from the cathode to the light emitting layer $3c$. The material to be used can be optionally selected from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the aforementioned oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer $3d$. Moreover, polymer materials in which these materials are introduced into a polymer chain or constitute a main chain of a polymer can also be used.

Additionally, metal complexes of an 8-quinolinol derivative such as: tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq), and metal complexes in which the central metal of the these metal complexes is substituted by In, Mg, Cu, Ca, Sn, Ga or Pb can also be used as the material of the electron transport layer $3d$.

Other than the above, a metal-free or metalphthalocyanine and those in which the terminals thereof are substituted by an alkyl group, a sulfonic acid group or the like can be preferably used as the material of the electron transport layer $3d$. Moreover, the distyrylpyrazine derivative mentioned as an example of the material of the light emitting layer $3c$ can also be used as the material of the electron transport layer $3d$. In the same way as the positive hole injection layer $3a$ and the positive hole transfer layer $3b$, inorganic semiconductors such as an n type-Si and an n type-SiC can also be used as the material of the electron transport layer $3d$.

The electron transport layer $3d$ can be formed by thinning the aforementioned electron transport material by a well-known method such as the vacuum evaporation method, the spin coating method, the casting method, the printing method including the ink-jet method or the LB method. The thickness of the electron transport layer $3d$ is not particularly limited, but the thickness is generally within a range of 5 nm to 5 μm, preferably within a range of 5 nm to 200 nm. This electron transport layer 3d may have a single layer configuration constituted of one or two or greater kinds of the aforementioned materials.

Furthermore, it is possible to enhance the n property by doping the material of the electron transport layer 3d with impurities. Examples thereof include those described in documents such as Japanese Patent Application Laid-Open Publication Nos. 04-297076, 10-270172, 2000-196140 and 2001-102175 and J. Appl. Phys., 95, 5773 (2004). Moreover, it is preferable to introduce potassium or a potassium compound into the electron transport layer 3d. Examples of the potassium compound that can be used include, for example, potassium fluoride, and the like. As described above, by enhancement of an n property of the electron transport layer 3d, an element which consumes lower electric power can be produced.

Alternatively, the equivalents to the above material of the nitrogen-containing layer 1a may be also available for the material of the electron transport layer 3d (electron transport compound). This would be similar to the electron transport layer 3d concurrently serving as the electron injection layer 3e, and therefore, the equivalents to the above material of the nitrogen-containing layer 1a is also available.

[Blocking Layer: Positive Hole Blocking Layer, Electron Blocking Layer]

The blocking layer is provided as necessary in addition to the basic constituent layers of thin organic compound films described above. Examples thereof include a positive hole blocking layer described in documents such as Japanese Patent Application Laid-Open Publication Nos. 11-204258, 11-204359, and p. 237 of "Yuki EL Soshi To Sono Kogyoka Saizensen (Organic EL Element and Front of Industrialization thereof) (Nov. 30, 1998, published by N.T.S Co., Ltd.)", and the like.

The positive hole blocking layer has a function of the electron transport layer 3d in a broad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 3d described below can be used as the positive hole blocking layer according to the present invention. It is preferable that the positive hole blocking layer be disposed adjacent to the light emitting layer 3c.

On the other hand, the electron blocking layer has a function as the positive hole transport layer 3b in a broad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 3b described below can be applied to the electron blocking layer. The thickness of the positive hole blocking layer according to the present invention is preferably 3 to 100 nm, more preferably 5 to 30 nm.

[Auxiliary Electrode 15]

An auxiliary electrode 15 is provided in order to lower an electric resistance of the transparent electrode 1 and is provided in contact with the electrode layer 1b of the transparent electrode 1. As a material forming the auxiliary electrode 15, a metal having a low electric resistance such as gold, platinum, silver, copper or aluminum is preferable. These metals may be patterned within a range not affecting the extraction of the emitted light h from a light extraction surface 13a due to the low light transmission property. Examples of a method for forming the auxiliary electrode 15 include the vapor evaporation method, the sputtering method, the printing method, the ink-jet method, an aerosol jet method and the like. It is preferable that the line width of the auxiliary electrode 15 is 50 µm or less in view of an aperture ratio for the light extraction, and the thickness of the auxiliary electrode 15 is 1 µm or greater in view of electric conductivity.

[Sealing Material 17]

A transparent sealing material 17 is a material for covering the organic electroluminescent element EL-1, and may be a plate-like (film-like) sealing member which is fixed to a substrate 13 by an adhesive 19, or may be a sealing membrane. The transparent sealing material 17 is provided in a state in which the terminal portions of transparent electrode 1 and the counter electrode 5-1 of the organic electroluminescent element EL-1 are exposed and at least the light emitting functional layer 3 is covered. Alternatively, the transparent sealing material 17 may be constituted so that an electrode is provided on the transparent sealing material 17, and the electrode is electrically conducted with the terminal portions of transparent electrode 1 and the counter electrode 5-1 of the organic electroluminescent element EL-1.

Specific examples of the plate-like (film-like) transparent sealing material 17 include a glass substrate, a polymer substrate, a metal substrate, and the transparent sealing material 17 may be used by making these substrates into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone and the like. The metal substrate can include the one obtained by using one or greater metals or alloys selected from the group consisting of stainless steel, iron, copper, aluminum, magnesium, nickel, zinc, chromium, titanium, molybdenum, silicon, germanium and tantalum.

Among them, from the viewpoint of being able to thin the element, the polymer substrate or the metal substrate in the form of a thin film is preferably used as a sealing material.

Furthermore, the polymer substrate in the form of a thin film preferably has an oxygen transmittance measured in accordance with the method of JIS-K-7126-1987 of $1 \times 10^{-3}$ ml/(m²·24 hr·atm) or less and a water vapor transmittance (25±0.5° C., relative humidity (90±2) % RH) measured in accordance with the method of JIS-K-7129-1992 of $1 \times 10^{-3}$ g/(m²·24 hr) or less.

Moreover, the above substrate material may also be processed into the form of a recessed plate to thereby be used as the sealing material 17. In this case, processing such as sandblast processing or chemical etching processing is performed on the substrate member to thereby form recessed portions.

In addition, the adhesive 19 for fixing the plate-like sealing material 17 to the transparent substrate 13 is also used as a sealant for sealing the organic electroluminescent element EL-1 sandwiched between the transparent sealing material 17 and the substrate 13. Examples of the adhesive 19 can include a photo curable and thermosetting-type adhesive such as an acrylic acid-based oligomer or methacrylic acid-based oligomer having a reactive vinyl group, a moisture curable type adhesive such as 2-cyanoacrylic acid ester and the like.

In addition, examples of the adhesive 19 can include a thermosetting or chemical curable (two liquids mixing type) adhesive such as epoxy-based adhesive. Furthermore, there can be included a hot-melt type adhesive such as polyamide, polyester, polyolefin, or the like. Moreover, there can be included an ultraviolet curable-type epoxy resin adhesive of cationic curable-type.

Meanwhile, there is a case in which the organic materials constituting the organic electroluminescent element EL-1 degrade through heat treatment. Therefore, it is preferable that the adhesive 19 can be adhered and cured at temperatures from room temperature to 80° C. In addition, a drying agent may be dispersed in the adhesive 19.

Coating of the adhesive 19 on the adhesion portion of the sealing material 17 and the transparent substrate 13 may be carried out using a commercially available dispenser, or by printing such as screen-printing.

Furthermore, when a gap is formed among the plate-like sealing material 17 and the transparent substrate 13 and the adhesive 19, it is preferable to inject an inert gas such as nitrogen or argon, or an inert liquid such as a fluorinated hydrocarbon or a silicone oil to the gap, in gaseous phase and liquid phase. It is possible to be set vacuum. Furthermore, it is possible to enclose a hydroscopic compound into the gap.

Examples of the hydroscopic compound include, for instance, a metal oxide (for example, sodium oxide, potassium oxide, calcium oxide, barium oxide, magnesium oxide, aluminum oxide and the like), a sulfate (for example, sodium sulfate, calcium sulfate, magnesium sulfate, cobalt sulfate and the like), a metal halide (for example, calcium chloride, magnesium chloride, cesium fluoride, tantalum fluoride, cesium brominate, magnesium brominate, barium iodide, magnesium iodide and the like), a perchloric acid (for example, barium perchloric acid salt, magnesium perchloric acid salt and the like), and the like. In the sulfate, metal halide and the perchloric acid, an anhydrous salt is suitably used.

In contrast, when using the sealing membrane as the sealing material 17, the sealing membrane is formed on the transparent substrate 13 in a state in which the light emitting functional layer 3 of the organic electroluminescent element EL-1 is completely covered and the terminal portions of the transparent electrode 1 and the counter electrode 5-1 of the organic electroluminescent element EL-1 are exposed.

The sealing membrane is constituted using an inorganic material or an organic material. Particularly, the sealing membrane should be constituted by a material having function of suppressing the immersion of a substance which causes degradation of the light emitting functional layer 3 in the organic electroluminescent element EL-1, such as moisture and oxygen. There is used as such a material, for example, an inorganic material such as silicon oxide, silicon dioxide or silicon nitride. Furthermore, in order to improve its fragility of the sealing membrane, a laminated structure may be formed by using a membrane formed of an organic material, in addition to the membrane formed of the inorganic material.

The method for forming the membranes is not particularly limited, and there can be used, for example, a vacuum deposition method, a sputtering method, a reactive sputtering method, a molecular beam epitaxy method, a cluster ion beam method, an ion plating method, a plasma polymerization method, an atmospheric plasma polymerization method, a plasma CVD method, a laser CVD method, a heat CVD method, a coating method, and the like.

[Protective Membrane, Protective Plate]

Meanwhile, although the illustration here is omitted, a protective membrane or a protective plate may be provided by sandwiching the organic electroluminescent element EL and the sealing material 17 between the transparent substrate 13. The protective membrane or the protective plate is to mechanically protect the organic electroluminescent element EL, and particularly when the sealing material 17 is the protective membrane, it is preferable to provide the protective membrane or the protective plate since the mechanical protection of the organic electroluminescent element EL is not sufficient.

Examples of the protective membrane or the protective plate to be applied include a glass plate, a polymer plate, a thinner polymer film, a metal plate, a thinner metal plate, or a membrane of polymer material and a membrane of metal material. Among them, from the viewpoint of light weight and small thickness, the polymer film is preferably used.

[Production Method of Organic Electroluminescent Element EL-1]

Here, as one embodiment, the manufacturing method of the organic electroluminescent element EL-1 shown in FIG. 3 will be explained.

First, a nitrogen-containing layer 1a of the compound containing nitrogen atoms is deposited on the top of a transparent substrate 13 by any suitable technique, such as vapor-deposition technique, to have a thickness of 1 micrometer or less, and preferably from 10 nm to 100 mm. Next, an electrode layer 1b of silver (or an alloy having silver as the main component) is deposited on the upper side of the nitrogen-containing layer 1a by any suitable technique, such as vapor-deposition technique, to have a thickness of 12 nm or less, preferably from 4 nm to 9 nm to form the transparent electrode 1 serving as an anode.

Next, the light emitting functional layer 3 was formed on the transparent electrode by the formation of a positive hole injection layer 3a, a positive hole transport layer 3b, a light emitting layer 3c, an electron transport layer 3d and an electron injection layer 3e in the order. There are employed, for the film formation of the layers, a spin coating method, a casting method, an inkjet printing method, an evaporation method, a printing method, and the like. From the viewpoints of obtaining a homogeneous membrane easily, of not generating a pinhole easily and the like, the vacuum deposition method or the spin coating method is particularly preferable. In addition, a different film forming method may be employed to each layer. When employing the evaporation method for film formation of each layer, although the evaporation conditions are varied depending on the kind of the compound to be used, it is desirable to select each condition optionally within the ranges of a heating temperature of boat for housing a compound of 50° C. to 450° C., a degree of vacuum of $10^{-6}$ Pa to $10^{-2}$ Pa, a deposition rate of 0.01 nm/sec. to 50 nm/sec., a temperature of substrate of −50° C. to 300° C., and a thickness of membrane of 0.1 μm to 5 μm.

After formation of the light emitting functional layer 3 as describe above, a counter electrode 5-1 serving as a cathode is formed in the upper portion thereof by an appropriate film formation method such as an evaporation method and a sputtering method. At this time, the counter electrode 5-1 is patterned into a shape in which the terminal part is extracted from the upper part of the light emission functional layer 3 to the peripheral edge of the transparent substrate 13 while keeping an insulating state with respect to the transparent electrode 1 by the light emission functional layer 3. This results in obtaining the organic electroluminescent element EL-1. Furthermore, after that, the sealing member 17 is provided covering at least the light emission functional layer 3 in a state in which the terminal parts of the transparent electrode 1 and the counter electrode 5-1 in the organic electroluminescent element EL-1 are exposed.

By the above procedures, a desired organic electroluminescent element EL-1 is obtained on the transparent substrate 13. In the production of the organic electroluminescent element EL-1, although it is preferable to perform production consistently from the light emitting functional layer 3 to the counter electrode 5-1 through one-time vacuum drawing, it may be possible that the transparent substrate 13 is extracted from the vacuum atmosphere to thereby be subjected to other different film formation. At this time, it is necessary to consider that the procedures are carried out under a dry inert gas atmosphere.

In the case of applying a direct voltage to the organic electroluminescent element EL-1 thus obtained, while setting the counter electrode 5-1 of the anode as + polarity and the electrode layer 1b of the cathode as − polarity, a light emission can be observed when applying a voltage of 2 V or greater to 40 V or less to the electrodes. In addition, an alternating voltage may be applied. Meanwhile, a waveform of the alternating voltage to be applied may be optional.

<Effects of Organic Electroluminescent Element EL-1>

The aforementioned organic electroluminescent element EL-1 has the configuration in which the transparent electrode 1 of the present invention having both electrical conductivity and light transmission property is used as the anode, and the light emitting functional layer 3 and the counter electrode 5-1 serving as the cathode are provided in this order thereon. Accordingly, while a light emission with a high luminance of the organic electroluminescent element EL-1 can be implemented by applying a sufficient voltage between the transparent electrode 1 and the counter electrode 5-1, it is possible to achieve a high luminance by enhancing an extraction efficiency of the emitted light h from the transparent electrode 1. Furthermore, it is also possible to achieve enhancement of emission life by reducing a driving voltage for obtaining a given luminance.

<<4. Second Embodiment of Organic Electroluminescent Element>>

<Configuration of Organic Electroluminescent Element>

Figure 4:
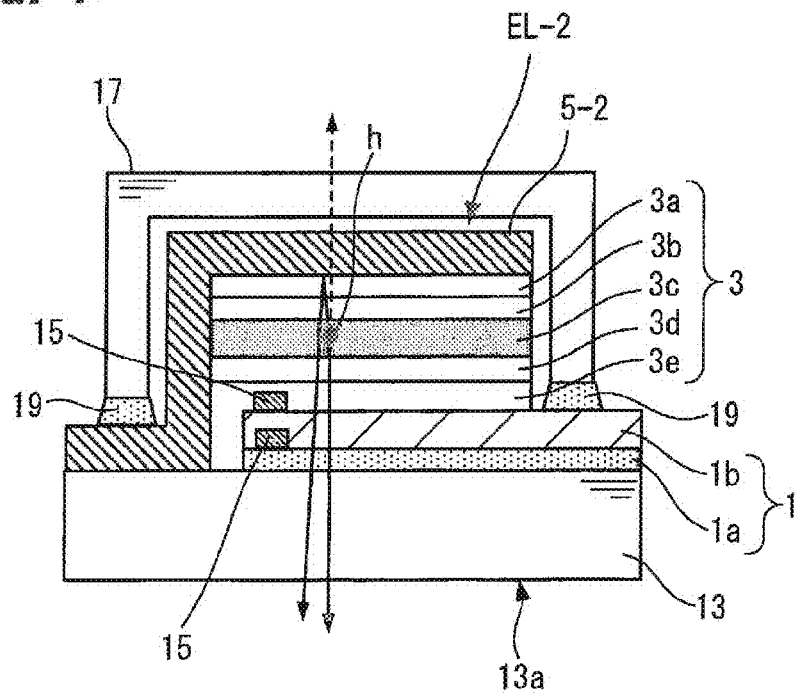
FIG. 4 is a cross-sectional configuration view illustrating a second example of the organic electroluminescent element constituted by using the transparent electrode of the present invention.

FIG. 4 is a cross-sectional configuration view illustrating the second embodiment of the organic electroluminescent element obtained by using the aforementioned transparent electrode as one example of the electronic device according to the present invention. The different point of the second organic electroluminescent element EL-2 shown in FIG. 4 from the organic electroluminescent element EL-1 explained using FIG. 3 is that the transparent electrode 1 is used as the cathode. Hereinafter, the repeated explanation as to the same constituent elements as the first embodiment will be omitted and the characteristic configurations of the second organic electroluminescent element EL-2 will be explained.

The organic electroluminescent element EL-2 shown in FIG. 4, which is formed on the top of a transparent substrate 13, is characterized in that, the transparent electrode 1 of the present invention abovementioned is used as the transparent electrode 1 on the transparent substrate 13 as described in the first example. Thus, the organic electroluminescent element EL-2 is constituted to extract the emitted light h at least from the transparent substrate 13 side. However, the transparent electrode 1 is utilized as a cathode (negative terminal). Therefore, the counter electrode 5-2 is used as an anode.

The layer configuration of the organic electroluminescent element EL-2 is not limited, and a general layer configuration may be used in the same way as in the first embodiment. As one example in the case of the present second embodiment, a configuration is exemplified in which the electron injection layer 3e/electron transport layer 3d/light emitting layer 3c/positive hole transport layer 3b/positive hole injection layer 3a are laminated in this order in the upper portion of the transparent electrode 1 having a function as a cathode. However, among these, it is essential to have, at least, the light emitting layer 3c formed of an organic material.

Meanwhile, various configurations are employed, as necessary, as the light emitting functional layer 3, other than the layers in the same way as that explained in the first embodiment. In the aforementioned configurations, in the same way as in the first embodiment, only the portion in which the light emitting functional layer 3 is sandwiched between the transparent electrode 1 and the counter electrode 5-2 serves as the light emitting region in the organic electroluminescent element EL-2.

Furthermore, in the above layer configuration, in the same way as in the first embodiment, in order to lower the electric resistance of the transparent electrode 1, the auxiliary electrode 15 may be provided in contact with the electrode layer 1b of the transparent electrode 1.

The counter electrode 5-2 used herein as an anode may include a metal, an alloy, an electrically conductive organic or inorganic compound, and a mixture thereof. Specific examples include a metal such as gold (Au), copper iodide (CuI), an oxide semiconductor such as ITO, ZnO, TiO2 or SnO2 and the like.

The above counter electrode 5-2 can be produced by forming a thin film from the electric conductive material by using a method such as vapor evaporation or sputtering. Furthermore, the sheet resistance of the counter electrode 5-2 is preferably several hundred Ω/sq. or less, and the thickness is generally selected from the range of 5 nm to 5 µm, preferably within the range of 5 nm to 200 nm.

Meanwhile, in the case where the organic electroluminescent element EL-2 is the type that extracts the emitted light h also from the counter electrode 5-2, an electrically conductive material having a good light transmission property may be selected as the material constituting the counter electrode 5-2, among the aforementioned electrically conductive materials.

The organic electroluminescent element EL-2 having the above configuration is sealed with a sealing material 17 in the same way as in the first example in order to prevent deterioration of the light emitting functional layer 3.

Among these main layers of the organic electroluminescent element EL-2 described above, the detailed configuration of the constituent elements excluding the counter electrode 5-2 used as an anode and the method for manufacturing the organic electroluminescent element EL-2 are similar to the ones described in the first example. Therefore, the detailed explanation is omitted.

<Effects of Organic Electroluminescent Element EL-2>

The aforementioned organic electroluminescent element EL-2 has a configuration in which the transparent electrode 1 of the present invention having both electrical conductivity and light transmission property is used as a cathode, and the light emitting functional layer 3 and the counter electrode 5-2 serving as the anode are provided in the upper portion thereof. Accordingly, in the same way as in the first embodiment, while a light emission with a high luminance of the organic electroluminescent element EL-2 can be implemented by applying a sufficient voltage between the transparent electrode 1 and the counter electrode 5-1, it is possible to achieve a high luminance by enhancing an extraction efficiency of the emitted light h from the transparent electrode 1. Furthermore, it is also possible to achieve improvement of emission life by reducing a driving voltage for obtaining a given luminance.

<5. Third Embodiment of Organic Electroluminescent Element>>
<Configuration of Organic Electroluminescent Element>

Figure 5:
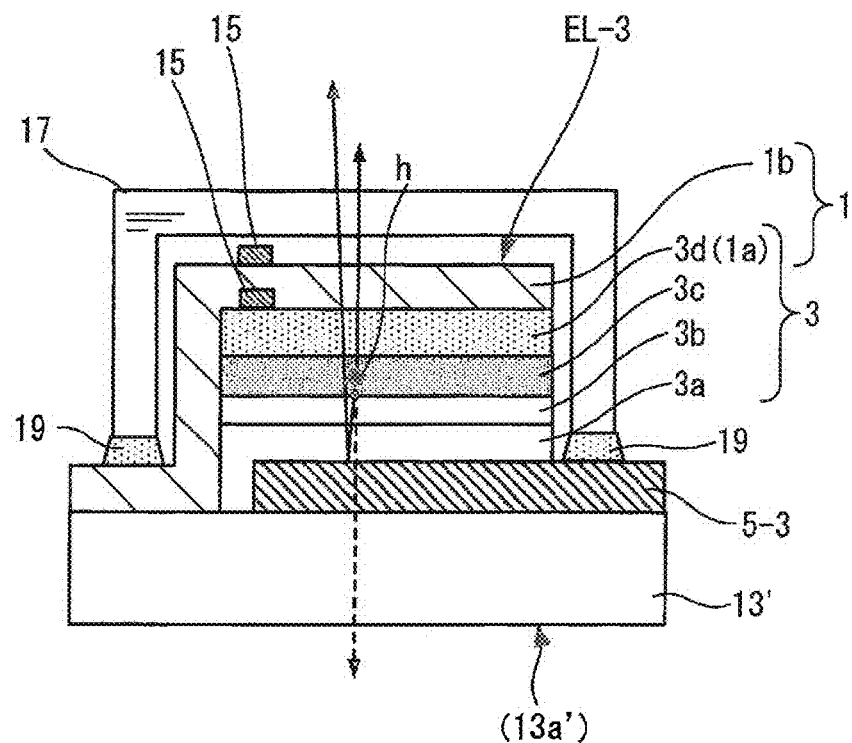
FIG. 5 is a cross-sectional configuration view illustrating a third example of the organic electroluminescent element constituted by using the transparent electrode of the present invention.

FIG. 5 shows a cross-sectional configuration view of the third embodiment of the organic electroluminescent element using the aforementioned transparent electrode as one example of the electronic device according to the present invention. The different point of the organic electroluminescent element EL-3 of the third embodiment shown in FIG. 5 from the organic electroluminescent element EL-1 of the first embodiment explained by using FIG. 3 is that a counter electrode 5-3 is provided on the substrate 13' side and a light emitting functional layer 3 and a transparent electrode 1 are laminated in this order in the upper portion thereof. Hereinafter, the repeated explanation as to the same elements as the first embodiment will be omitted and the characteristic configurations of the organic electroluminescent element EL-3 of the third embodiment will be explained.

The organic electroluminescent element EL-3 shown in FIG. 5 is provided on the substrate 13', and from the substrate 13' side, there are laminated the counter electrode 5-3 serving as an anode, the light emitting functional layer 3 and the transparent electrode 1 serving as a cathode in this order. In the configuration, the characteristic is the use of the aforementioned transparent electrode 1 of the present invention as the transparent electrode 1. Accordingly, the organic electroluminescent element EL-3 is constituted so that an emitted light h is extracted from at least the transparent electrode 1 side opposite to the substrate 13'.

The layer configuration of the organic electroluminescent element EL-3 is not limited, and a general layer configuration may be used in the same way as in the first embodiment. As one example in the case of the present third embodiment, a configuration is exemplified in which the positive hole injection layer 3a/the positive hole transport layer 3b/the light emitting layer 3c/the electron transport layer 3d are laminated in this order in the upper portion of the counter electrode 5-3 having a function as an anode. Among the layers, it is essential to include at least the light emitting layer 3c constituted using organic materials. Furthermore, the electron transport layer 3d, which also serves a function of the electron injection 3e, is provided as the electron transport layer 3d having electron injection property.

In addition, particularly, the distinctive configuration of the third example of the organic electroluminescent element EL-3 is characterized in that the electron transport layer 3d having the electron injection property is provided as the nitrogen-containing layer 1a in the transparent electrode 1. Namely, in the third example, the transparent electrode 1 used as the cathode is constituted by the nitrogen-containing layer 1a that doubles as the electron transport layer 3d having the electron injection property, and the electrode layer 1b provided in the upper portion of the nitrogen-containing layer 1a.

An important point is that the electron transport layer 3d is constituted using the materials constituting the nitrogen-containing layer 1a in the aforementioned transparent electrode 1 as described above.

Meanwhile, other than these layers, as to the light emitting functional layer 3, various configurations are employed as necessary, as described in the first example, but the electron injection layer or the positive hole blocking layer is not provided between the electron transport layer 3d that doubles as the nitrogen-containing layer 1a in the transparent electrode 1, and the electrode layer 1b in the transparent electrode 1. Such a configuration is the same as that in the first example in that only a part where the light emitting functional layer 3 is sandwiched by the transparent electrode 1 and the counter electrode 5-3 serve as an emitting region in the organic electroluminescent element EL-3.

Furthermore, in the layer configuration, the fact that an auxiliary electrode 15 may be also provided in contact with the electrode layer 1b of the transparent electrode 1 in order to achieve the decrease in resistance of the transparent electrode 1 is the same as in the first example.

Moreover, in the counter electrode 5-3 used as the anode, a metal, an alloy, an organic or inorganic conductive material and the mixture thereof are used. Specifically, the counter electrode 5-3 includes a metal such as gold (Au), copper iodide (CuI), and an oxide semiconductor such as ITO, ZnO, TiO2, SnO2 and the like.

Such counter electrode 5-3 can be produced by the formation of a thin film through the method such as vapor deposition, sputtering or the like. In addition, the counter electrode 5-3 may preferably have superior sheet resistance of several hundreds of ohms per square or less and a film thickness is selected in the range of ordinarily 5 nm to 5 μm, and of preferably 5 nm to 200 nm.

Meanwhile, when the organic electroluminescent element EL-3 extracts the emitted light h from the side of the counter electrode 5-3, the material constituting the counter electrode 5-3 may be used by selection of a conductive material having high light transmittance among the above conductive materials. In addition, in this case, the similar one to the transparent substrate 13 described in the first example can be used as the substrate 13', and the surface outward from the substrate 13' serves as the light extraction surface 13a'.

<Effects of Organic Electroluminescent Element EL-3>

The organic electroluminescent element EL-3 has a configuration in which a transparent electrode 1 formed of the nitrogen-containing layer 1a and the electrode layer 1b is provided as a cathode by setting, as a nitrogen-containing layer 1a, an electron transport layer 3d having an electron injection property, constituting the uppermost part of a light emitting functional layer 3 and by providing an electrode layer 1b in the upper portion thereof. Accordingly, in the same way as in the first and second examples, while a light emission with a high luminance of the organic electroluminescent element EL-3 is implemented by applying a sufficient voltage between the transparent electrode 1 and the counter electrode 5-3, it is possible to achieve a high luminance by enhancing an extraction efficiency of the emitted light h from the transparent electrodes 1. Furthermore, it is also possible to achieve improvement of emission life by reducing a driving voltage for obtaining a given luminance. In addition, in such a configuration, when the counter electrode 5-3 has high light transmitting property, the emitted light h can be also extracted from the counter electrode 5-3.

Meanwhile, it has been described in the third example that the nitrogen-containing layer 1a of the transparent electrode 1 is constituted so as to double as the electron transport layer 3d having an electron injection property. However, the nitrogen-containing layer 1a may double as the electron injection layer or may double as the electron transport layer 3*d* having no electron injection property, and the nitrogen-containing layer 1*a* may have neither the electron transport nor the electron injection property when the nitrogen-containing layer 1*a* is provided as an ultra-thin film to the extent that no effect is produced on the emitting function.

Furthermore, in the case where the nitrogen-containing layer 1*a* is provided as an ultra-thin film to the extent that no effect is produced on the emitting function, the counter electrode on the side of the substrate 13' may be used as a cathode, while the transparent electrode 1 on the side of the light emitting functional layer 3 may be used as an anode. In this case, in the light emitting functional layer 3, there are laminated, for example, the electron injection layer 3*e*/electron transport layer 3*d*/light emitting layer 3*c*/positive hole transport layer 3*b*/positive hole injection layer 3*a*, in this order from the side of the counter electrode (cathode), on the substrate 13'. In addition, the transparent electrode 1 in the form of a laminated structure formed of the ultrathin nitrogen-containing layer 1*a* and the electrode layer 1*b* is provided as an anode, in the upper portion of the light emitting functional layer 3. Such a nitrogen-containing layer 1*a* may be used as a nitrogen-containing layer doubling as the positive hole transport layer or the positive hole injection layer, by using the compound containing nitrogen atoms having a positive hole transport or positive hole injection property. Alternatively, the transparent electrode 1 may be used together with the anode and the cathode. In this case, a transparent substrate is used as the substrate on which the transparent electrode 1 being the cathode is provided, and the emitted light h is extracted from both sides of the anode and the cathode.

<<6. Use of Organic Electroluminescent Element>>

The organic electroluminescent elements having the aforementioned various configurations are surface emitting elements, and thus are usable for light emitting sources of various types. Examples include, but are not limited to, a lighting device such as a home lighting device or a car lighting device, a backlight for a timepiece or a liquid crystal, a signboard for advertisement, a light source for a signal, a light source for an optical storage medium, a light source for an electrophotographic copier, a light source for an optical communication processor, a light source for an optical sensor, and the like. Particularly, it can be effectively used as a backlight for a liquid crystal display device which is combined with a color filter and as a light source for lighting.

Furthermore, the organic electroluminescent element may be used as a kind of lamp such as a lighting device or an exposure light source, or may be used as a projection device of an image projecting type, or a display of a type by which a still image or moving image is visually recognized directly. In this case, a light emitting surface area may be enlarged by so-called tiling in which light emitting panels provided with the organic electroluminescent element are combined flatly in response to the recent increasing in size of a lighting device and a display device.

When using the organic electroluminescent element as a display device for reproducing a moving image, a driving system is either a simple matrix (passive matrix) system or active matrix system. When using two or greater kinds of the organic electroluminescent element according to the present invention having a different emission color, it is possible to produce a color or full color display device.

Hereinafter, a lighting device will be explained as one example of the uses, and next, a lighting device having an emission area enlarged by tiling will be explained.

<<7. Lighting Device-1>>

The lighting device of the present invention has the aforementioned organic electroluminescent element.

An organic electroluminescent element used in the lighting device according to the present invention may be designed so as to impart a resonator structure to the each organic electroluminescent element of the aforementioned configuration. The objects of using the organic electroluminescent element having the resonator structure include a light source for an optical storage medium, a light source for an electrophotographic copier, a light source for an optical communication processor, a light source for an optical sensor, and the like, but is not limited thereto. Alternatively, the organic electroluminescent element may be used for the aforementioned purpose by oscillating laser beam.

Meanwhile, the material used for the organic electroluminescent element of the present invention can be applied to an organic electroluminescent element which emits a substantial white light (also referred to as white organic electroluminescent element). For example, the simultaneous emission of a plurality of luminescent colors from a plurality of light emitting materials can also give a white color emission by color mixing. Examples of the combination of a plurality of luminescent colors may include a combination containing three maximum emission wavelengths of three primary colors of red, green and blue, or a combination containing two maximum emission wavelengths which are in a complementary color relationship such as blue and yellow, bluish green and orange, or the like.

Furthermore, combinations of light emitting materials for obtaining a plurality of luminescent colors are either a combination of a plurality of light emitting materials which emit a plurality of phosphorescence or fluorescence, or a combination of a light emitting material which emit a plurality of phosphorescence or fluorescence and a material of coloring matter which emits an excitation light from a light emitting material, and may be a combination of a plurality of light emitting dopants in the white color organic electroluminescent element.

The white color organic electroluminescent element has a configuration different from the configuration of obtaining a white color emission by arranging, in parallel, organic electroluminescent elements each of which emits an individual color light, in an array form, and the organic electroluminescent element itself can emit a white color light. Therefore, it is not necessary to use a mask for film-depositing most of layers constituting the element. Thus, for example, the electrode layer can be formed all over by an evaporation method, a casting method, a spin coating method, an ink-jet method, a printing method, and the like, which enhances productivity.

Furthermore, the materials to be used for the light emitting layers of the white color organic electroluminescent element are not particularly limited, and for example, as to a backlight in a liquid crystal display element, whiting is performed by selection and combination of arbitrary materials from among the metal complexes according to the present invention or well-known light emitting materials so as to be suited to a wavelength range corresponding to a CF (color filter) property.

By using the white color organic electroluminescent element explained above, it is possible to produce a lighting device which emits substantial white light.

<<8. Lighting Device-2>>

Figure 6:
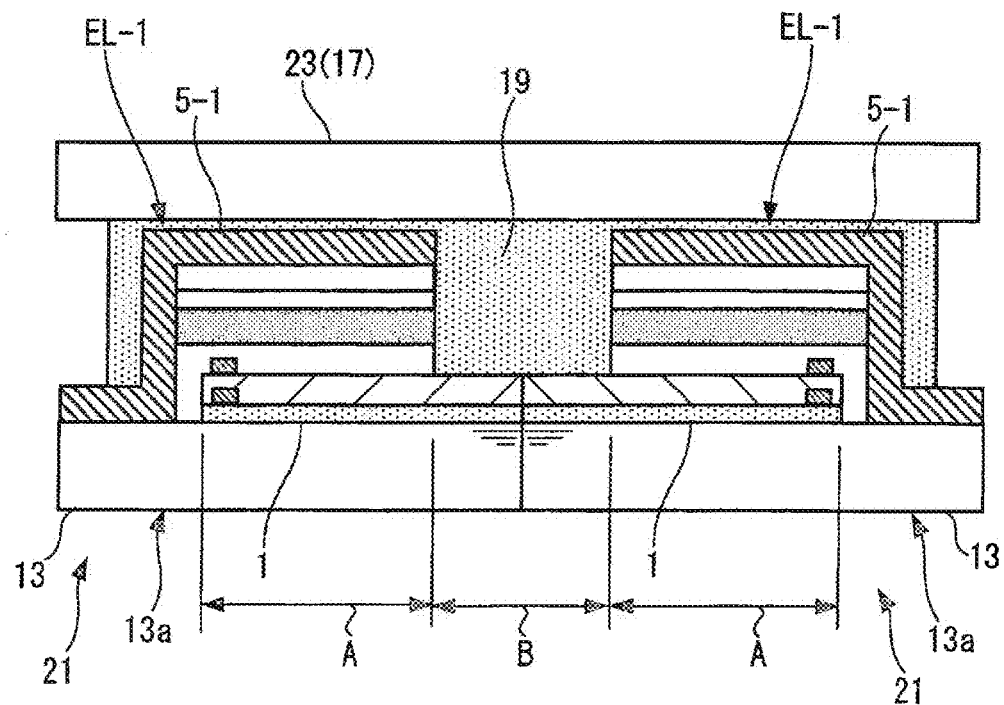
FIG. 6 is a cross-sectional configuration view of a lighting device with enlarged light-emitting surface by using the organic electroluminescent element.

FIG. 6 shows a cross-sectional configuration view of a lighting device having an enlarged light emitting area by using a plurality of organic electroluminescent elements having the above configuration. The lighting device shown in FIG. 6 has a configuration in which the enlargement of the light emitting area can be done by arranging (that is, tiling), on a support substrate 23, a plurality of light emitting panels 21 provided with the organic electroluminescent elements EL-1 on, for example, a transparent substrate 13. The support substrate 23 may also double as a sealing material 17, and the light emitting panels 21 are tiled in a state in which the organic electroluminescent elements EL-1 are sandwiched between the support substrate 23 and a transparent electrode 13 of the light emitting panel 21. The organic electroluminescent element EL-1 may be sealed by filling an adhesive 19 between the support substrate 23 and the transparent electrode 13. Meanwhile, terminals of the transparent electrode 1 being an anode and the counter electrode 5-1 being an cathode are exposed around the light emitting panel 21. However, FIG. 6 illustrates only the exposed part of the counter electrode 5-1.

In the lighting device having such a configuration, a non-light emitting region B is generated between the light emitting panels 21 since the center region of the light emitting panel 21 serves as the light emitting region A. Therefore, in order to increase an amount of light to be extracted from the non-light emitting region B, a light extraction member may be provided in the non-light emitting region B of the light extraction surface 13a. A light condensing sheet or a light diffusing sheet can be used for the light extraction member.

Example 1

<<Production of Transparent Electrode-1>>

As will be explained in the following, transparent electrodes of samples 1-1 to 1-9 were produced so as to each have an area of a conductive region of 5 cm×5 cm.

In sample 1-1 to 1-9, as shown in following Table 1, the transparent electrodes were produced each having a laminated structure of a nitrogen-containing layer constituted of each compound and an upper electrode layer using silver.

In the production of the transparent electrodes in samples 1-1 to 1-3, the following compound 10 containing nitrogen is used as a compound constituting the nitrogen-containing layer. The compound 10 is a compound included in the general formula (3).

In the production of the transparent electrodes in samples 1-4 to 1-6, the following compound 94 containing nitrogen is used as a compound constituting the nitrogen-containing layer. The compound 94 is a compound included in the general formula (3).

In the production of the transparent electrodes in samples 1-7 to 1-9, the following compound 99 containing nitrogen is used as a compound constituting the nitrogen-containing layer. The compound 99 is a compound included in the general formula (1).

[Chem. 66]

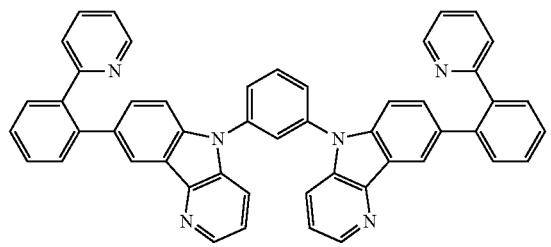

10

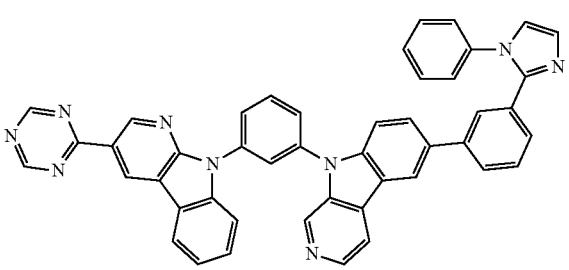

94

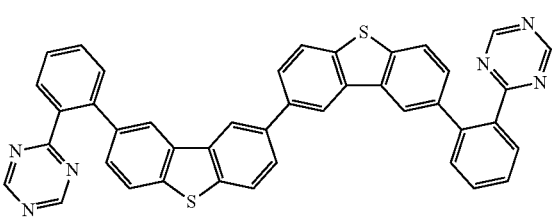

99

TABLE 1

| | Configuration of Example | | | | | |
|---|---|---|---|---|---|---|
| | Nitrogen-containing layer (film thickness 25 nm) | | Electrode layer (Ag) | Evaluation result | | |
| Sample | Material | Deposition speed (nm/s) | Film thickness (nm) | Light transmittance (at 550 nm) | Sheet resistance (Ω/sq.) | Remarks |
| 1-1 | Compound 10 | 0.07 | 8 | 62% | 12 | Comparative (FIG. 7) |
| 1-2 | | 0.3 | | 72% | 6.2 | Present invention (FIG. 8) |
| 1-3 | | 0.5 | | 73% | 7.9 | Present invention (FIG. 9) |
| 1-4 | Compound 94 | 0.02 | 12 | 52% | 12 | Comparative (FIG. 10) |
| 1-5 | | 0.3 | | 65% | 7.6 | Present invention (FIG. 11) |
| 1-6 | | 0.5 | | 69% | 7.3 | Present invention (FIG. 12) |
| 1-7 | Compound 99 | 0.02 | 12 | 49% | 15 | Comparative (FIG. 13) |
| 1-8 | | 0.3 | | 58% | 9.2 | Present invention (FIG. 14) |
| 1-9 | | 0.5 | | 62% | 8.7 | Present invention (FIG. 15) |

<Procedure for Producing Transparent Electrodes of Samples 1-1 to 1-9>

A transparent alkali-free glass substrate was fixed to a substrate holder of the commonly available vacuum deposition apparatus. A In addition, in the production of the respective transparent electrodes, each of the aforementioned compounds 10, 94 and 99 was charged into a tantalum resistive heating boat. The substrate holder and the resistive heating boats were attached to a first vacuum tank in the vacuum deposition apparatus. Furthermore, a tungsten resistive heating boat containing silver (Ag) was attached to a second vacuum tank.

In this state, after reducing a pressure of the first vacuum tank to 4×10-4 Pa, the heating boat containing the respective compound was heated by applying an electric current, and there was provided a nitrogen-containing layer formed of the respective compounds each having a thickness of 25 nm at each deposition speed (0.02 nm/s, 0.3 nm/s, or 0.5 nm/s, respectively) shown in the above Table 1.

Subsequently, the substrate obtained by forming the nitrogen-containing layer was transferred to the second vacuum tank while being kept in a vacuum atmosphere, and after reducing a pressure of the second vacuum tank to 4×10-4 Pa, the heating boat containing silver was heated by applying an electric current. Therefore, there were obtained respective transparent electrodes of Samples 1-1 to 1-9 constituted of a laminated structure of the nitrogen-containing layer and the upper electrode layer, by forming an electrode layer formed of silver having a film thickness shown in the above Table 1 (8 nm or 12 nm at a deposition rate of 0.1 nm/sec.

<Evaluation of Each Sample in Example 1-1>

With respect to each of the transparent electrodes of Samples 1-1 to 1-9 produced above, a light transmission property was measured. The light transmission property was measured by using a spectrophotometer (U-3300 manufactured by HITACHI), and the measurement was carried out by using a substrate same as the sample, as a baseline. The results were summarized in the above Table 1.

<Evaluation of Respective Samples in Example 1-2>

With respect to each of the transparent electrodes of samples 1-1 to 1-9 produced above, a sheet resistance was measured. Measurement of the sheet resistance was performed using an ohmmeter (MCP-T610 by Mitsubishi Chemical Corporation) by four terminal-four probe applied constant-current system. The results were summarized in the above Table 1.

<Evaluation Results of Example 1>

In Table 1, samples 1-1 to 1-3 each constituting the nitrogen-containing layer of the compound 10, samples 1-4 to 1-6 each constituting the nitrogen-containing layer of the compound 94, and samples 1-7 to 1-9 each constituting the nitrogen-containing layer of the compound 99 were compared with one another. The transparent electrode of samples 1-1, 1-4 and 1-7 outside the scope of the present invention, in which a deposition speed of each of the nitrogen-containing layers was 0.02 nm/s, exhibited a sheet resistance of over 10 ohms/sq. In contrast, the transparent electrode of samples 1-2, 1-5 and 1-8 of the present invention, in which a deposition speed of each of the nitrogen-containing layers was 0.3 nm/s, exhibited a lowered sheet resistance of less than 10 ohms/sq. Furthermore, the transparent electrode of samples 1-3, 1-6 and 1-9 of the present invention, in which a deposition speed of each of the nitrogen-containing layers was 0.5 nm/s, exhibited a lowered sheet resistance of less than 10 ohms/sq. As a total result, when the nitrogen-containing layers provided adjacent to the electrode layers were constituted by the same material, the faster a deposition speed of the nitrogen-containing layer was, the lower the sheet resistance was, and the higher the light transmittance was.

Accordingly, it was confirmed that the transparent electrode constituted according to the present invention had both of the high light transmittance and high electrical conductivity.

Figure 7:
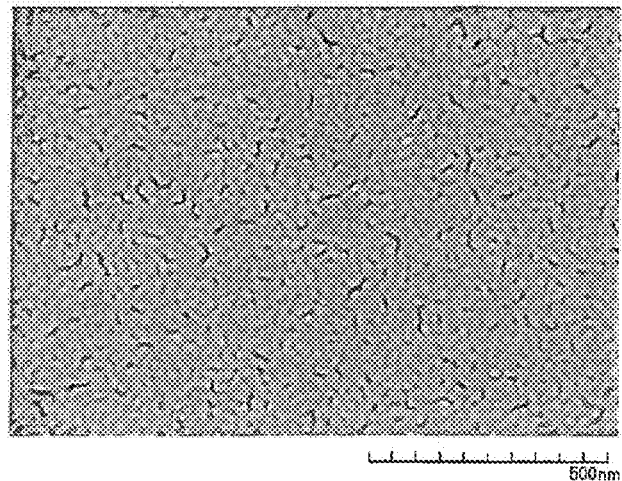
FIG. 7 is a SEM image of the transparent electrode of the sample 1-1 from Example 1.

By making a comparison among SEM images of the transparent electrodes of the samples 1-1 to 1-3 (magnifications: x hundred thousand) shown in FIGS. 7 to 9, it was proved that the deposition state of the silver membrane constituting the electrode layer was different depending on a deposition speed of the nitrogen-containing layer, as described below. FIG. 7 shows that in the transparent electrode of sample 1-1 outside the scope of the present invention, in which a deposition speed of the nitrogen-containing layer was 0.02 nm/s, silver constituting the electrode layer provided adjacent to the nitrogen-containing layer exhibits low continuity (a white portion in the image). In addition, the portion not covered with silver was remarkably confirmed (a black portion in the image). In contrast, in the transparent electrode of sample 1-2 shown in FIG. 8 having the configuration of the present invention, in which a deposition speed of the nitrogen-containing layer was 0.3 nm/s, the silver components constituting the electrode layer provided adjacent to the nitrogen-containing layer were connected to each other. Furthermore, also in the same way as in the transparent electrode of sample 1-3 shown in FIG. 9 having the configuration of the present invention, in which a deposition speed of the nitrogen-containing layer was 0.5 nm/s, the silver components constituting the electrode layer provided adjacent to the nitrogen-containing layer were connected to each other. Moreover, the transparent electrode of sample 1-3 shown in FIG. 9 also exhibited a few portion not covered with silver and the increased continuity of silver in the electrode layer in comparison with the transparent electrode of sample 1-2 shown in FIG. 8.

Figure 8:
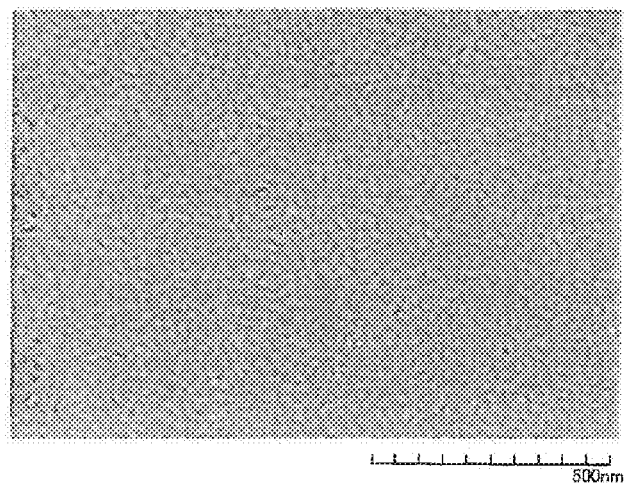
FIG. 8 is a SEM image of the transparent electrode of the sample 1-2 from Example 1.
Figure 9:
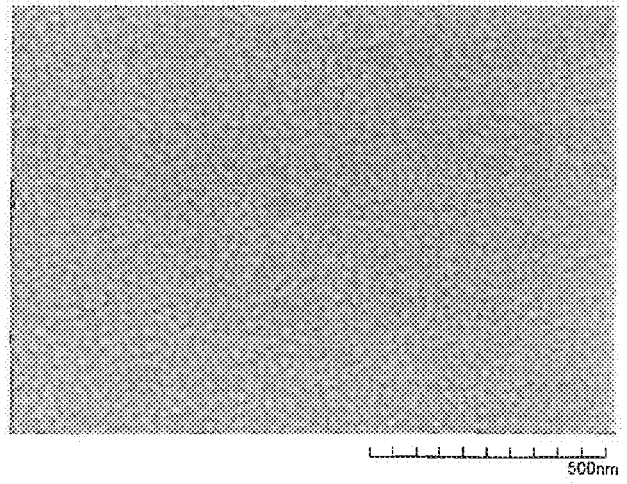
FIG. 9 is a SEM image of the transparent electrode of the sample 1-3 from Example 1.
Figure 10:
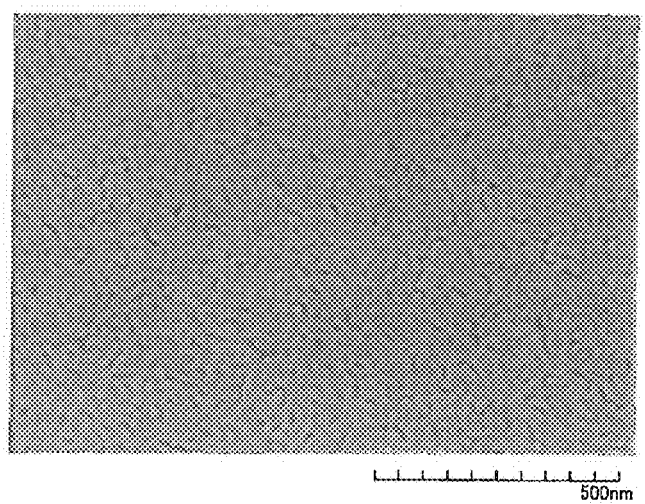
FIG. 10 is a SEM image of the transparent electrode of the sample 1-4 from Example 1.
Figure 11:
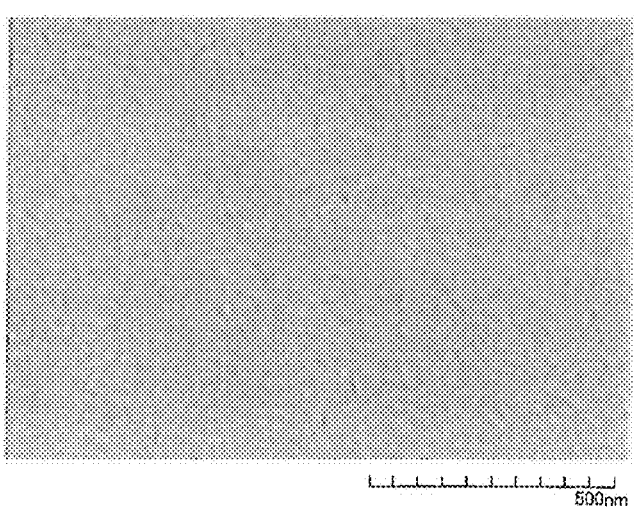
FIG. 11 is a SEM image of the transparent electrode of the sample 1-5 from Example 1.
Figure 12:
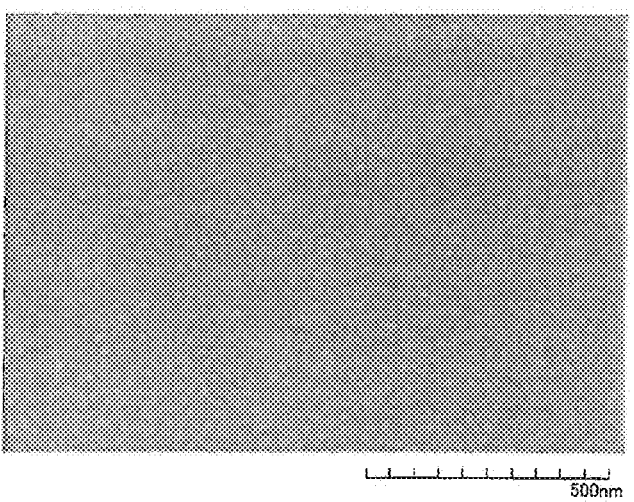
FIG. 12 is a SEM image of the transparent electrode of the sample 1-6 from Example 1.
Figure 13:
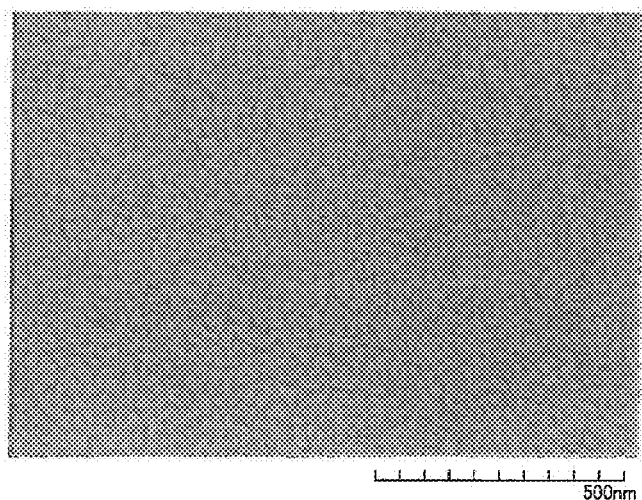
FIG. 13 is a SEM image of the transparent electrode of the sample 1-7 from Example 1.
Figure 14:
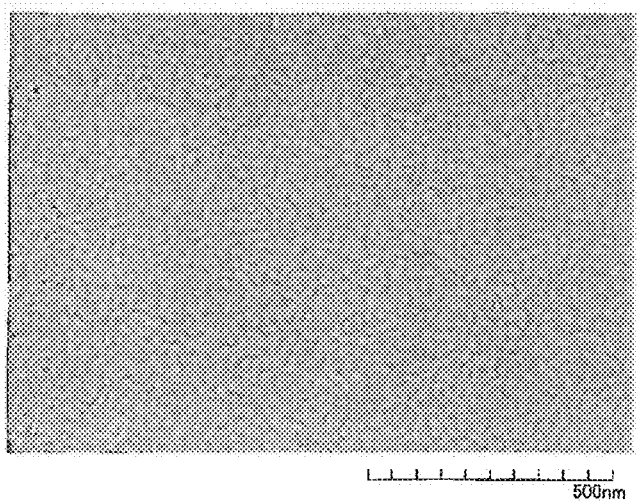
FIG. 14 is a SEM image of the transparent electrode of the sample 1-8 from Example 1.
Figure 15:
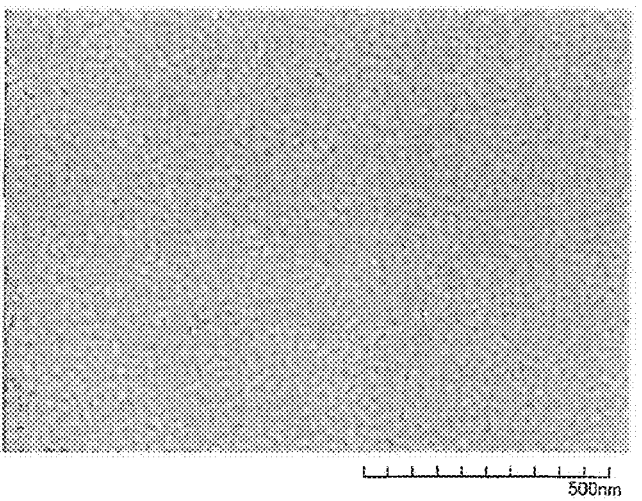
FIG. 15 is a SEM image of the transparent electrode of the sample 1-9 from Example 1.

Furthermore, by making a comparison among FIGS. 10 to 12 showing the SEM images of the transparent electrodes of samples 1-4 to 1-6 (magnifications; x hundred thousand), it was found that the deposition state of the silver membrane constituting the electrode layer was varied depending on a deposition speed of the nitrogen-containing layer, as is the case with the aforementioned FIGS. 7 to 9. In the same way, by making a comparison among FIGS. 13 to 15 showing the SEM images of the transparent electrodes of samples 1-7 to 1-9 (magnifications; x hundred thousand), it was found that the deposition state of the silver membrane constituting the electrode layer was varied depending on a deposition speed of the nitrogen-containing layer, as is the case with the aforementioned FIGS. 7 to 9.

Therefore, it was confirmed that, in the transparent electrode in the configuration of the present invention, comprising the nitrogen-containing layer deposited at a deposition speed of 0.3 nm/s or greater, the electrode layer was provided adjacent to the nitrogen-containing layer by membrane growth more close to a layer-by-layer growth (Frank-van der Merwe; FM) type, but not a nuclear growth (Volumer-Weber; VW) type.

Moreover, it was also confirmed that, when the nitrogen-containing layers provided adjacent to the electrode layer constituted by the same material, the faster a deposition speed of the nitrogen-containing layer was, the more the silver atoms connected to each other in the electrode layer were (each of white portions in the images), and then the higher the continuity thereof was.

Meanwhile, in the Example 1, there was explained the example in which the thickness of the nitrogen-containing layer was 25 nm, but the thickness was not limited thereto, and even when the nitrogen-containing layer has a smaller or larger thickness, the similar result was able to be obtained. Namely, without depending on the thickness of the nitrogen-containing layer, the higher deposition speed of the nitrogen-containing layer resulted in enhanced light transmittance and enhanced sheet resistance of the transparent electrode.

Example 2

<<Production of Transparent Electrode-1>>

As described below, each of transparent electrodes of samples 2-1 to 2-9 was produced so as to have an area of a conductivity region of 5 cm×5 cm.

With respect to the samples 2-1 to 2-9, there was produced each of the transparent electrodes having a laminated structure of a nitrogen-containing layer constituted of the respective compound and an electrode layer using silver provided in the upper portion thereof, as shown in Table 2.

In the production of the transparent electrode of samples 2-1 to 2-3, the aforementioned compound 10 containing nitrogen atoms was used as the compound constituting the nitrogen-containing layer. The compound 10 falls within the general formula (3).

In the production of the transparent electrode of samples 2-4 to 2-6, the aforementioned compound 94 containing nitrogen atoms was used as the compound constituting the nitrogen-containing layer. The compound 94 falls within the general formula (3).

In the production of the transparent electrode of samples 2-7 to 2-9, the aforementioned compound 99 containing nitrogen atoms was used as the compound constituting the nitrogen-containing layer. The compound 99 falls within the general formula (1).

<Procedure for Producing Transparent Electrodes of Samples 2-1 to 2-9>

A transparent alkali-free glass substrate was fixed to a substrate holder of the commonly available vacuum deposition apparatus. In addition, in the production of the respective transparent electrodes, each of the aforementioned compounds 10, 94 and 99 was charged into a tantalum resistive heating boat. The substrate holder and the resistive heating boats were attached to a first vacuum tank in the vacuum deposition apparatus. Furthermore, a tungsten resistive heating boat containing silver (Ag) was attached to a second vacuum tank.

In this state, after reducing a pressure of the first vacuum tank to 4×10-4 Pa, the heating boat containing the respective compound was heated by applying an electric current, and there was formed, on the substrate, a nitrogen-containing layer constituted of the respective compounds each having a thickness of 25 nm at a deposition speed of 0.3 mm/s.

Subsequently, the substrate obtained by depositing the layers up to the nitrogen-containing layer was transferred to the second vacuum tank while being kept in a vacuum atmosphere, and then the electrode layer constituted of silver having each thickness shown in the aforementioned Table 2 (8 nm or 12 nm) was deposited adjacent to the nitrogen-containing layer, at a deposition speed of 0.02 nm/s. At this time, the substrate obtained by depositing the layers up to the nitrogen-containing layer was transferred from the first vacuum tank to the second vacuum tank within the time when the interval between the deposition of the nitrogen-containing layer and the subsequent deposition of the electrode layer is each of the deposition intervals (1 min, 2 min, and 10 min) shown in the aforementioned Table 2 and the process was carried out until the electrode layer was deposited. Before charging the substrate therein, the second vacuum tank was prepared in advance by reducing the pressure to 4×10-4 Pa and in a state of having completed heating of the heating boat containing silver. Therefore, there was obtained each of the transparent electrodes of sample 2-1 to 2-9 formed of a laminated structure of the nitrogen-containing layer and the electrode layer in the upper portion thereof.

<Evaluation-1 of Respective Samples in Example 2>

With respect to each of the transparent electrode of samples 2-1 to 2-9 produced above, the light transmittance was measured. Measurement of the light transmittance was performed by using a spectrophotometer system (U-3300 by Hitachi, Ltd.) and by using the same substrate as the samples, as a baseline. The result is shown together in the above Table 2.

TABLE 2

Figure 22:
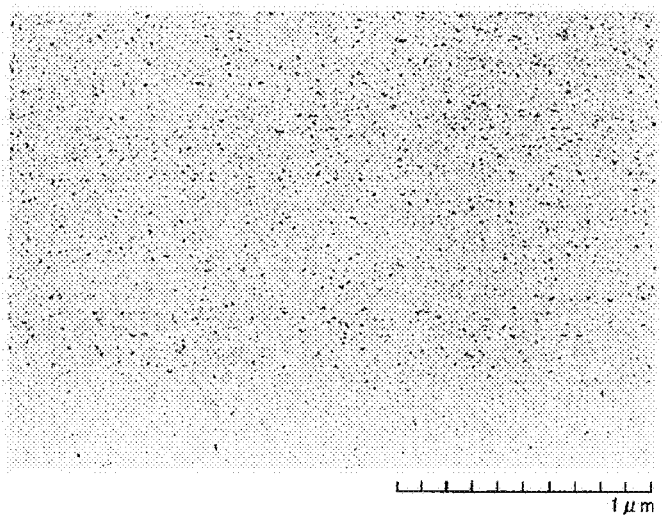
FIG. 22 is a SEM image of the transparent electrode of the sample 2-7 from Example 2.
Figure 23:
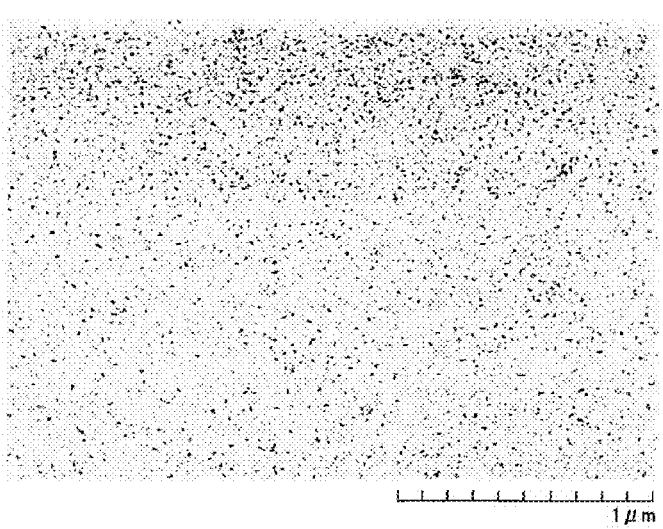
FIG. 23 is a SEM image of the transparent electrode of the sample 2-8 from Example 2.
Figure 24:
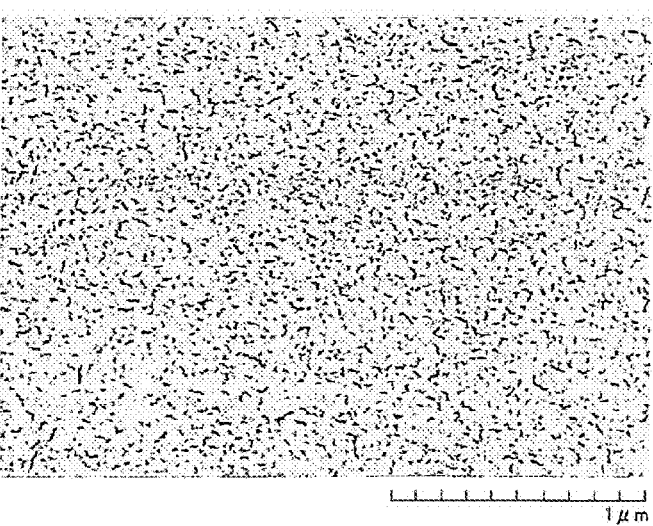
FIG. 24 is a SEM image of the transparent electrode of the sample 2-9 from Example 2.

| | Configuration Example | | | Evaluation result | | |
|---|---|---|---|---|---|---|
| Sample | Nitrogen-containing layer (film thickness 25 nm) Material | Electrode layer (Ag) Film thickness (nm) | Time interval of film-forming (minute) | Light transmittance (at 550 nm) | Sheet resistance (Ω/sq.) | Remarks |
| 2-1 | Compound 10 | 8 | 1 | 73% | 7.8 | Present invention (FIG. 16) |
| 2-2 | | | 2 | 72% | 8.1 | Present invention (FIG. 17) |
| 2-3 | | | 10 | 60% | 14.0 | Comparative (FIG. 18) |
| 2-4 | Compound 94 | 12 | 1 | 68% | 7.0 | Present invention (FIG. 19) |
| 2-5 | | | 2 | 66% | 7.6 | Present invention (FIG. 20) |
| 2-6 | | | 10 | 51% | 13.0 | Comparative (FIG. 21) |
| 2-7 | Compound 99 | 12 | 1 | 63% | 8.4 | Present invention (FIG. 22) |
| 2-8 | | | 2 | 60% | 8.8 | Present invention (FIG. 23) |
| 2-9 | | | 10 | 49% | 13.0 | Comparative (FIG. 24) |

<Evaluation-2 of Respective Samples in Example 2>

With respect to each of the transparent electrodes of samples 2-1 to 2-9 produced above, the sheet resistance was measured. Measurement of the sheet resistance was performed using an ohmmeter (MCP-T610 by Mitsubishi Chemical Corporation) by four terminal-four probe applied constant-current method. The result is shown together in the above Table 2.

<Evaluation Results of Example 2>

In Table 2, samples 2-1 to 2-3 in which the material constituting the nitrogen-containing layer is the compound 10 and the thickness of the electrode layer is 8 nm were compared with one another. The transparent electrode of samples 2-1 and 2-2 of the present invention, in which the time interval between the end of formation of the nitrogen-containing layer and the beginning of formation of the electrode layer is within 2 minutes, exhibited the high light transmittance of 70% or greater and the lowered sheet resistance of less than 10 ohms/sq. In contrast, the transparent electrode of sample 2-3 outside the scope of the present invention, in which the time interval between the end of formation of the nitrogen-containing layer and the beginning of formation of the electrode layer being 10 minutes, exhibited the light transmittance of 60% and the sheet resistance of over 10 ohms/sq.

In Table 2, samples 2-4 to 2-6 in which the material constituting the nitrogen-containing layer is the compound 94 and the thickness of the electrode layer is 12 nm were also compared with one another. The transparent electrode of each of samples 2-4 and 2-5 of the present invention, in which the time interval between the end of formation of the nitrogen-containing layer and the beginning of formation of the electrode layer is within 2 minutes, exhibited the high light transmittance of 65% or greater and the lowered sheet resistance of less than 10 ohms/sq. In contrast, the transparent electrode of sample 2-6 outside the scope of the present invention, in which the time interval between the end of formation of the nitrogen-containing layer and the beginning of formation of the electrode layer being 10 minutes, exhibited the light transmittance of no more than 50% and the sheet resistance of over 10 ohms/sq.

In Table 2, samples 2-7 to 2-9 in which the material constituting the nitrogen-containing layer is the compound 99 and the thickness of the electrode layer is 12 nm were also compared with one another. The transparent electrode of each of samples 2-7 and 2-8 of the present invention, in which the time interval between the end of formation of the nitrogen-containing layer and the beginning of formation of the electrode layer is within 2 minutes, exhibited the high light transmittance of 60% or greater and the lowered sheet resistance of less than 10 ohms/sq. In contrast, the transparent electrode of sample 2-9 outside the scope of the present invention, in which the time interval between the end of formation of the nitrogen-containing layer and the beginning of formation of the electrode layer being 10 minutes, exhibited the light transmittance of 50% or less and the sheet resistance of over 10 ohms/sq.

As a total result shown in Table 2, when the nitrogen-containing layers are constituted using the same material, the shorter the time interval between the end of formation of the nitrogen-containing layer and the beginning of formation of the electrode layer was, the lower the sheet resistance was, and the higher the light transmittance was. In addition, the samples 2-4 and 2-5 obtained by using the nitrogen-containing layer of the compound 94 corresponding to the general formula (3) exhibited the higher light transmittance and the increased sheet resistance as compared with the samples 2-7 and 2-8 obtained by using the nitrogen-containing layer of the compound 99 corresponding to the general formula (1).

From the above, it was found that the transparent electrode in the configuration of the present invention, in which the time interval between the end of formation of the nitrogen-containing layer and the beginning of formation of the electrode layer is within 2 minutes, exhibited the light transmittance of 50% or greater and the sheet resistance of less than 10 ohms/sq. Accordingly, this confirms that since the electrode layer constituting the transparent electrode of the present invention has a thin film having a thickness of 12 nm or less with superior continuity, the transparent electrode in the configuration of the present invention exhibits both of the high light transmittance and the superior electrical conductivity.

By the comparison of SEM images of the transparent electrodes of the samples 2-1 to 2-3 (magnifications: x fifty thousand) shown in FIGS. 16 to 18 with each other, it was proved that the formation state of the silver film comprised in the electrode layer was varied depending on the time interval between the end of formation of the nitrogen-containing layer and the beginning of formation of the electrode layer, as described below. As to the transparent electrode of the samples 2-1 in the configuration of the present invention shown in FIG. 16, in which the time interval between the end of formation of the nitrogen-containing layer and the beginning of formation of the electrode layer is 1 minute, the silver components were found to be linked with each other within the electrode layer provided adjacent to the nitrogen-containing layer. Furthermore, as to the transparent electrode of the samples 2-2 in the configuration of the present invention shown in FIG. 17, in which the time interval between the end of formation of the nitrogen-containing layer and the beginning of formation of the electrode layer is 2 minute, the silver components were found to be linked with each other within the electrode layer provided adjacent to the nitrogen-containing layer. Furthermore, the transparent electrode of sample 2-1 shown in FIG. 16 also was found to exhibit the reduced uncovered portion with silver (black portion in the images) and the improved continuity of silver in the electrode layer (white portion in the images) as compared with the transparent electrode of sample 2-2 in FIG. 17. In contrast, the transparent electrode outside the scope of the present invention of samples 2-3 shown in FIG. 18, in which the time interval between the end of formation of the nitrogen-containing layer and the beginning of formation n of the electrode layer is 10 minute, showed the lowered continuity of silver in the electrode layer provided adjacent to the nitrogen-containing layer. Moreover, the uncovered portion with silver was remarkably observed.

Figure 16:
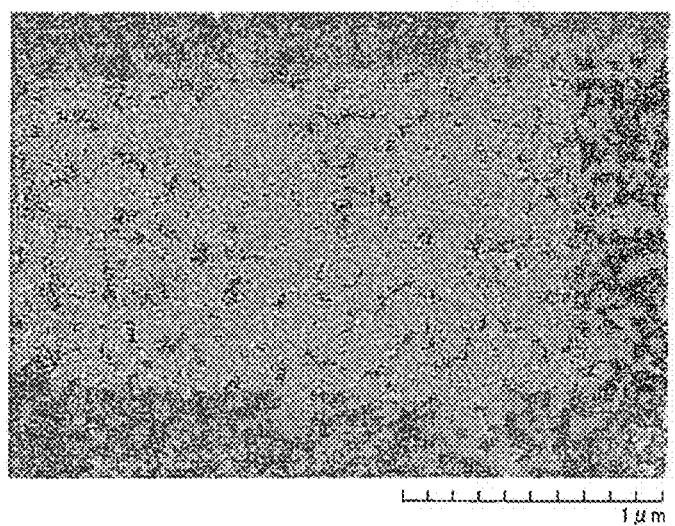
FIG. 16 is a SEM image of the transparent electrode of the sample 2-1 from Example 2.
Figure 17:
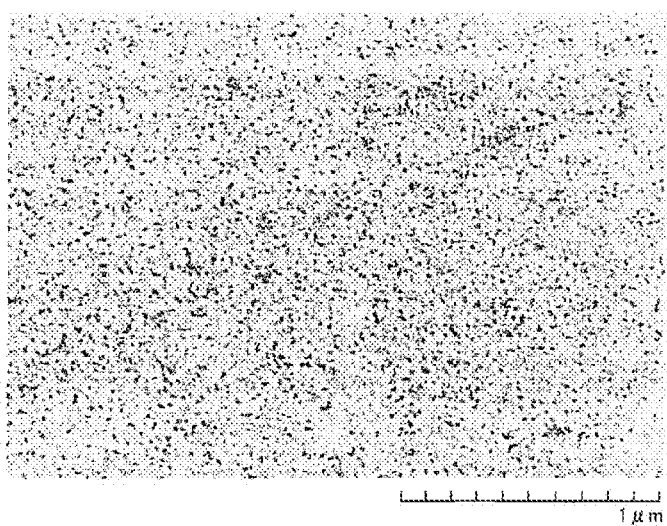
FIG. 17 is a SEM image of the transparent electrode of the sample 2-2 from Example 2.
Figure 18:
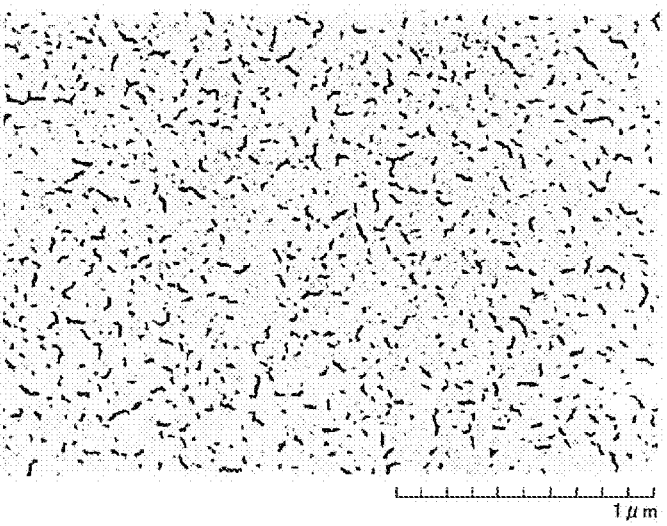
FIG. 18 is a SEM image of the transparent electrode of the sample 2-3 from Example 2.
Figure 19:
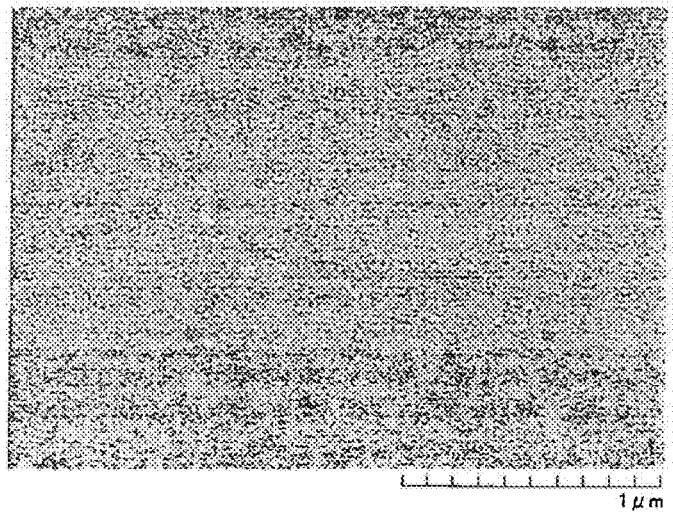
FIG. 19 is a SEM image of the transparent electrode of the sample 2-4 from Example 2.
Figure 20:
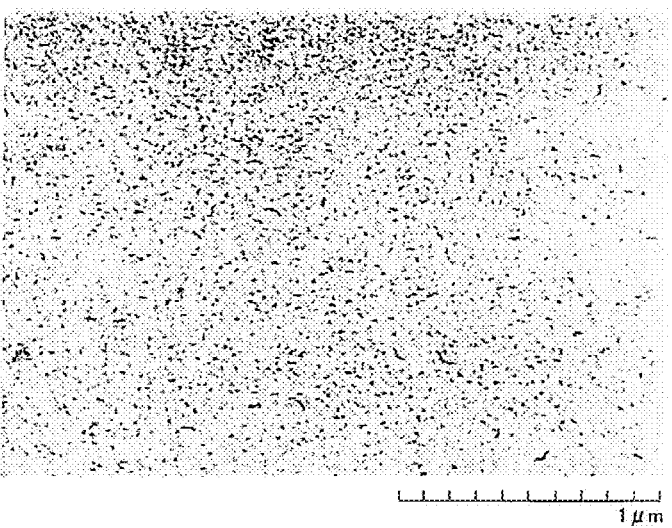
FIG. 20 is a SEM image of the transparent electrode of the sample 2-5 from Example 2.
Figure 21:
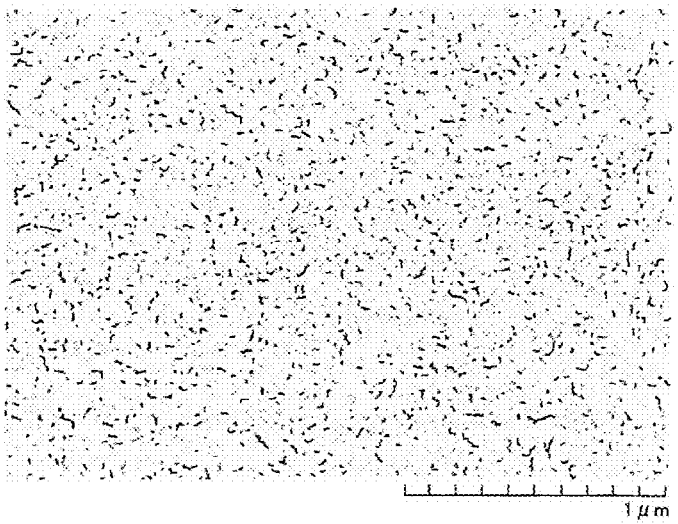
FIG. 21 is a SEM image of the transparent electrode of the sample 2-6 from Example 2.

Furthermore, by the comparison of SEM images of the transparent electrodes of the samples 2-4 to 2-6 (magnifications: x fifty thousands) shown in FIGS. 19 to 21 with each other, it was proved that the deposition state of the silver membrane contained in the electrode layer was varied depending on the time interval between the end of formation of the nitrogen-containing layer and the beginning of formation of the electrode layer, in the same way as the aforementioned FIGS. 16 to 18. Also by the comparison of SEM images of the transparent electrodes of the samples 2-7 to 2-9 (magnifications: x fifty thousands) shown in FIGS. 22 to 24 with each other, it was proved that the formation state of the silver film contained in the electrode layer was varied depending on the time interval between the end of formation of the nitrogen-containing layer and the beginning of formation of the electrode layer, in the same way as the aforementioned FIGS. 16 to 18.

Therefore, it was confirmed that in the transparent electrode of the present invention, in which the time interval between the end of formation of the nitrogen-containing layer and the beginning of formation of the electrode layer is within 2 minute, the electrode layer was provided adjacent to the nitrogen-containing layer by substantially a layer-by-layer growth (Frank-van der Merwe; FM) type, but not a nuclear growth (Volumer-Weber; VW) type.

It was also confirmed that when the nitrogen-containing layers were individually provided adjacent to the electrode layer by using the same material, the shorter the time interval between the end of formation of the nitrogen-containing layer and the beginning of formation of the electrode layer was, the more the silver atoms linked with each other in the electrode layer were (white portion in the images), and then the higher the continuity thereof was obtained.

REFERENCE SIGNS LIST

1 . . . transparent electrode; 1*b* . . . electrode layer; El, EL-1, EL-2, EL-3 . . . organic electroluminescent element (electronic device)

The invention claimed is:
1. A method for manufacturing a transparent electrode, comprising steps of:
   forming a nitrogen-containing layer using a compound containing nitrogen atoms at a deposition speed of 0.3 nm/s or greater; and
   forming an electrode layer, on the formed nitrogen-containing layer, that has a film thickness of 12 nm or lower and has a measurable sheet resistance, using silver or an alloy having silver as the main component,
   wherein the compound containing nitrogen atoms is a compound that has a hetero ring containing a nitrogen atom as a hetero atom.
2. A method for manufacturing a transparent electrode, comprising steps of:
   forming a nitrogen-containing layer using a compound containing nitrogen atoms; and
   forming an electrode layer that has a film thickness of 12 nm or lower and has a measurable sheet resistance, using silver or an alloy having silver as the main component, the electrode layer being adjacent to the formed nitrogen-containing layer, the electrode layer being formed on the formed nitrogen-containing layer within two minutes after forming the nitrogen-containing layer,
   wherein the compound containing nitrogen atoms is a compound that has a hetero ring containing a nitrogen atom as a hetero atom.

* * * * *